(12) United States Patent
Yeh et al.

(10) Patent No.: US 10,566,348 B1
(45) Date of Patent: Feb. 18, 2020

(54) TILTED HEMI-CYLINDRICAL 3D NAND ARRAY HAVING BOTTOM REFERENCE CONDUCTOR

(71) Applicant: MACRONIX INTERNATIONAL CO., LTD., Hsinchu (TW)

(72) Inventors: Teng-Hao Yeh, Zhubei (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/180,970

(22) Filed: Nov. 5, 2018

(51) Int. Cl.
| | |
|---|---|
| *H01L 29/792* | (2006.01) |
| *H01L 27/11582* | (2017.01) |
| *H01L 29/10* | (2006.01) |
| *H01L 23/528* | (2006.01) |
| *H01L 21/8234* | (2006.01) |

(52) U.S. Cl.
CPC ......... *H01L 27/11582* (2013.01); *H01L 21/823412* (2013.01); *H01L 21/823475* (2013.01); *H01L 21/823481* (2013.01); *H01L 21/823487* (2013.01); *H01L 23/528* (2013.01); *H01L 29/1037* (2013.01)

(58) Field of Classification Search
USPC ..... 257/324, 314, E21.423, E21.422, E29.3, 257/315, E21.679, E29.262, E21.21, 257/E21.614, E21.645, E27.102, E27.111, 257/E29.129, E29.331, E21.312, E21.41, 257/E21.663, E27.07; 438/268; 365/185.18, 185.17, 185.03, 17, 184, 365/185.22, 185.23, 185.29, 185.14, 51, 365/63
See application file for complete search history.

(56) References Cited

U.S. PATENT DOCUMENTS

| | | | |
|---|---|---|---|
| 9,397,110 B2 | 7/2016 | Lue | |
| 2012/0156848 A1* | 6/2012 | Yang | H01L 27/11529 438/287 |
| 2014/0070302 A1 | 3/2014 | Yoo et al. | |
| 2016/0099254 A1 | 4/2016 | Park et al. | |
| 2016/0181259 A1* | 6/2016 | Van Houdt | H01L 27/1159 365/145 |
| 2016/0204117 A1* | 7/2016 | Liu | H01L 29/66825 257/324 |
| 2017/0062456 A1* | 3/2017 | Sugino | H01L 27/11582 |
| 2017/0084623 A1* | 3/2017 | Sharangpani | H01L 27/11556 |
| 2017/0110468 A1* | 4/2017 | Shim | H01L 27/11568 |

* cited by examiner

*Primary Examiner* — Niki H Nguyen
(74) *Attorney, Agent, or Firm* — Haynes Beffel & Wolfeld LLP

(57) ABSTRACT

A memory device comprises a reference conductor, and a stack of conductive strips separated by insulating strips, where the conductive strips in the stack extend in a first direction, and the stack is disposed on the reference conductor. The memory device comprises a plurality of hemi-cylindrical vertical channel structures extending through respective vias in the conductive strips in the stack, and comprising semiconductor films in electrical contact with the reference conductor having outside surfaces. Each of the hemi-cylindrical vertical channel structures has a divided elliptical cross section with a major axis tilted relative to the first direction. The memory device comprises data storage structures between the outside surfaces of the semiconductor films and sidewalls of the vias in the conductive strips.

35 Claims, 45 Drawing Sheets

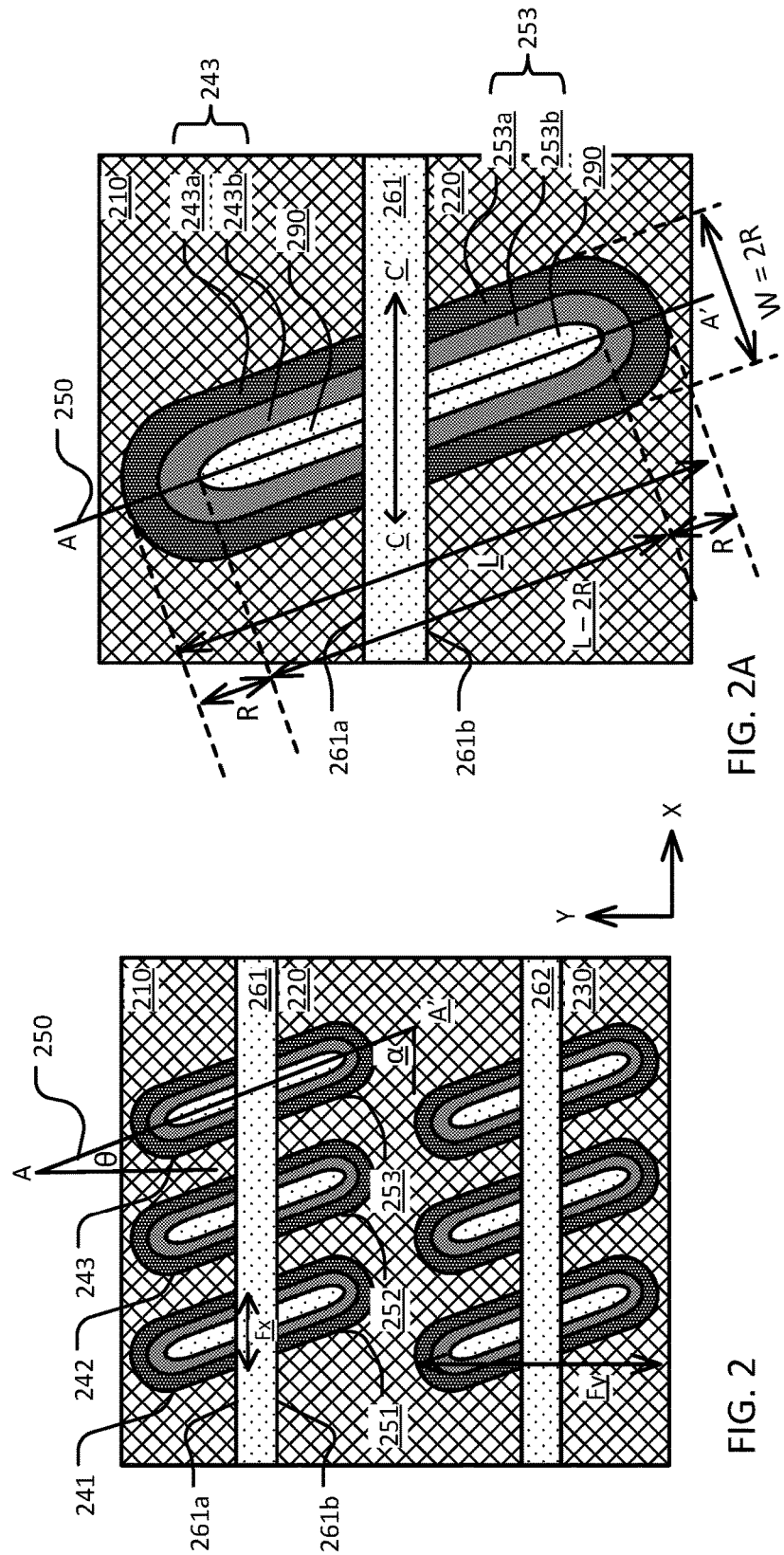
FIG. 2
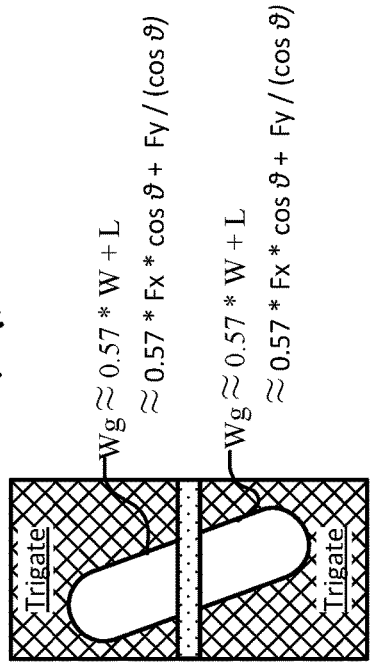
FIG. 2A
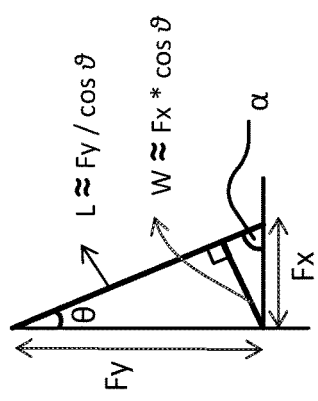
FIG. 2B
FIG. 2C

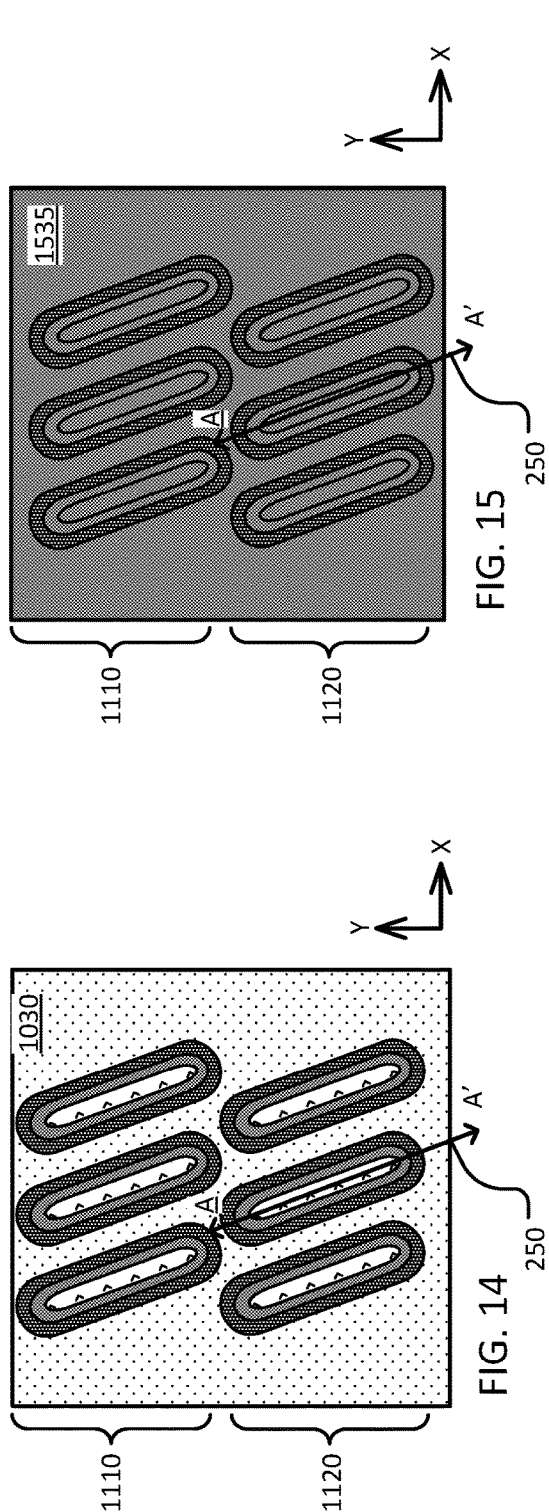
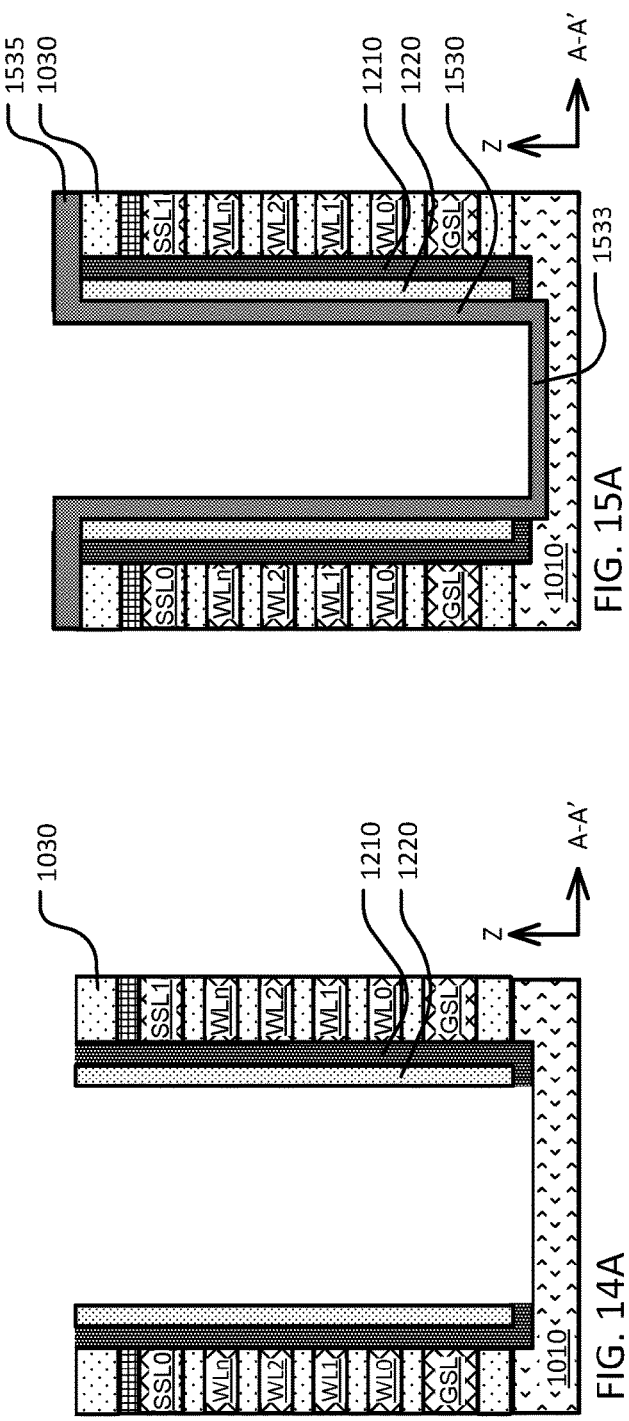
FIG. 14
FIG. 14A
FIG. 15
FIG. 15A

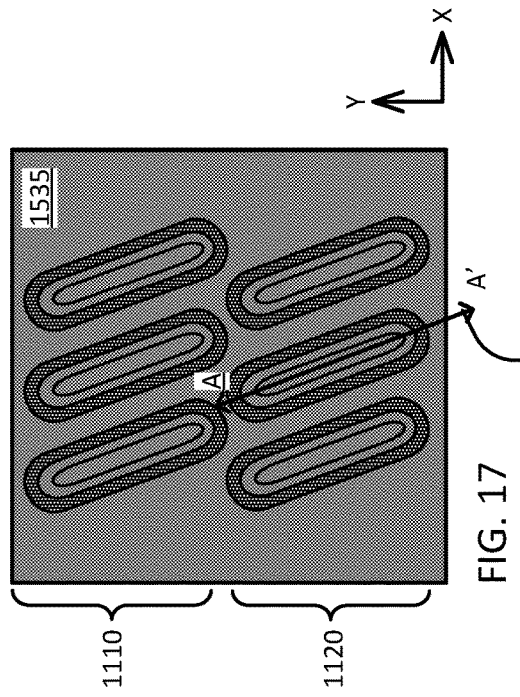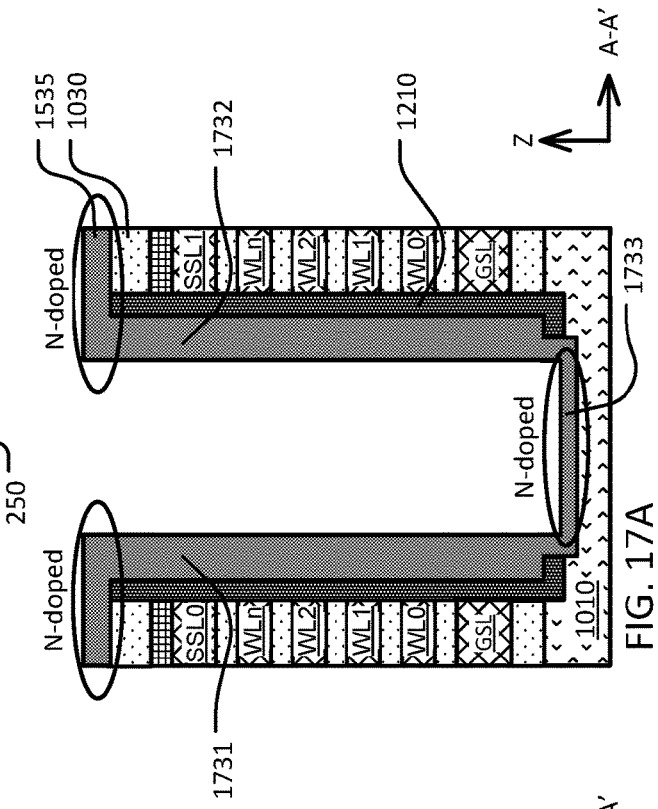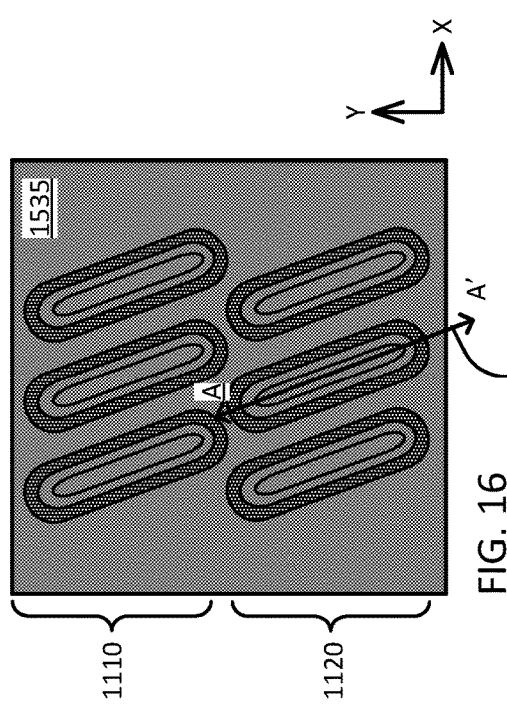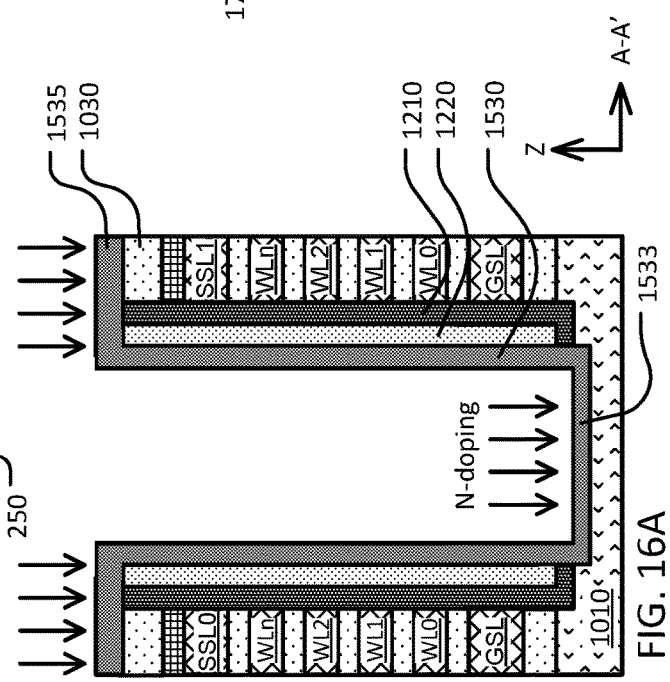

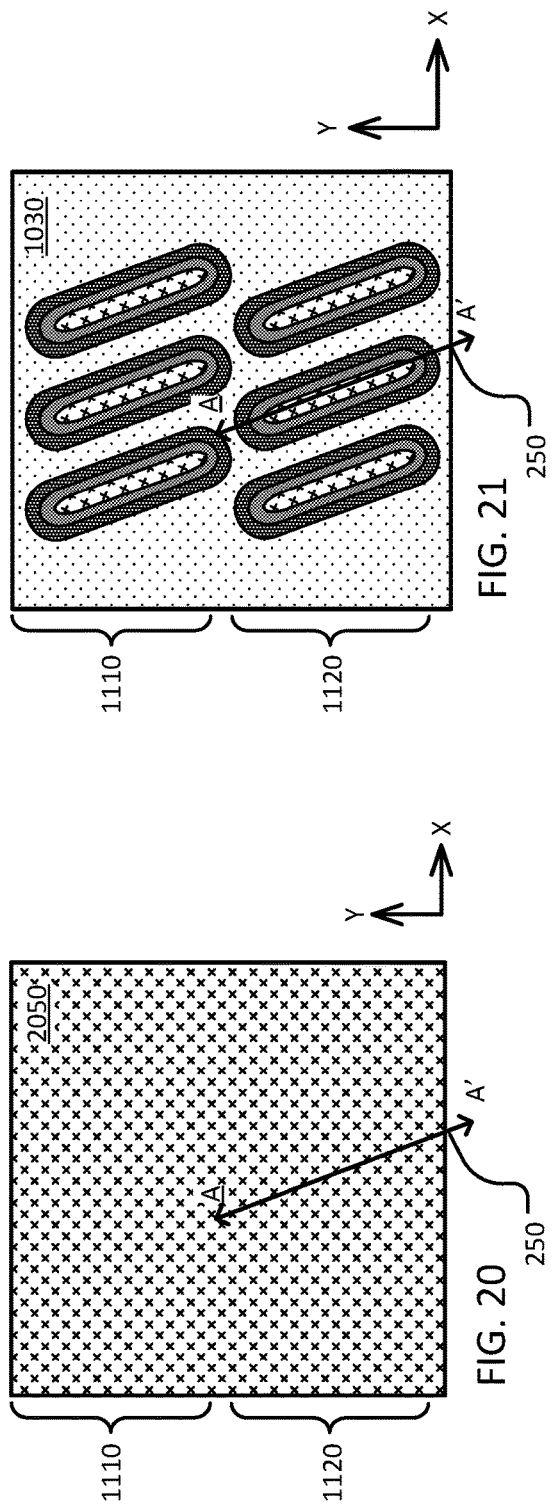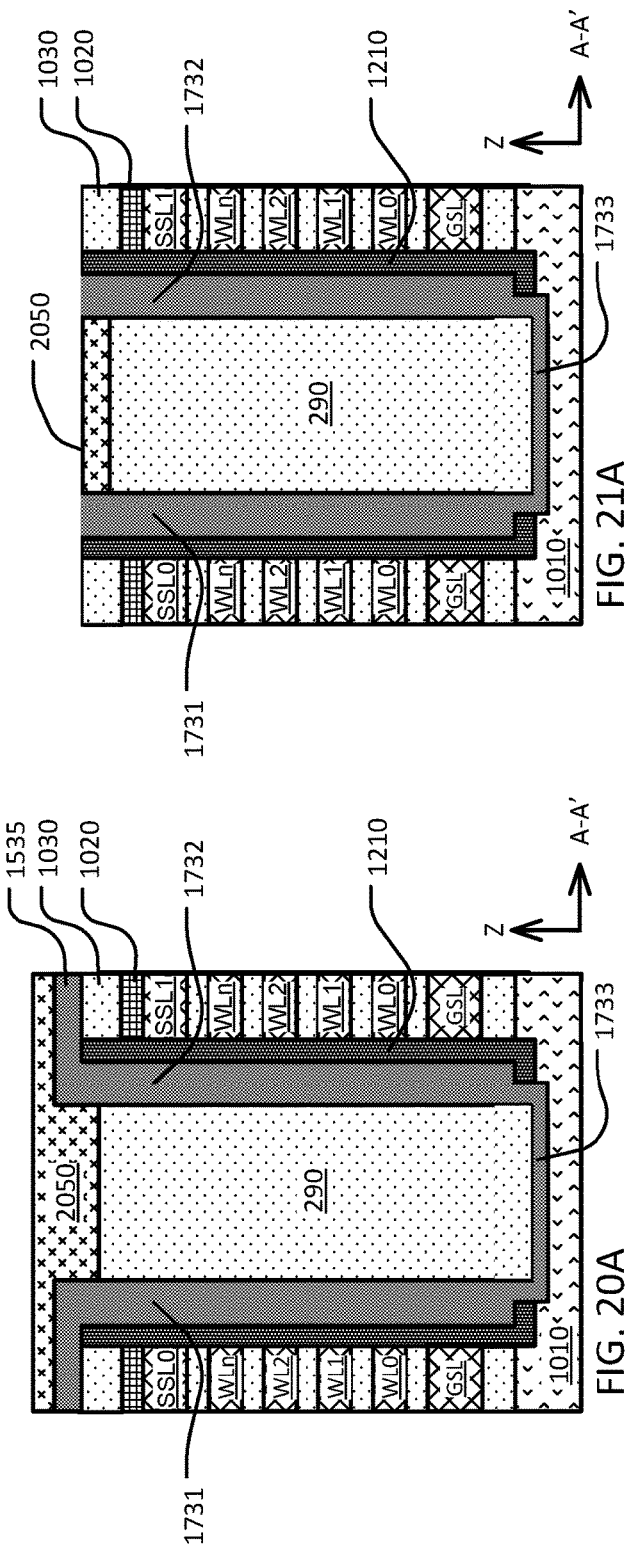

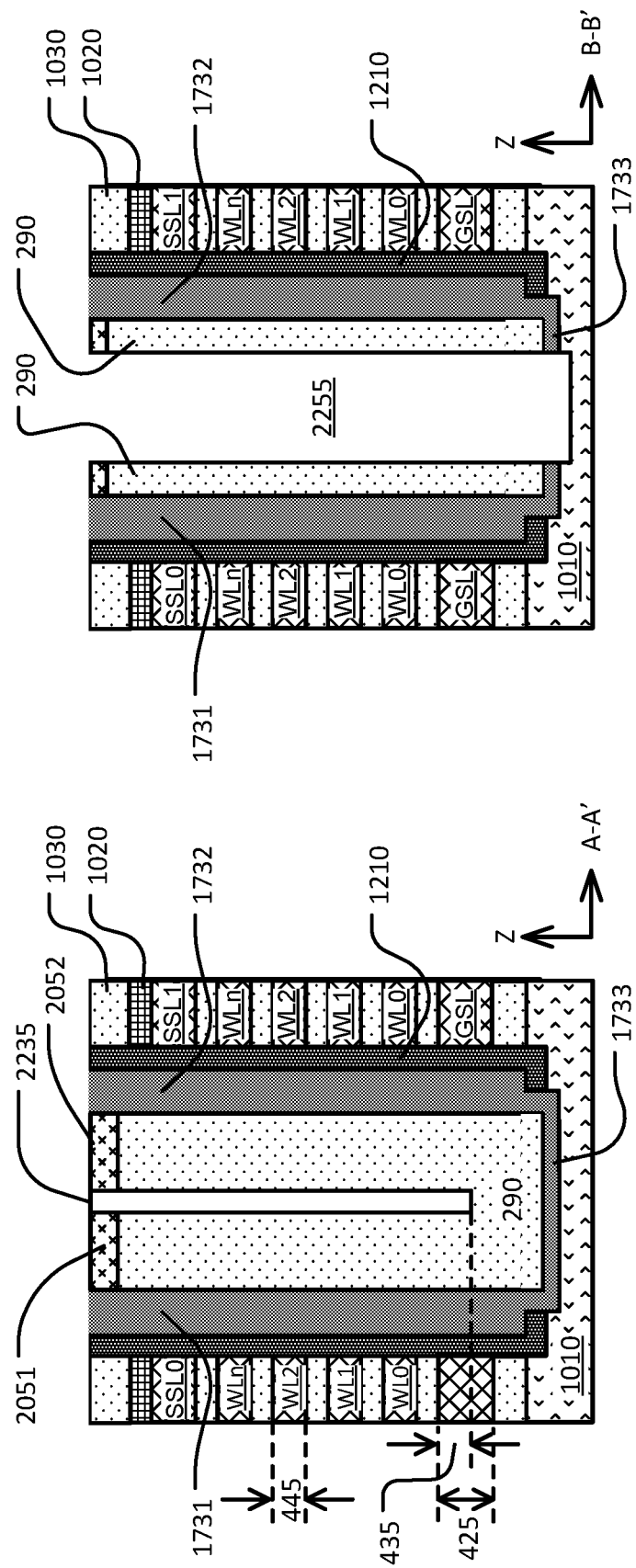

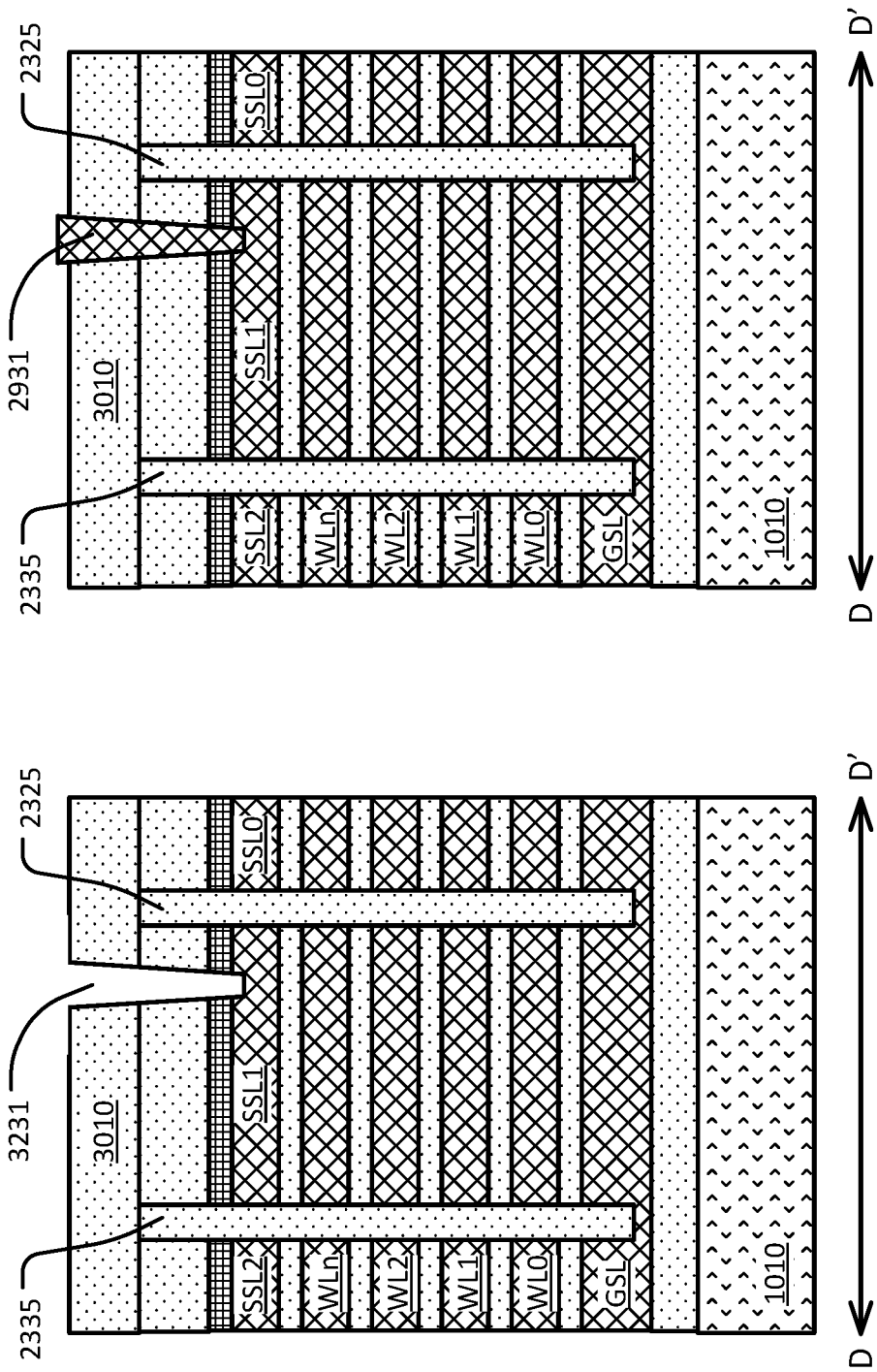

TILTED HEMI-CYLINDRICAL 3D NAND ARRAY HAVING BOTTOM REFERENCE CONDUCTOR

BACKGROUND

Field

The present invention relates to high density memory devices, and particularly to memory devices in which multiple planes of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit.

In a single gate and flat channel structure, the gate controllability is limited by the gate width, the turn-on current is limited by the channel width, and there is Y-interference between opposite cells on sidewalls of the structure.

It is desirable to provide a structure for three-dimensional integrated circuit memory with an enlarged channel width, better gate controllability, and reduced Y-interference.

SUMMARY

A memory device comprises a reference conductor, and a common source reference driver operatively connected to the reference conductor. The memory device comprises a stack of conductive strips separated by insulating strips, where the conductive strips in the stack extend in a first direction, and the stack is disposed on the reference conductor.

As used herein, a hemi-cylindrical vertical channel structure has a channel material extending partially around an outside surface of a cylindrical structure that has a horizontal cross-section in a divided elliptical shape, where an elliptical shape can include an ellipse, and ellipse-like shapes such as oblong, oval, polygonal, racetrack, and other shapes that are ellipse-like in the sense they can be characterized as having a major axis greater than a minor axis orthogonal to the major axis. An elliptical shape can be divided into two divided elliptical shapes referred to herein as "hemi-elliptical," in which the division may not be parallel to the minor axis, but lies along a line that is tilted at an angle to the major axis and at a complementary angle to the minor axis. A pair of hemi-cylindrical vertical channel structures has channel material on the outside surfaces of the hemi-elliptical cross sections opposite each other across an isolation block along a major axis, and has a horizontal cross-section that includes two divided hemi-elliptical shapes. The channel material does not cover the outside surface of the cylindrical structure along the dividing line at the isolation block, and is therefore termed "hemi-cylindrical."

The major axis is tilted at an angle relative to the first direction, where the angle can have a range between 30 degrees and 80 degrees. The conductive strips in the stack of conductive strips can act as tri-gates or finFET-like double-gates in contact with the hemi-cylindrical vertical channel structures.

In comparison to a single gate and flat channel structure, the present technology provides tilted hemi-cylindrical memory cells including hemi-cylindrical vertical channel structures, by extending a dimension of the hemi-cylindrical vertical channel structures in a second direction (Y-direction) orthogonal to the first direction, and by tilting a major axis of the hemi-cylindrical vertical channel structures relative to the first direction (X-direction).

Hemi-cylindrical vertical channel structures in the tilted hemi-cylindrical memory cells are arranged in a nearly wrap-around structure, to enlarge the channel width for higher turn-on current, which can make the sensing circuit more stable, and to enlarge the data storage structures. Tri-gates or finFET-like double-gates in contact with the hemi-cylindrical vertical channel structures provide a wider gate width Wg than that of a single gate, to provide better gate controllability. Furthermore, interference in the Y direction between opposite cells having tilted hemi-cylindrical vertical channel structures in stacks of conductive strips across an isolation block can be reduced, because the distance between the opposite cells in a tilted layout design is longer than that in an orthogonal layout design.

The memory device comprises a plurality of hemi-cylindrical vertical channel structures extending through respective vias in the conductive strips in the stack, and comprising semiconductor films in electrical contact with the reference conductor having outside surfaces. Each of the hemi-cylindrical vertical channel structures has a divided elliptical cross section with a major axis tilted relative to the first direction. The major axis is tilted at an angle relative to the first direction, the angle having a range between 30 degrees and 80 degrees.

The memory device comprises data storage structures between the outside surfaces of the semiconductor films and sidewalls of the vias in the conductive strips. The conductive strips in the stack of conductive strips act as tri-gates in contact with the hemi-cylindrical vertical channel structures.

The memory device comprises a plurality of stacks of conductive strips including the first-mentioned stack of conductive strips, including an upper level of conductive strips, a lower level of conductive strips, and a plurality of intermediate levels of conductive strips between the upper level of conductive strips and the lower level of conductive strips. The conductive strips in the stacks extend in the first direction. The stacks of conductive strips are disposed on the reference conductor.

The memory device comprises a first vertical source contact plate and a second vertical source contact plate disposed on and connected to the reference conductor and extending vertically through or adjacent to the stacks. The first and second vertical source contact plates extend in the first direction, and are disposed opposite each other across the plurality of stacks of conductive strips in a second direction orthogonal to the first direction. First vias are disposed on a top surface of the first vertical source contact plate, connecting the first vertical source contact plate to a patterned conductor layer overlying the plurality of stacks of conductive strips. Second vias are disposed on a top surface of the second vertical source contact plate, connecting the second vertical source contact plate to the patterned conductor layer overlying the plurality of stacks of conductive strips.

The stacks of conductive strips include an upper level of conductive strips, a lower level conductive strip, and a plurality of intermediate levels of conductive strips between the upper level of conductive strips and the lower level conductive strip. The intermediate levels of conductive strips have a first thickness, and the lower level conductive strip has a second thickness greater than the first thickness.

The plurality of stacks of conductive strips includes a first odd stack being disposed on a first side of an even stack in the plurality of stacks, and a second odd stack being disposed on a second side of the even stack opposite the first side. A first set of bit lines is connected to the hemi-cylindrical vertical channel structures on a second side of the first odd stack adjacent the first side of the even stack and connected to the hemi-cylindrical vertical channel structures on the second side of the even stack. A second set of bit lines is connected to the hemi-cylindrical vertical channel structures on a first side of the second odd stack adjacent the second side of the even stack and connected to the hemi-cylindrical vertical channel structures on the first side of the even stack. Bit lines in the first set of bit lines alternate with bit lines in the second set of bit lines in the first direction.

An isolation block separates a first stack of conductive strips and a second stack of conductive strips in the plurality of stacks of conductive strips. First hemi-cylindrical vertical channel structures in the first stack of conductive strips are in contact with a first side of the isolation block, second hemi-cylindrical vertical channel structures in the second stack of conductive strips are in contact with a second side of the isolation block opposite the first side of the isolation block. The first hemi-cylindrical vertical channel structures are disposed opposite the second hemi-cylindrical vertical channel structures across the isolation block along the major axis.

The first and second hemi-cylindrical vertical channel structures disposed along the major axis have a length along the major axis and a width orthogonal to the length, and a ratio of the length to the width has a range from 3 to 5.

First plugs are connected to first vertical semiconductor films in the first hemi-cylindrical vertical channel structures on the first side of the isolation block. Second plugs are connected to second vertical semiconductor films in the second hemi-cylindrical vertical channel structures on the second side of the isolation block opposite the first side of the isolation block. First and second contacts are connected to the first and second plugs, respectively. First and second vias are connected to the first and second contacts, respectively. First and second bit lines are connected to the first and second vias, respectively.

A horizontal semiconductor film is disposed on the reference conductor and connected to the semiconductor films in the first and second hemi-cylindrical vertical channel structures. The semiconductor films in the first and second hemi-cylindrical vertical channel structures have an elliptical bottom surface having a first length along the major axis. The horizontal semiconductor film has an elliptical cross section having a second length along the major axis, the first length being greater than the second length.

The memory device comprises a plurality of isolation blocks extending in the first direction separating adjacent stacks in the plurality of stacks of conductive strips, including a first isolation block, a last isolation block, and intermediate isolation blocks between the first and last isolation blocks in the second direction. The memory device comprises a stack of conductive layers separated by insulating layers, including an upper conductive layer, a lower conductive layer, and intermediate conductive layers between the upper conductive layer and the lower conductive layer, wherein conductive layers in the stack of conductive layers include conductive strips on respective upper, lower and intermediate levels in the plurality of stacks of conductive strips.

The first and last isolation blocks have a first width, and the intermediate isolation blocks have a second width, the first width being greater than the second width. The first isolation block and the last isolation block extend through a horizontal semiconductor film disposed on the reference conductor and stop on the reference conductor. The intermediate isolation blocks extend into the lower conductive layer by a depth less than a thickness of the lower conductive layer.

The plurality of stacks of conductive strips includes even stacks of conductive strips alternating with odd stacks of conductive strips in the second direction. In one embodiment, the memory device can comprise a second plurality of isolation blocks extending in the second direction, isolation blocks in the second plurality of isolation blocks extending through the intermediate conductive layers in the stack of conductive layers, including left isolation blocks on left sides of the even stacks of conductive strips and right isolation blocks on right sides of the odd stacks of conductive strips.

The memory device can comprise even word lines in the intermediate conductive layers separated from the odd stacks of conductive strips by the right isolation blocks, and odd word lines in the intermediate conductive layers separated from the even stacks of conductive strips by the left isolation blocks. The intermediate isolation blocks in the first-mentioned plurality of isolation blocks are connected in series, via the left and right isolation blocks in the second plurality of isolation blocks, from the first isolation block to the last isolation block in the first-mentioned plurality of isolation blocks.

Landing areas are disposed on respective intermediate conductive layers and the lower conductive layer in the stack of conductive layers in first and second openings. The first and second openings are disposed opposite each other across the plurality of hemi-cylindrical vertical channel structures in the first direction and between the first and last isolation blocks in the second direction. The first opening is adjacent right sides of conductive strips at the upper level of conductive strips in the stacks of conductive strips, and the second opening is adjacent left sides of conductive strips at the upper level of conductive strips in the stacks of conductive strips. Interlayer connectors are disposed on the landing areas, the interlayer connectors extending from a connector surface above the stack of conductive layers to the landing areas.

Each of the intermediate conductive layers in the stack of conductive layers includes conductive strips at the intermediate levels of conductive strips in the stacks of conductive strips underlying respective conductive strips at the upper level of conductive strips in the stacks of conductive strips.

The conductive strips at the upper level of conductive strips in the stacks of conductive strips are separated from each other by the isolation blocks and insulating material in the first and second openings, the insulating material extending through the upper level of conductive strips to an insulating layer above a top conductive layer in the intermediate conductive layers.

The conductive strips at the upper level of conductive strips in the stacks of conductive strips have an array region through which the hemi-cylindrical vertical channel structures extend, and first and second string select line connector regions opposite each other across the array region in the first direction. String select line connectors are connected to respective string select lines in the first and second string select line connector regions.

Each of the intermediate conductive layers in the stack of conductive layers includes conductive strips acting as word lines underlying respective string select lines.

A method is also provided for manufacturing a memory device as described herein.

Other aspects and advantages of the present invention can be seen on review of the drawings, the detailed description and the claims, which follow.

BRIEF DESCRIPTION OF THE DRAWINGS

FIG. 2 illustrates a horizontal cross-section of an example 3D memory device taken at a conductive strip level.

FIG. 2A illustrates a first hemi-cylindrical vertical channel structure, and a second hemi-cylindrical vertical channel structure disposed opposite the first hemi-cylindrical vertical channel structure across an isolation block along a major axis tilted relative to a first direction.

FIGS. 2B and 2C illustrate a gate width for a tilted hemi-cylindrical vertical channel structure.

FIGS. 14 and 14A illustrate a stage of the process flow after etching through the data storage structures on the bottom surfaces of the elliptical vias.

FIGS. 15 and 15A illustrate a stage of the process flow after depositing second semiconductor films on the sidewalls and bottom surfaces of the elliptical vias.

FIGS. 16 and 16A illustrate a stage of the process flow after implanting the second semiconductor films on the reference conductor in the elliptical vias.

FIGS. 17 and 17A illustrate a stage of the process flow after annealing the first semiconductor films and the second semiconductor films into vertical semiconductor films on the sidewalls of the elliptical vias.

FIGS. 20, 20A, 21 and 21A illustrate a stage of the process flow after depositing a conductive material in the recess.

FIG. 22A illustrates a vertical cross-section of FIG. 22 taken along the line A-A' across an intermediate isolation slit.

FIG. 22B illustrates a vertical cross-section of FIG. 22 taken along the line B-B' across the last slit.

FIGS. 32A and 32B further illustrate forming string select line connectors connected to respective string select lines.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
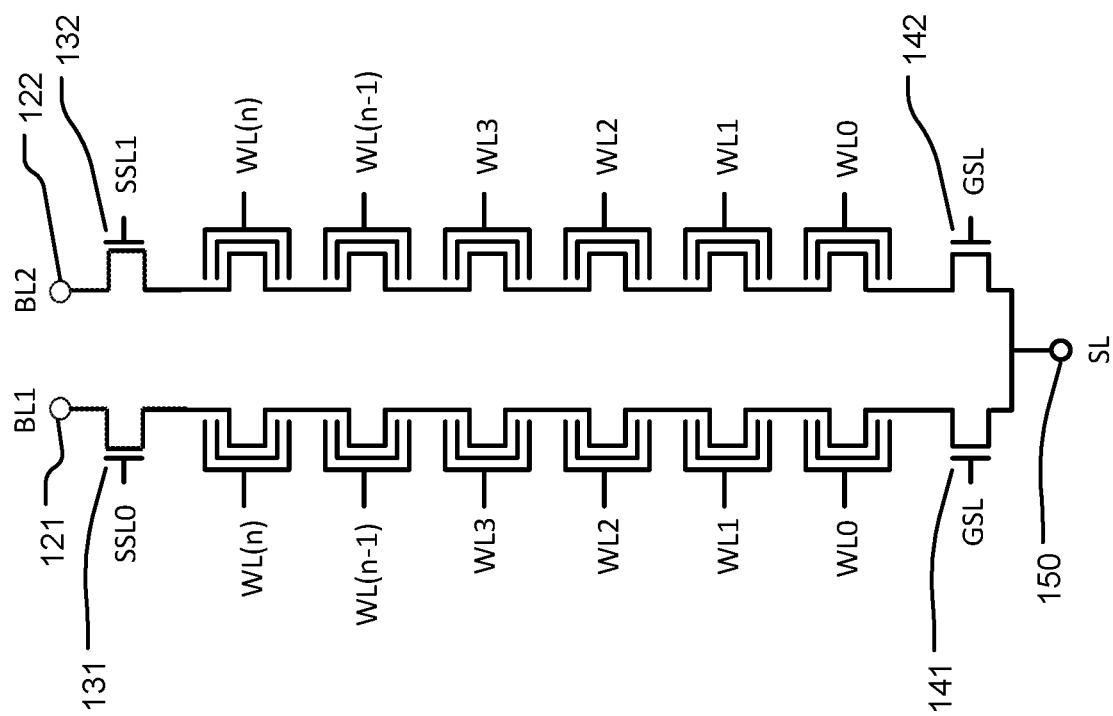
FIG. 1 illustrates a circuit schematic for a 3D NAND array having a first NAND string and a second NAND string on a common bottom reference conductor.

FIG. 1 illustrates a circuit schematic for a 3D NAND array having a first NAND string and a second NAND string on a common bottom reference conductor. The first NAND string is a series of flash memory cells connected between a first string select switch 131 (sometimes called a drain side switch) connected to a bit line contact 121 for connection to a bit line BL1, and a ground select switch 141 (sometimes called a source side switch) connected to a reference conductor contact 150 for connection to a reference conductor (1010, FIG. 4). The second NAND string is a series of flash memory cells connected between a second string select switch 132 connected to a bit line contact 122 for connection to a bit line BL2 and a ground select switch 142 connected to the reference conductor contact 150. The two NAND strings are disposed vertically in 3D structures, and have two stacks of cells on the channel lines on the two sides, designated first and second stacks in this description.

An upper level in the first stack includes a string select line SSL1 which acts as a gate for the first string select switch 131 in the first NAND string. An upper level in the second stack includes a string select line SSL2 which acts as a gate for the second string select switch 132 in the second NAND string. A lower level in the first and second stacks in this example includes a ground select line GSL which acts as a gate for first and second ground select switches 141 and 142 in the first and second NAND strings, respectively. Intermediate levels in the stacks include word lines, where the word lines in the first and second stacks include word lines WL0, WL1, to WL(n−1) and WL(n), where the index 0 to n represents the relative physical level in the stack of the word lines. The word lines in first and second NAND strings act as tri-gates or finFET-like double-gates for the memory cells in the string.

FIG. 2 illustrates a horizontal cross section of an example 3D memory device taken at a conductive strip level. The 3D memory device comprises stacks of conductive strips separated by insulating strips, the conductive strips in the stacks extending in a first direction (X-direction). As illustrated, a plurality of hemi-cylindrical vertical channel structures (241, 242, 243, 251, 252, 253) extends vertically through stacks of conductive strips (210, 220, 230), in a direction perpendicular to the X-Y plane. Each of the hemi-cylindrical vertical channel structures has a major axis 250 tilted relative to the first direction. The major axis 250 is shown as along a line A-A'.

The major axis 250 is tilted at an angle α relative to the first direction (X-direction), corresponding to an angle θ relative to the second direction (Y-direction) which is orthogonal to the first direction. The angle α and the angle θ are complementary to each other, i.e., α=90°−θ and θ=90°−α. In one embodiment, the angle θ can have a range between 10° and 60°, and correspondingly, the angle α can have a range between 30° and 80°.

An isolation block (e.g. 261) provides an insulation divider to separate a first stack of conductive strips (e.g. 210) and a second stack of conductive strips (e.g. 220) adjacent the first stack. Another isolation block (e.g. 262) can separate the second stack of conductive strips and a third stack of conductive strips (e.g. 230) adjacent the second stack. First hemi-cylindrical vertical channel structures (e.g. 241, 242, 243) in the first stack of conductive strips 210 are in contact with a first side 261a of the isolation block 261. Second hemi-cylindrical vertical channel structures (e.g. 251, 252, 253) in the second stack of conductive strips 220 are in contact with a second side 261b of the isolation block 261 opposite the first side 261a of the isolation block 261. The first hemi-cylindrical vertical channel structures are disposed opposite the second hemi-cylindrical vertical channel structures across the isolation block 261 along the major axis 250.

FIG. 2A illustrates a first hemi-cylindrical vertical channel structure 243, and a second hemi-cylindrical vertical channel structure 253 disposed opposite the first hemi-cylindrical vertical channel structure across an isolation block 261 along a major axis 250 tilted relative to a first direction. As illustrated in FIG. 2A, data storage structures (243a, 253a) are disposed on the sidewalls of the conductive strips (210, 220). The hemi-cylindrical vertical channel structures comprise semiconductor films (243b, 253b) having outside surfaces in contact with the data storage structures on the sidewalls of the conductive strips. Insulating material 290 can fill volumes surrounded by the inside surfaces of the semiconductor films (243b, 253b) and the isolation block 261.

The conductive strips in the stack of conductive strips (210, 220) can act as tri-gates or finFET-like double-gates in contact with the hemi-cylindrical vertical channel structures (243, 253).

The first and second hemi-cylindrical vertical channel structures (e.g. 243, 253) disposed along the major axis 250 have a length L along the major axis 250 and a width W orthogonal to the length L. In one embodiment, a ratio of the length L to the width W can have a range from 3 to 5.

FIGS. 2B and 2C illustrate a gate width for a tilted hemi-cylindrical vertical channel structure. First, a perimeter P is calculated for a cylindrical vertical channel structure having a horizontal cross section in an example ellipse-like shape, before the cylindrical vertical channel structure is divided into first and second hemi-cylindrical vertical channel structures (e.g. 243, 253, FIGS. 2, 2A) by an isolation block (e.g. 261). The second hemi-cylindrical vertical channel structure 253 is disposed opposite the first hemi-cylindrical vertical channel structure 243 across the isolation block 261 along the major axis 250. Second, the perimeter P is divided by 2 to obtain a gate width for a single hemi-cylindrical vertical channel structure.

Calculation of a gate width using the example ellipse-like shape is provided for the purpose of illustrating that the gate width for the hemi-cylindrical vertical channel structures as described herein is greater than a gate width of a single gate and flat channel structure, but not to limit the horizontal cross-section of the hemi-cylindrical vertical channel structures as described herein to the example ellipse-like shape. A greater gate width can result in better gate controllability.

As shown in FIG. 2, Fy is a height in the second direction (Y-direction) of a first hemi-cylindrical vertical channel structure (e.g. 243) and a second hemi-cylindrical vertical channel structure (e.g. 253) disposed opposite the first hemi-cylindrical vertical channel structure across an isolation block (e.g. 261) along the major axis 250. As shown in FIG. 2, Fx is a measurement in the first direction (X-direction) across a hemi-cylindrical vertical channel structure (e.g. 241). Fx can correspond to a gate width in a single gate and flat channel structure.

As shown in FIG. 2B, the length L and the width W of the example ellipse-like shape can be approximated as a function of Fy, Fx and the angle θ, such that $L \approx Fy/\cos\theta$ $W \approx Fx*\cos\theta$ The example ellipse-like shape includes a first semicircle and a second semicircle having a radius R at opposite ends of the example ellipse-like shape along the major axis 250. The width W is approximately twice the radius R (W=2R), and the two semicircles have a combined circumference C=2πR. As shown in FIGS. 2A and 2B, the perimeter P of a cylindrical vertical channel structure having a horizontal cross-section in the example ellipse-like shape can be approximated as $P \approx C + 2*(L-2R)$ $\approx 2\pi R + 2*(L-W)$ $\approx \pi W \pm 2*(L-W)$ $\approx (\pi-2)*W + 2*L$ $\approx 1.14*W + 2*L$ $\approx 1.14*Fx*\cos\theta + 2*Fy/\cos\theta$ FIG. 2C illustrates a gate width Wg for tri-gates in contact with hemi-cylindrical vertical channel structures having a tilted major axis. Dividing the perimeter P of a cylindrical vertical channel structure by 2, a gate width Wg of a hemi-cylindrical vertical channel structure can be approximated as:

$Wg \approx 0.57*W + L$ $\approx 0.57*Fx*\cos\theta + Fy/(\cos\theta)$

In one embodiment, a ratio of the length L to the width W (L/W) can have a range from 3 to 5, and the angle θ can have a range between 10° and 60°. For instance, using a lower limit of 3 in the L/W range and a lower limit of 10° in the angle θ range, L/W=3, L=3 W, θ=10°, then Wg≈3.5 Fx which is greater than Fx. For instance, using a lower limit of 3 in the L/W range and an upper limit of 60° in the angle θ range, L/W=3, L=3 W, θ=60°, then Wg≈1.78 Fx which is greater than Fx.

A length L2 of a hemi-cylindrical vertical channel structure is about half the length L of the example ellipse-like shape, i.e., L2=L/2. In the embodiment where a ratio of the length L to the width W (L/W) can have a range from 3 to 5, a ratio of the length L2 to the width W can have a range from 1.5 to 2.5.

Figure 3:
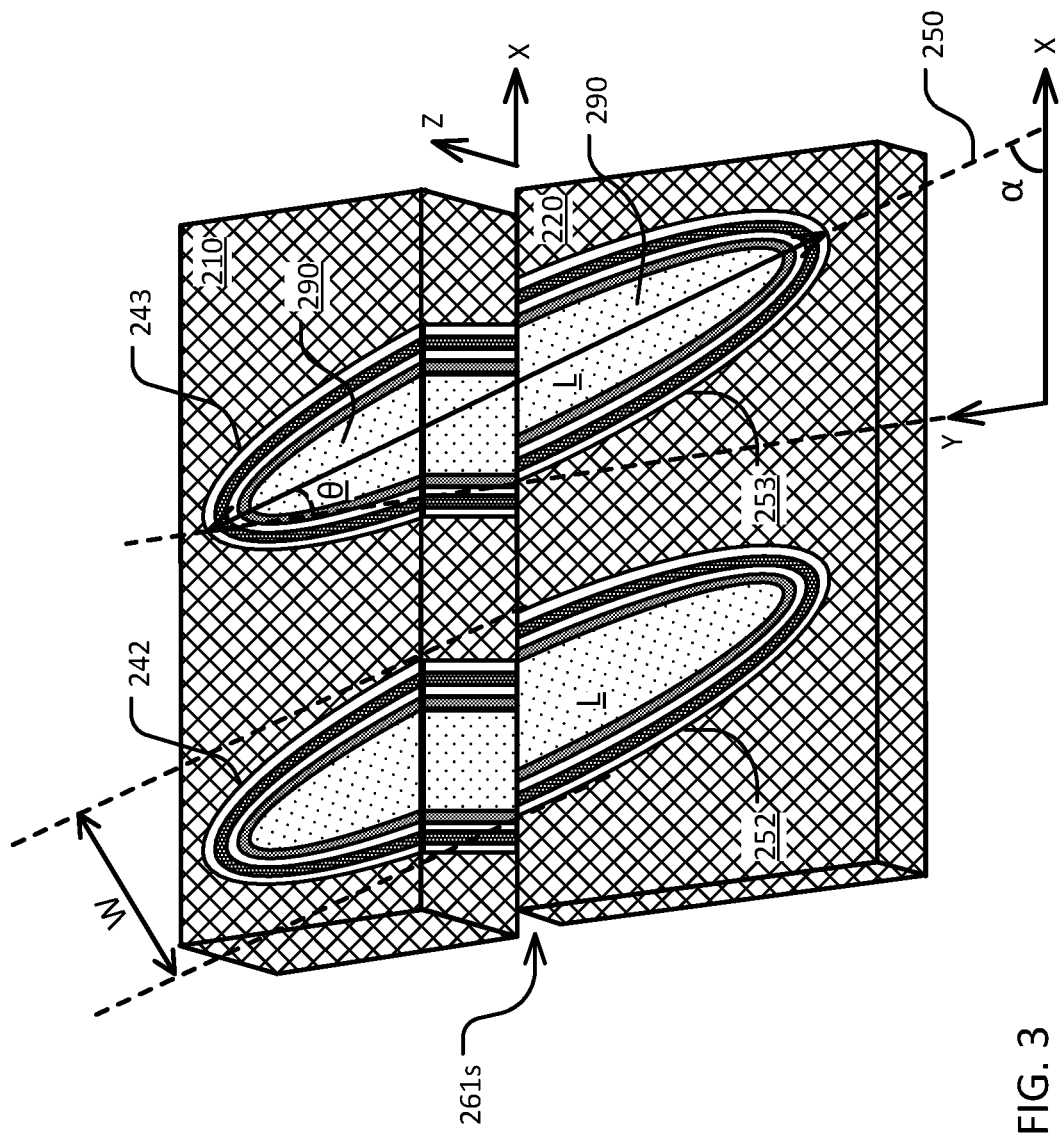
FIG. 3 illustrates a perspective view of example hemi-cylindrical vertical channel structures.

FIG. 3 illustrates a perspective view of example hemi-cylindrical vertical channel structures. Like elements in FIGS. 2, 2A, 2B, 2C and 3 are referred to with like reference numerals. As illustrated, a plurality of hemi-cylindrical vertical channel structures (242, 243, 252, 253) extends vertically through stacks of conductive strips (210, 220), in a direction Z perpendicular to the X-Y plane. Each of the hemi-cylindrical vertical channel structures has a major axis 250 tilted relative to the first direction (X-direction). The conductive strips in the stacks of conductive strips can act as tri-gates or finFET-like double-gates in contact with the hemi-cylindrical vertical channel structures.

The major axis 250 is tilted at an angle α relative to the first direction (X-direction), corresponding to an angle θ relative to the second direction (Y-direction) which is orthogonal to the first direction. The angle α and the angle θ are complementary to each other, and are further described in reference to FIG. 2.

First and second hemi-cylindrical vertical channel structures (e.g. 243, 253) disposed opposite each other across a slit 261s along the major axis 250 have a length L along the major axis 250 and a width W orthogonal to the length L. In one embodiment, a ratio of the length L to the width W can have a range from 3 to 5. An isolation structure (e.g. 261, FIG. 2A) can be formed in the slit 261s.

Figure 4:
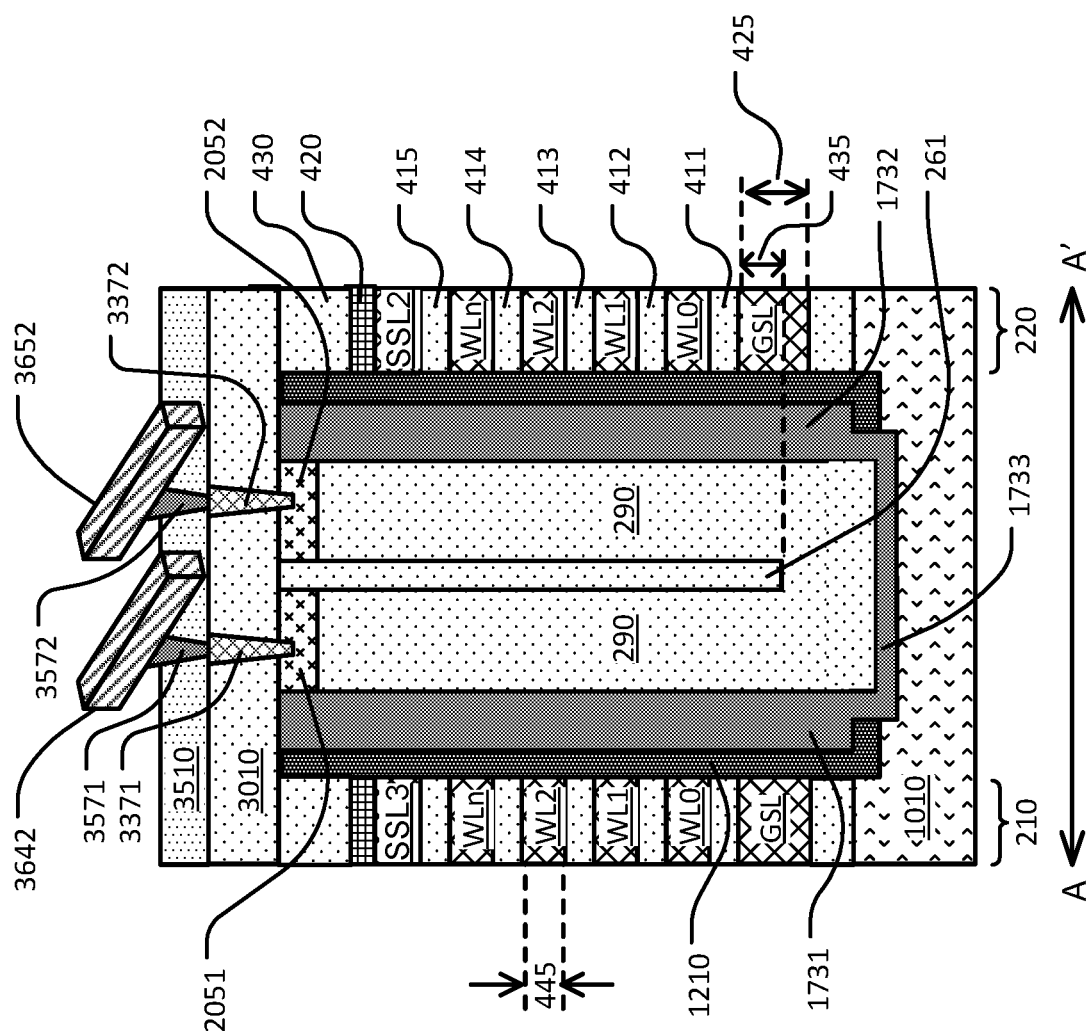
FIG. 4 illustrates a vertical cross-section of first and second hemi-cylindrical vertical channel structures taken along a major axis.

FIG. 4 illustrates a vertical cross-section of the first and second hemi-cylindrical vertical channel structures taken along a major axis (A-A', FIG. 2A). The first and second stacks of conductive strips 210 and 220 separated by insulating strips (411-415) are disposed on the reference conductor 1010. The first and second stacks of conductive strips include an upper level of conductive strips (SSL3, SSL2), a lower level of conductive strips (GSL), and a plurality of intermediate levels of conductive strips (WL0-WL2, WLn) between the upper level of conductive strips and the lower level conductive strip. A top layer of silicon nitride 420 is disposed on each of first and second stacks of conductive strips. A top insulating layer 430 is disposed on the top layer of silicon nitride 420.

The intermediate conductive layers have a first thickness 445 and the lower conductive layer GSL has a second thickness 425 greater than the first thickness. The isolation block 261 extends into the lower conductive layer GSL by a depth 435 less than the thickness 425 of the lower conductive layer GSL.

The upper level of conductive strips can act as string select lines. The intermediate levels of conductive strips can act as word lines. The lower level of conductive strips can act as ground select lines. The conductive strips can comprise a variety of materials including doped semiconductors, metals, and conductive compounds, including materials comprising Si, Ge, SiGe, SiC, TiN, TaN, W, and Pt.

The hemi-cylindrical vertical channel structures extending through respective vias (1141-1143, 1151-1153, FIGS. 11, 11A) in the conductive strips in the first and second stacks comprise semiconductor films (1731, 1732) in electrical contact with the reference conductor 1010. A horizontal semiconductor film 1733 is disposed on the reference conductor 1010 connected to the semiconductor films (1731, 1732) in the first and second hemi-cylindrical vertical channel structures.

The semiconductor films can comprise semiconductor materials adapted to act as channels for the memory cells, such materials as Si, Ge, SiGe, GaAs, SiC, and graphene. In one embodiment, the reference conductor 1010 can include a doped semiconductor, and the horizontal semiconductor film 1733 can be implanted with dopants having a same semiconductor type as the doped semiconductor in the reference conductor.

Data storage structures 1210 are disposed between the outside surfaces of the semiconductor films and sidewalls of the vias in the conductive strips.

The data storage structures 1210 can include a multilayer data storage structure, known from flash memory technologies including, for example, flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

Insulating material (290) can fill volumes surrounded by the inside surfaces of the semiconductor films (1731, 1732) and the isolation block 261.

A first plug 2051 is connected to the first vertical semiconductor film 1731 on the first side of the isolation block 261, and a second plug 2052 is connected to the second vertical semiconductor film 1732 on the second side of the isolation block opposite the first side of the isolation block.

First and second contacts (3371, 3372) through a first layer of insulating material 3010 over the first and second plugs are connected to the first and second plugs, respectively. First and second vias (3571, 3572) through a second layer of insulating material 3510 over the first layer of insulating material 3010 are connected to the first and second contacts, respectively. First and second bit lines (3642, 3652) are connected to the first and second vias, respectively.

Figure 5:
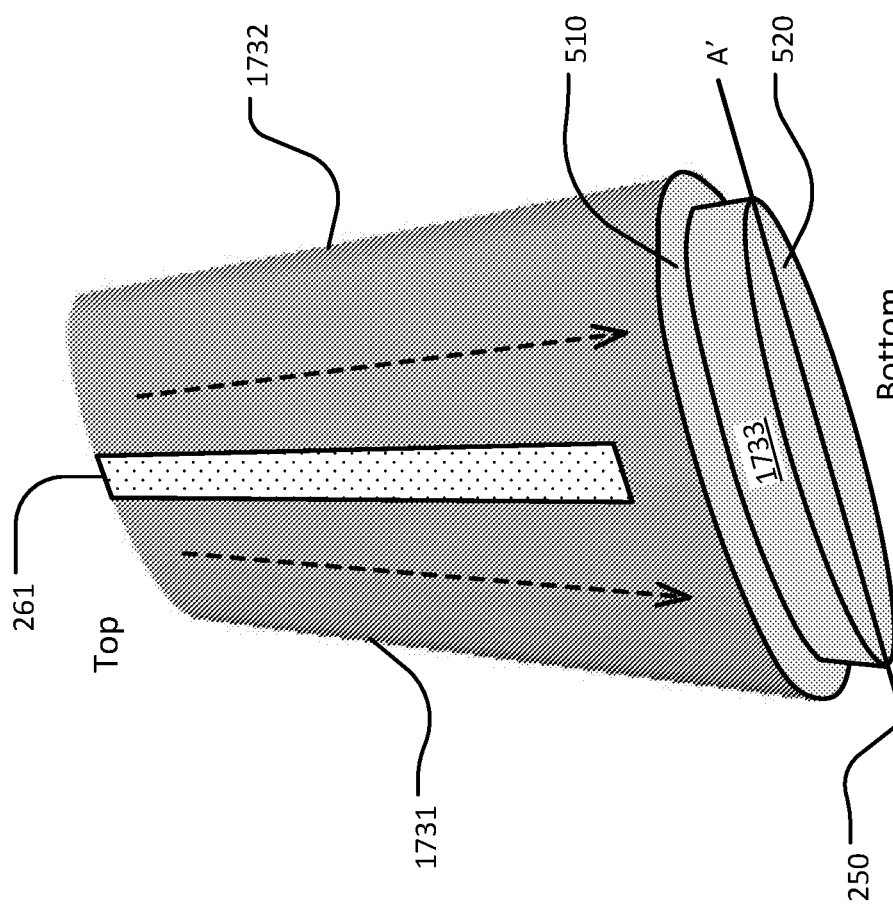
FIGS. 5 and 6 illustrate perspective views of the first and second hemi-cylindrical vertical channel structures as shown in FIG. 4.
Figure 6:
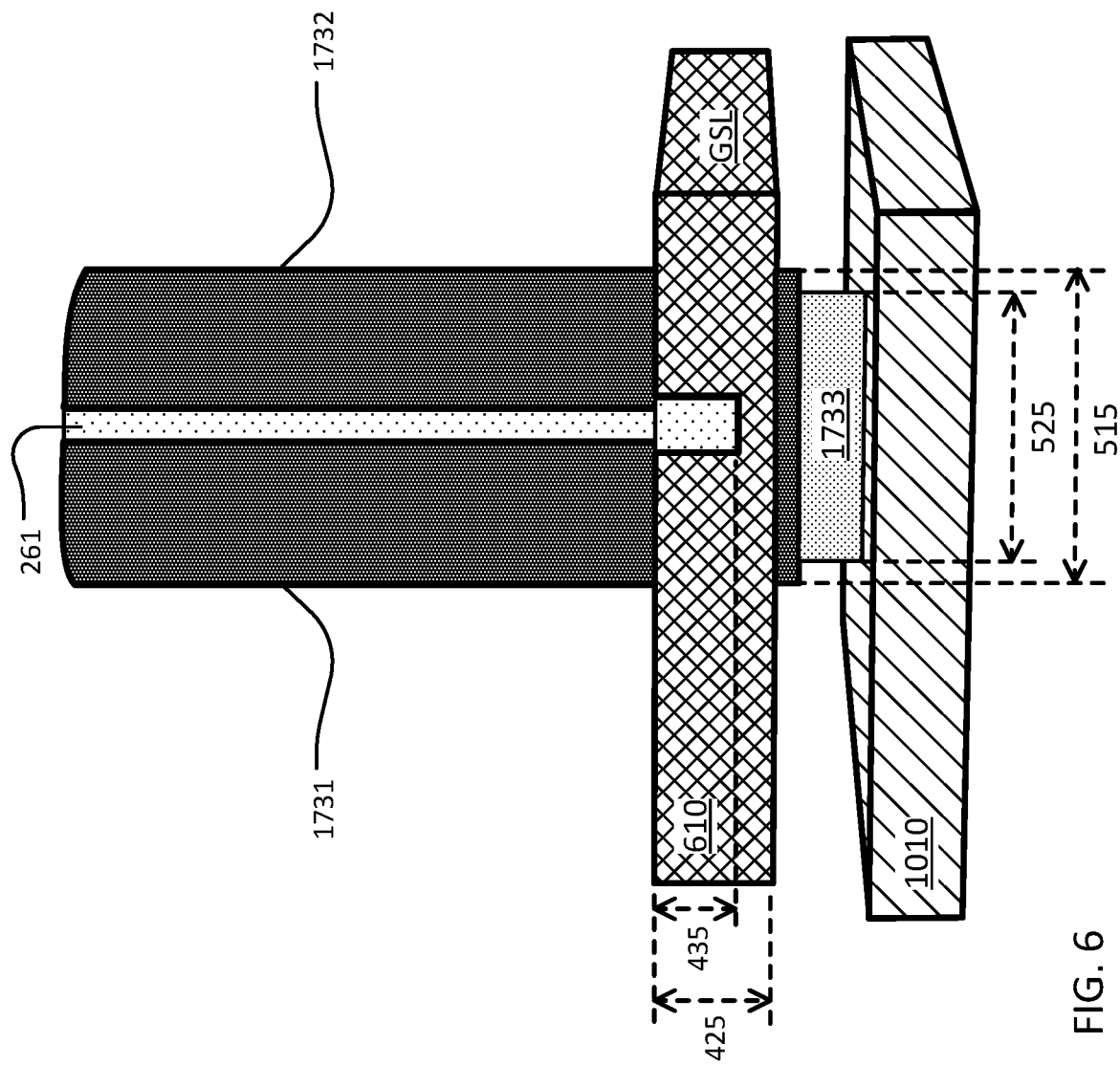

FIGS. 5 and 6 illustrate perspective views of the first and second hemi-cylindrical vertical channel structures as shown in FIG. 4. An isolation block 261 separates the first and second semiconductor films (1731, 1732) in the hemi-cylindrical vertical channel structures.

The semiconductor films (1731, 1732) in the first and second hemi-cylindrical vertical channel structures have an elliptical bottom surface (510, FIG. 5) having a first length (515, FIG. 6) along the major axis (A-A').

A horizontal semiconductor film 1733 disposed on the reference conductor (1010, FIG. 6) is connected to the semiconductor films (1731, 1732). The horizontal semiconductor film has an elliptical cross section (520, FIG. 5) having a second length (525, FIG. 6) along the major axis, where the first length 515 of the elliptical bottom surface 510 is greater than the second length of the elliptical cross section 520 of the horizontal semiconductor film 1733.

FIG. 6 illustrates the intermediate isolation blocks (e.g. 261) extending into the lower conductive layer GSL 610 by a depth 435 less than the thickness 425 of the lower conductive layer GSL 610.

Figure 7:
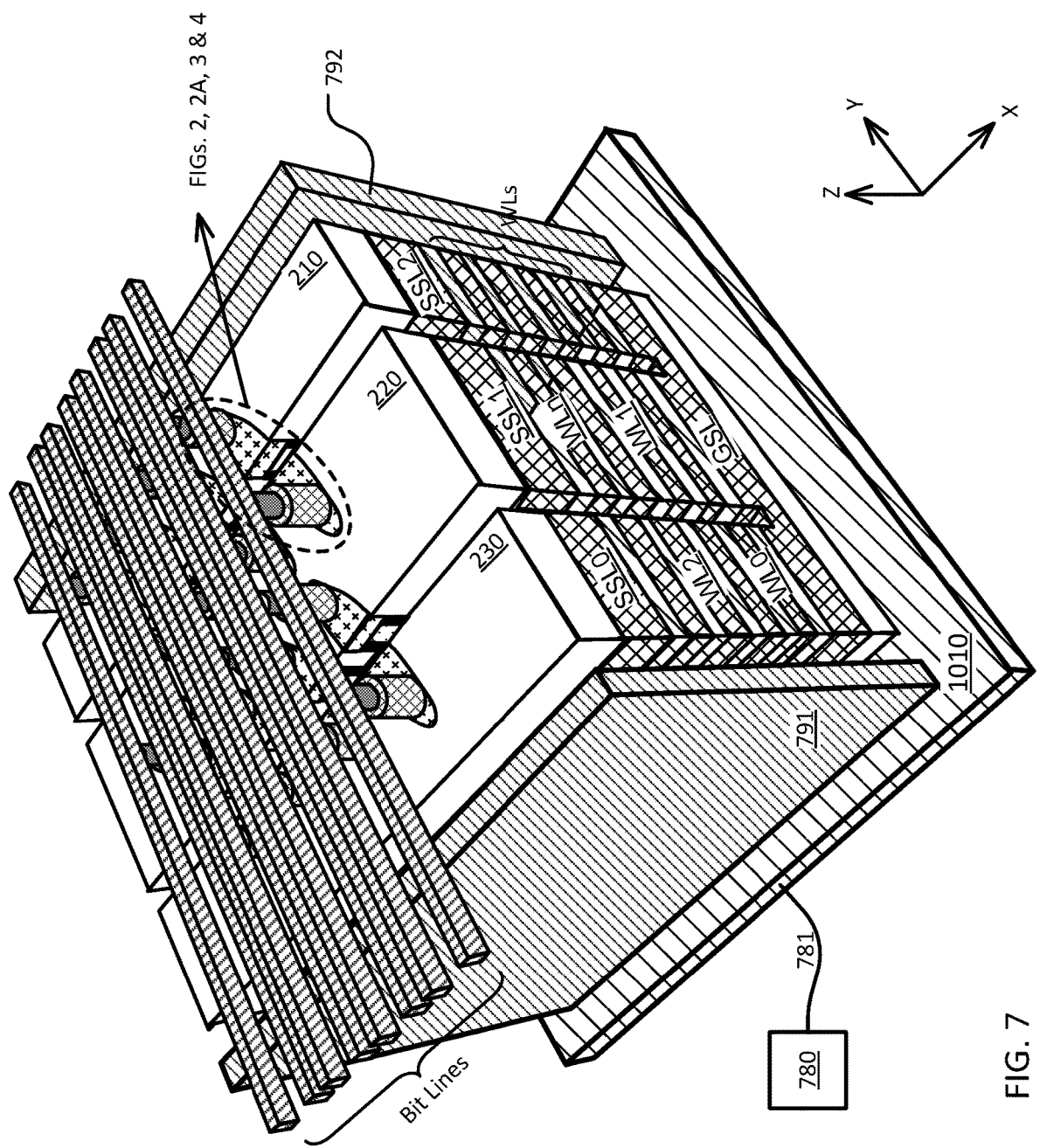
FIG. 7 illustrates a reference conductor, and a plurality of stacks of conductive strips disposed on the reference conductor.

FIG. 7 illustrates a reference conductor 1010, and a plurality of stacks of conductive strips (210, 220, 230) disposed on the reference conductor 1010. The conductive strips in the stacks are separated by insulating strips and extend in the first direction (X-direction). The stacks of conductive strips include an upper level of conductive strips (SSL0, SSL1, SSL2), a lower level of conductive strips (GSL), and a plurality of intermediate levels of conductive strips (WL0, WL1, WL2, WLn) disposed between the upper level of conductive strips and the lower level of conductive strips.

FIG. 7 illustrates a plurality of hemi-cylindrical vertical channel structures, such as described in reference to FIGS. 2, 2A, 3 and 4, extending through respective vias (1141-1143, 1151-1153, FIG. 11, 11A) in the conductive strips in the stacks. Each of the hemi-cylindrical vertical channel structures has a divided elliptical cross section with a major axis tilted relative to the first direction (X-direction).

Figure 8:
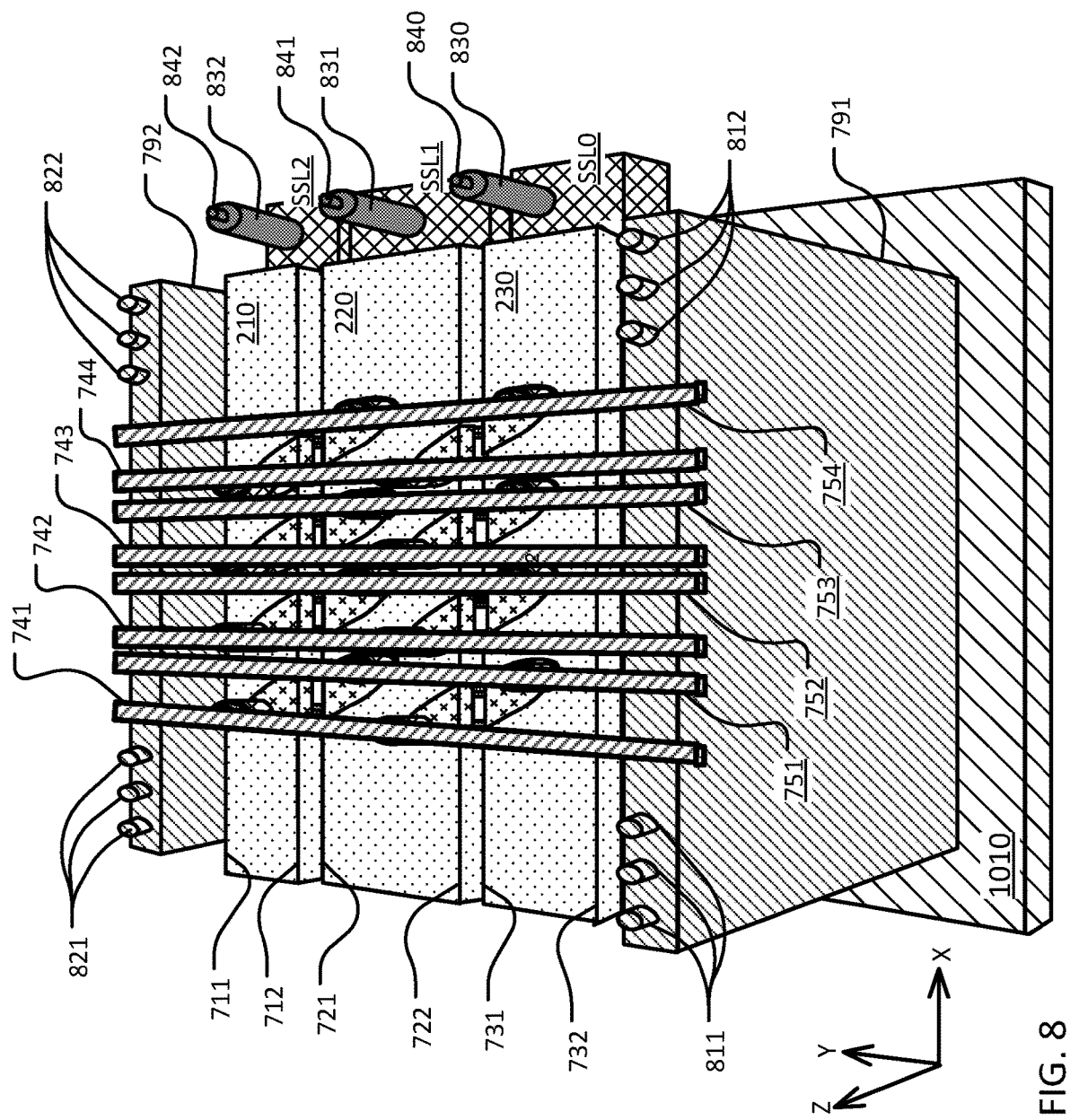
FIG. 8 illustrates bit lines connected to the hemi-cylindrical vertical channel structures.

Bit lines connected to the hemi-cylindrical vertical channel structures are described in reference to FIG. 8.

A first vertical source contact plate 791 and a second vertical source contact plate 792 are disposed on and connected to the reference conductor 1010, and extend vertically through or adjacent to the stacks. The first and second vertical source contact plates extend in the first direction (X-direction), and are disposed opposite each other across the plurality of stacks of conductive strips in the second direction (Y-direction) orthogonal to the first direction.

A common source reference driver 780 is operatively connected to the reference conductor 1010 via a connection 781.

FIG. 8 illustrates bit lines connected to the hemi-cylindrical vertical channel structures. The plurality of stacks of conductive strips includes a first odd stack 210 being disposed on a first side 721 of an even stack 220 in the plurality of stacks, and a second odd stack 230 being disposed on a second side 722 of the even stack opposite the first side in the second direction (Y-direction). The stacks of conductive strips (210, 220, 230) have respective first sides (711, 721, 731) and second sides (712, 722, 732) opposite the first sides in the second direction (Y-direction).

A first set of bit lines (741-744) is connected to the hemi-cylindrical vertical channel structures on a second side 712 of the first odd stack 210 adjacent the first side 721 of the even stack 220, and connected to the hemi-cylindrical vertical channel structures on the second side 722 of the even stack 220.

A second set of bit lines (751-754) is connected to the hemi-cylindrical vertical channel structures on a first side 731 of the second odd stack 230 adjacent the second side 722 of the even stack 220 and connected to the hemi-cylindrical vertical channel structures on the first side 721 of the even stack 220.

Bit lines in the first set of bit lines alternate with bit lines in the second set of bit lines in the first direction (X-direction).

First vias (811, 812) are disposed on a top surface of the first vertical source contact plate 791, connecting the first vertical source contact plate to a patterned conductor layer, such as a metal layer, overlying the plurality of stacks of conductive strips. In one embodiment, first vias (811, 812) are disposed on opposite sides of the bit lines in the first and second sets of bit lines in the first direction, on the top surface of the first vertical source contact plate 791.

Second vias (821, 822) are disposed on a top surface of the second vertical source contact plate 792, connecting the second vertical source contact plate to the patterned conductor layer overlying the plurality of stacks of conductive strips. In one embodiment, second vias (821, 822) are disposed on opposite sides of the bit lines in the first and second sets of bit lines in the first direction, on the top surface of the second vertical source contact plate 792.

The stacks of conductive strips include respective string select lines (SSL0, SSL1, SSL2) at the upper level of conductive strips. String select line contacts (830, 831, 832) are disposed on respective string select lines. String select line vias (840, 841, 842) are disposed on respective string select line contacts.

Figure 9:
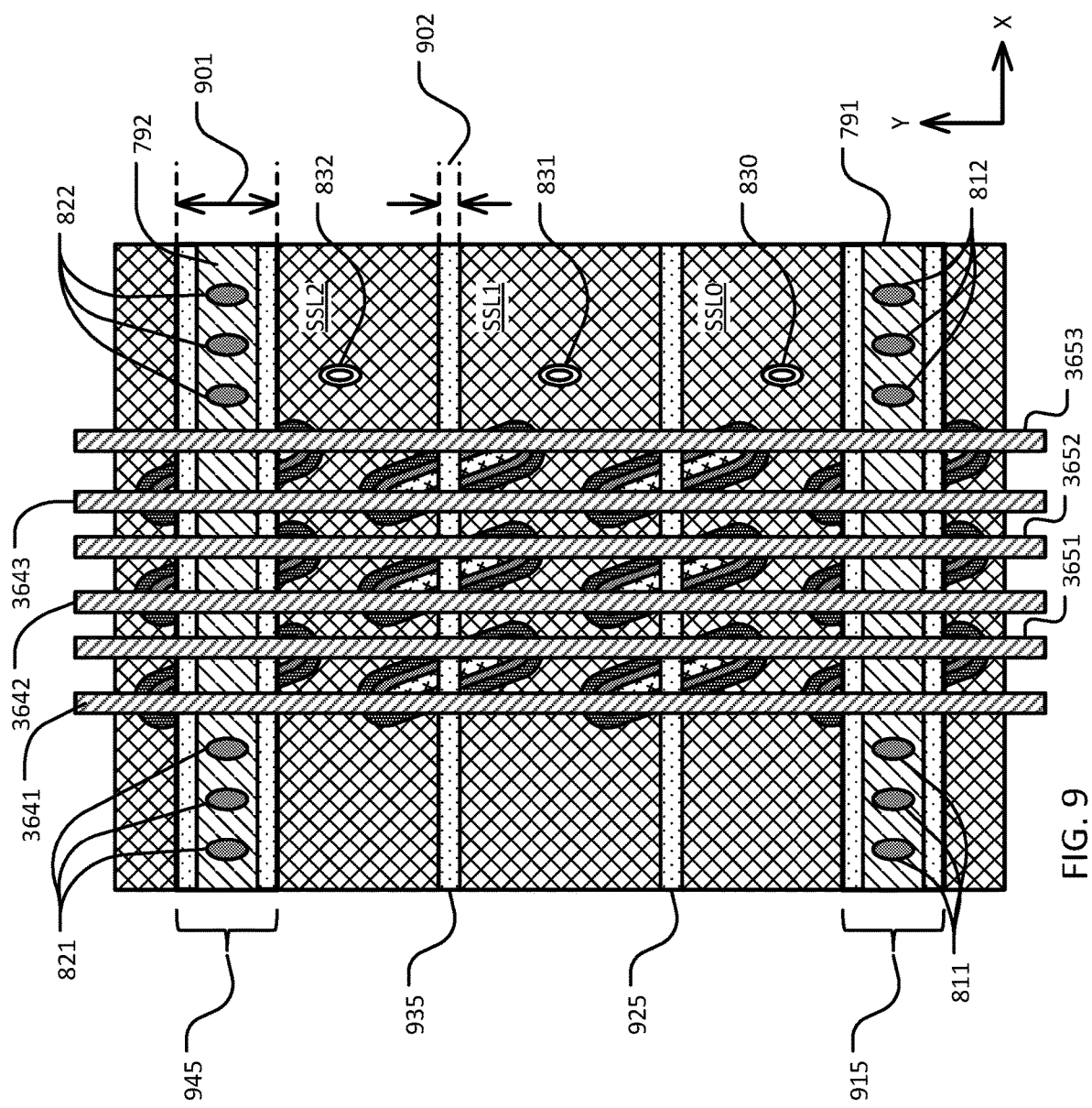
FIG. 9 illustrates a plurality of isolation blocks extending in the first direction separating adjacent stacks in the plurality of stacks of conductive strips.

FIG. 9 illustrates a plurality of isolation blocks extending in the first direction separating adjacent stacks (210, 220, 230) in the plurality of stacks of conductive strips. The plurality of isolation blocks includes a first isolation block (915), a last isolation block (945), and intermediate isolation blocks (925, 935) between the first and last isolation blocks in the second direction.

The first and last isolation blocks have a first width 901, and the intermediate isolation blocks have a second width 902, the first width being greater than the second width.

Figure 23:
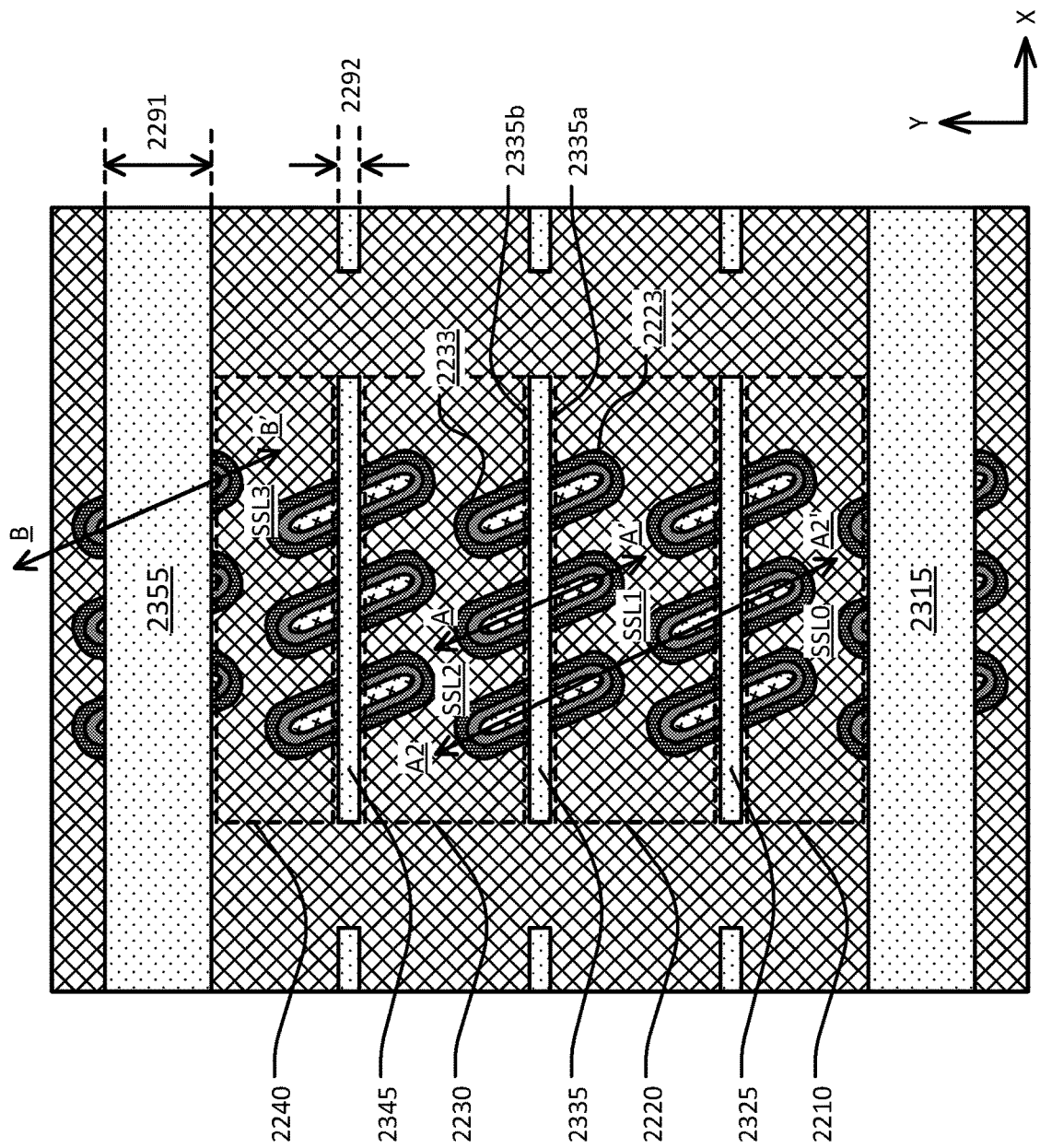
FIG. 23 illustrates a stage of the process flow after forming a plurality of isolation blocks in the plurality of slits.
Figure 23A:
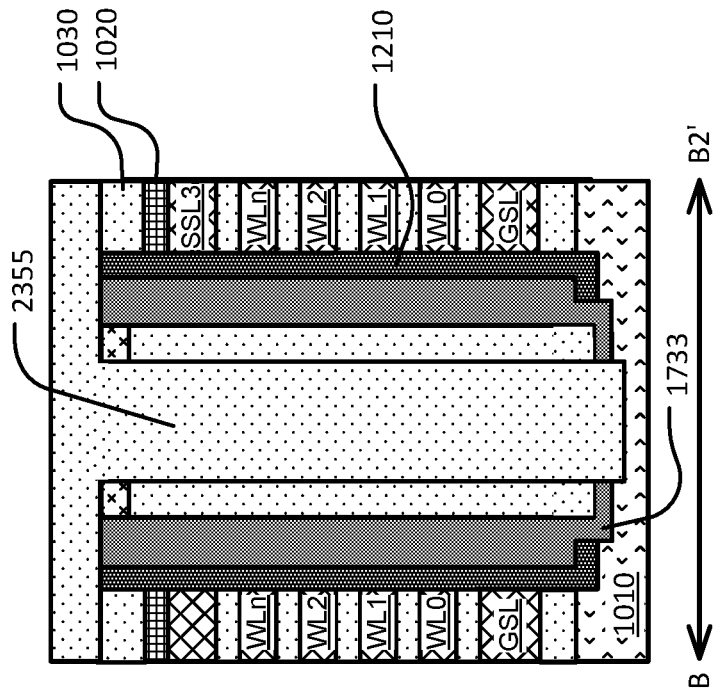
FIG. 23A illustrates a vertical cross-section of FIG. 23 taken along the line A-A' across an intermediate isolation block.
Figure 23B:
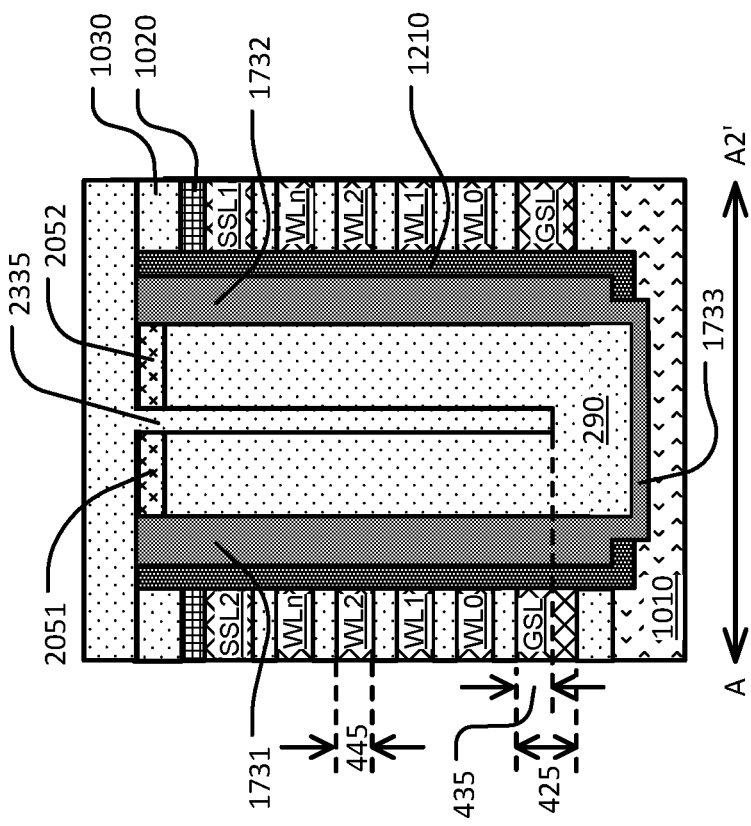
FIG. 23B illustrates a vertical cross-section of FIG. 23 taken along the line B-B' across the last isolation block.

The first isolation block and the last isolation block extend through a horizontal semiconductor film disposed on the reference conductor 1010 and stop on the reference conductor 1010, as further described in reference to FIG. 23B.

The intermediate isolation blocks extend into the lower conductive layer GSL by a depth 435 less than a thickness 425 of the lower conductive layer, as further described in reference to FIGS. 4, 6 and 23A.

Figure 36:
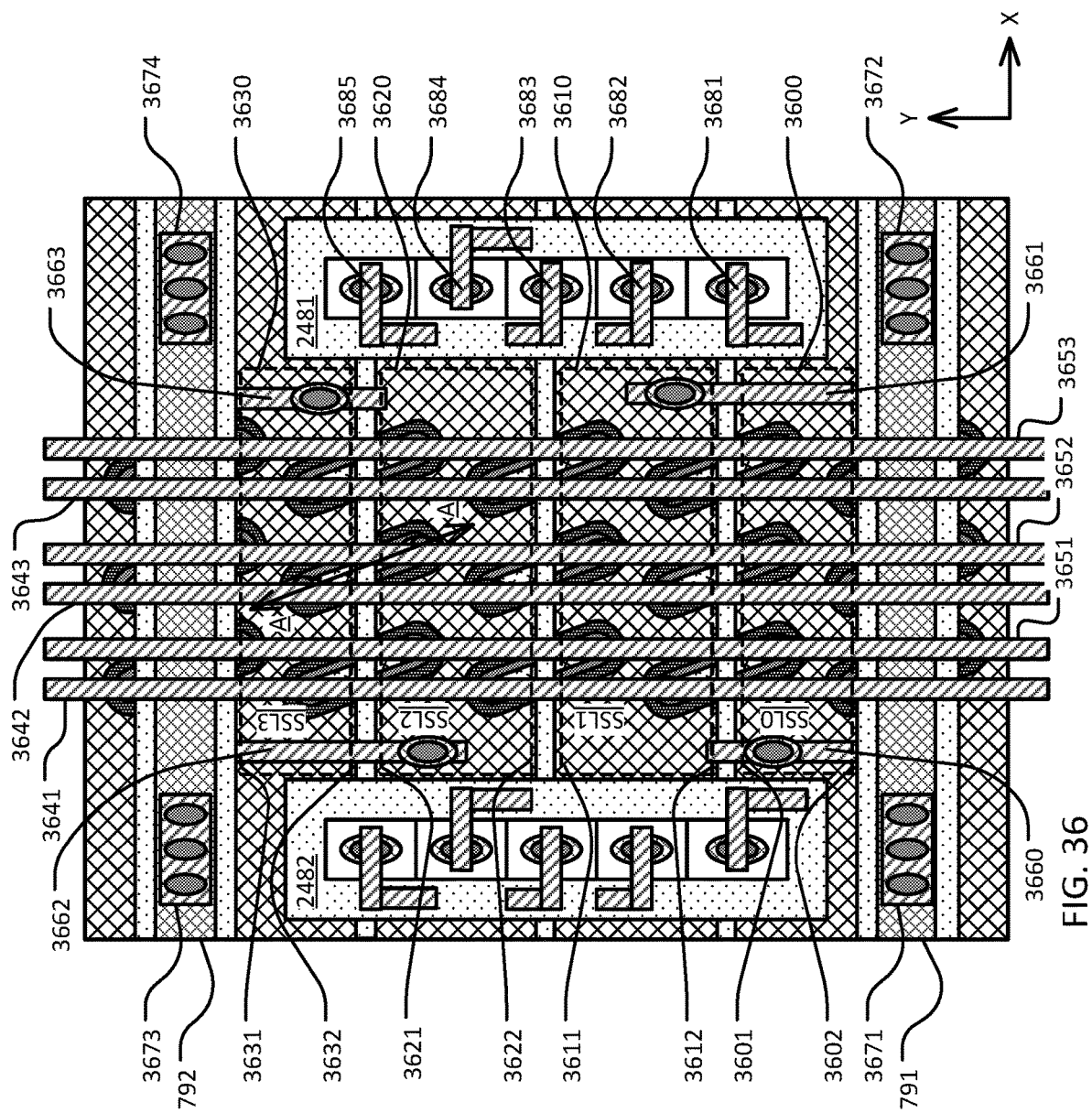
FIG. 36 illustrates a stage of the process flow after forming a first set of bit lines and a second set of bit lines connected to the hemi-cylindrical vertical channel structures extending through the stacks of conductive strips.

A first set of bit lines (3641-3643) and a second set of bit lines (3651-3653) connected to the hemi-cylindrical vertical channel structures are described in reference to FIG. 36.

Figure 10:
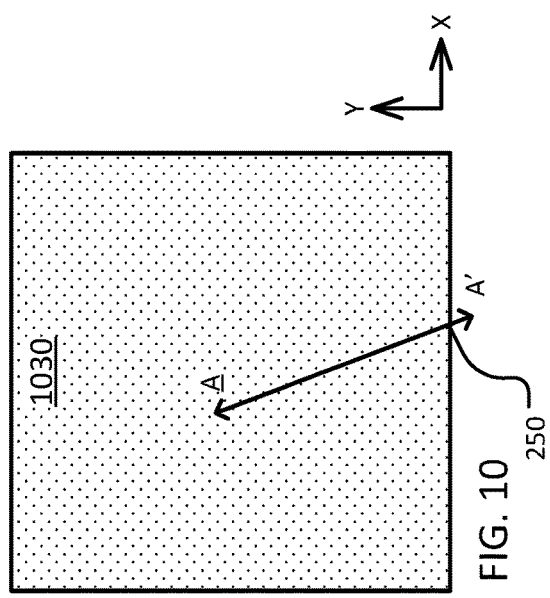
FIGS. 10 and 10A illustrate a stage of the process flow after forming a stack of conductive layers.
Figure 10A:
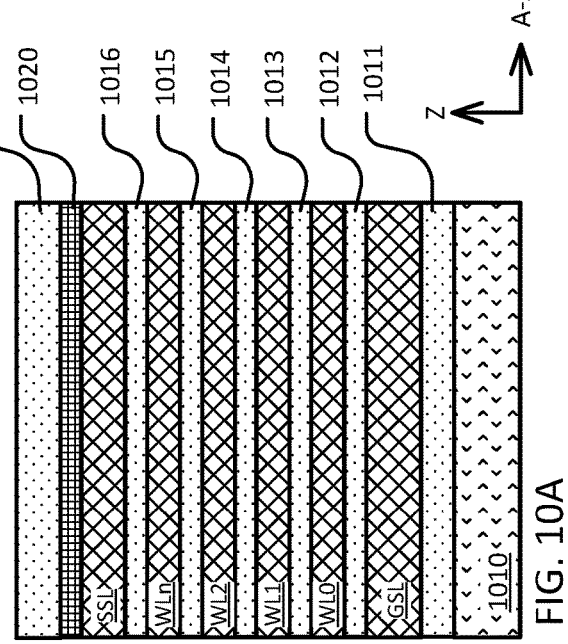

FIGS. 10 and 10A illustrate a stage of the process flow after forming a stack of conductive layers separated by insulating layers on a reference conductor 1010. The stack of conductive layers includes an upper conductive layer (SSL), a lower conductive layer (GSL), and intermediate conductive layers (WL0-WLn) between the upper conductive layer and the lower conductive layer. FIG. 10A is a vertical cross section of FIG. 10 taken along a line A-A' shown in FIG. 10, where the line A-A' is tilted relative to a first direction (X-direction). The plurality of intermediate conductive layers can include N layers, where N is greater than 2. For instance, N=32. The conductive layers can comprise a variety of materials including doped semiconductors, metals, and conductive compounds, including materials comprising Si, Ge, SiGe, SiC, TiN, TaN, W, and Pt.

Insulating layers 1011, 1012, 1013, 1014, 1015 and 1016 separate the conductive layers. The insulating layers can comprise a silicon oxide or other dielectric on a semiconductor substrate. A top layer 1020 of silicon nitride is formed on the stack of conductive layers, and a top insulating layer 1030 is formed on the top layer 1020 of silicon nitride.

Figure 11:
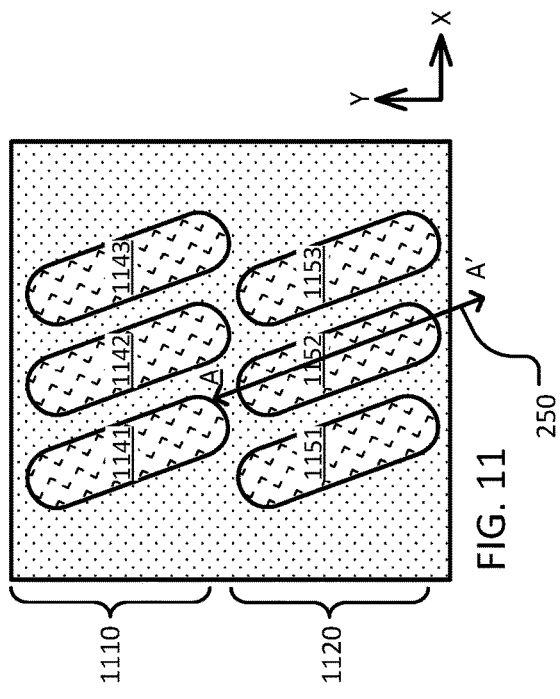
FIGS. 11 and 11A illustrate a stage of the process flow after etching a plurality of rows of elliptical vias in the stack of conductive layers.
Figure 11A:
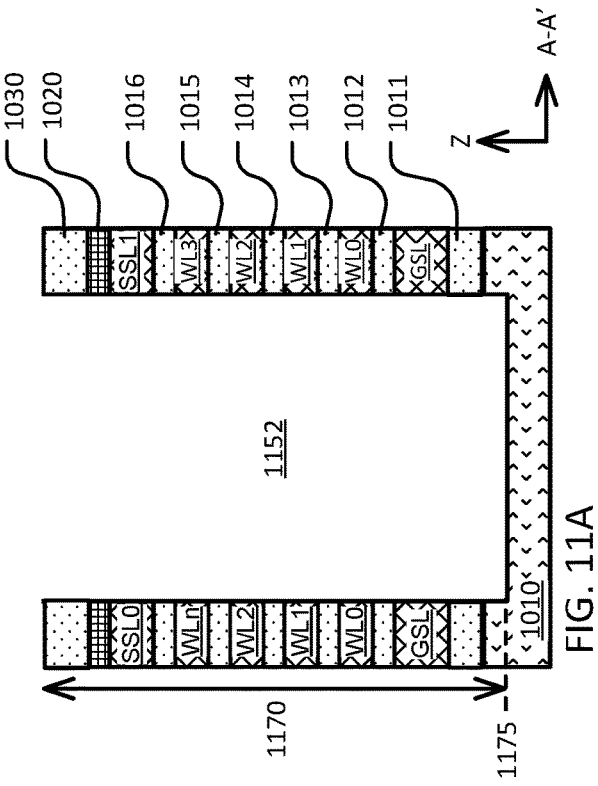

FIGS. 11 and 11A illustrate a stage of the process flow after etching a plurality of rows of elliptical vias in the stack of conductive layers. FIG. 11A is a vertical cross-section of FIG. 11 taken along the line A-A' shown in FIG. 11. In the example of FIG. 11, a first row 1110 of elliptical vias (1141, 1142, 1143) and a second row 1120 of elliptical vias (1151, 1152, 1153) are arranged in the first direction (X-direction). Each of the elliptical vias in the rows in the plurality of rows of elliptical vias has a major axis 250 tilted relative to the first direction (X-direction). The major axis 250 is shown along the line A-A'. As used herein, an elliptical via has a horizontal elliptical cross section with the major axis 250 relative to the first direction.

The elliptical vias in the rows of elliptical vias are etched through the top insulating layer 1030, the top layer 1020 of silicon nitride, the top conductive layer (SSL), the plurality of intermediate conductive layers (WL0-WLn), and the bottom conductive layer (GSL). The etching process to etch the elliptical vias stops at a via etch level 1175 in the reference conductor 1010, and has a via etch depth 1170 from the top insulating layer 1030 to the via etch level 1175 in the reference conductor 1010.

Figure 12:
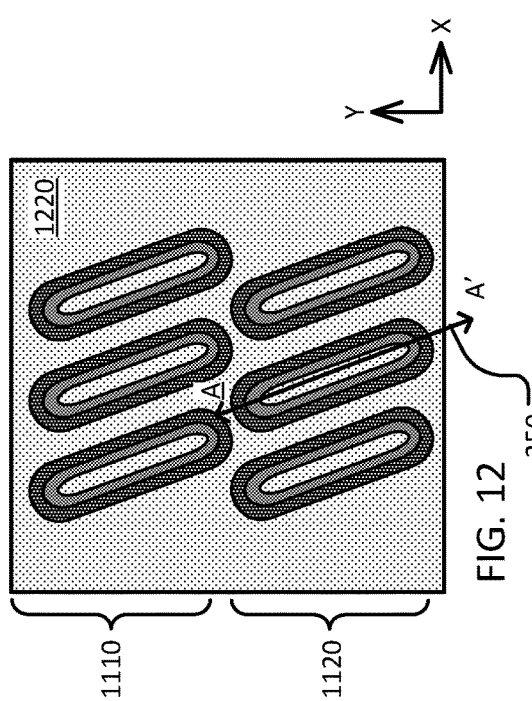
FIGS. 12 and 12A illustrate a stage of the process flow after depositing data storage structures and first semiconductor films on sidewalls and bottom surfaces of the elliptical vias.
Figure 12A:
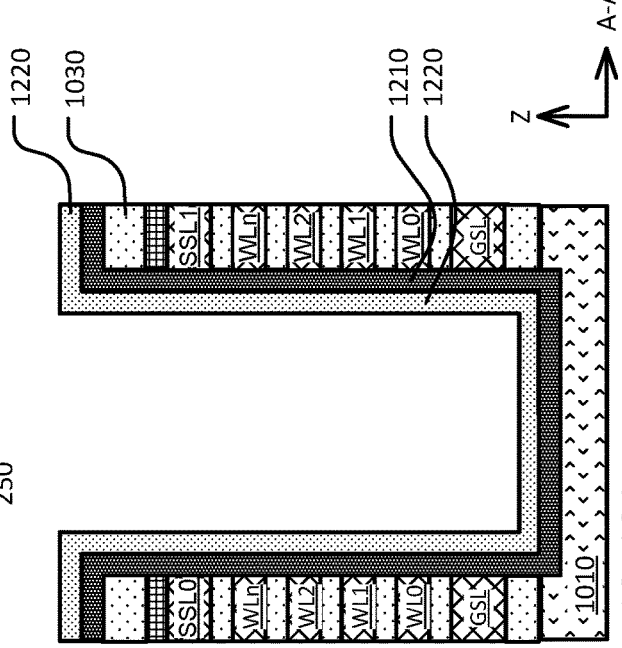

FIGS. 12 and 12A illustrate a stage of the process flow after depositing data storage structures 1210 and first semiconductor films 1220 on sidewalls and bottom surfaces of the elliptical vias in the rows. FIG. 12A is a vertical cross section of FIG. 12 taken along the line A-A' shown in FIG. 12. Data storage structures 1210 are also deposited over the top insulating layer 1030 on top surfaces of the conductive layers. First semiconductor films 1220 are deposited over and in contact with the data storage structures 1210.

The data storage structures 1210 can include a multilayer data storage structure, known from flash memory technologies, including for example flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

The semiconductor films can comprise semiconductor materials adapted to act as channels for the memory cells, such materials as Si, Ge, SiGe, GaAs, SiC, and graphene.

Figure 13:
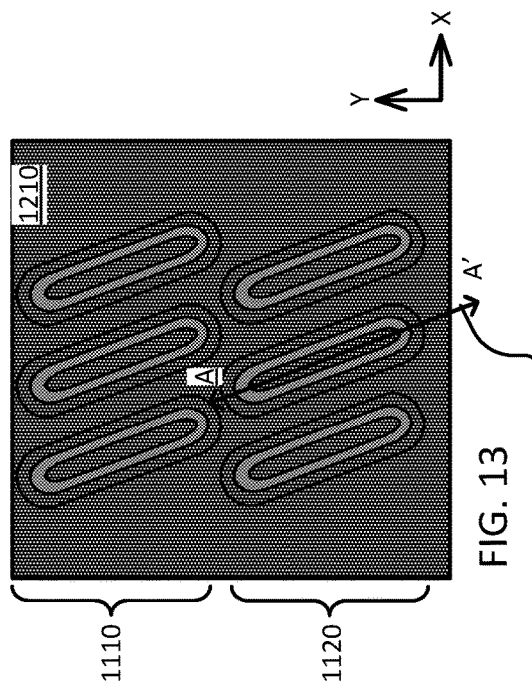
FIGS. 13 and 13A illustrate a stage of the process flow after removing the first semiconductor films from the bottom surfaces of the elliptical vias.
Figure 13A:
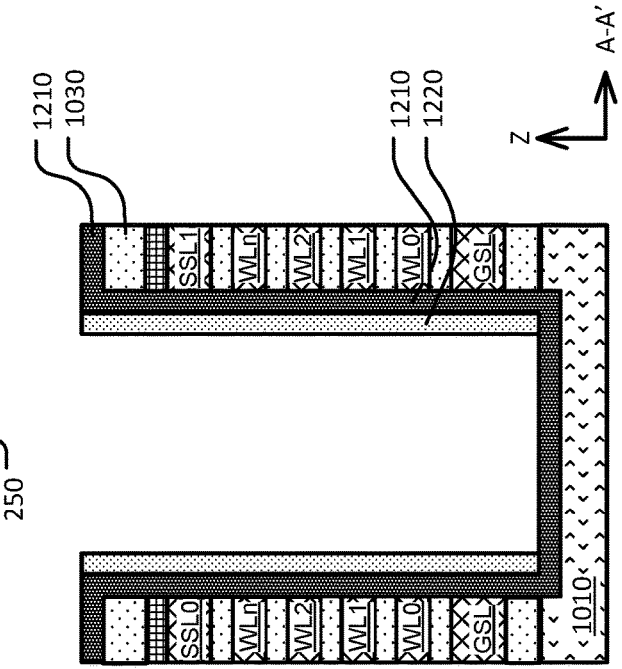

FIGS. 13 and 13A illustrate a stage of the process flow after removing the first semiconductor films 1220 from the bottom surfaces of the elliptical vias in the rows of elliptical vias. This step also removes the first semiconductor films 1220 from the top surfaces of the conductive layers.

FIGS. 14 and 14A illustrate a stage of the process flow after etching through the data storage structures 1210 on the bottom surfaces of the elliptical vias to expose the reference conductor.

FIGS. 15 and 15A illustrate a stage of the process flow after depositing second semiconductor films 1530 on the sidewalls and bottom surfaces of the elliptical vias in the rows of elliptical vias, the second semiconductor films contacting the first semiconductor films 1220 on the sidewalls and contacting the reference conductor 1010. The second semiconductor films 1530 include a horizontal semiconductor film 1533 disposed on the reference conductor 1010, and connected to the second semiconductor films 1530 on the sidewalls of the elliptical vias in the rows of elliptical vias. The second semiconductor films 1530 include a horizontal semiconductor film 1535 disposed on the top insulating layer 1030 over the conductive layers, and connected to the second semiconductor films 1530 on the sidewalls of the elliptical vias.

FIGS. 16 and 16A illustrate a stage of the process flow after implanting the second semiconductor films on the reference conductor 1010 in the elliptical vias in the rows of elliptical vias with dopants having a semiconductor type (e.g. N+type). In one embodiment, the reference conductor 1010 can include a doped semiconductor having a semiconductor type (e.g. N+type), and the dopants in the second semiconductor films have the same semiconductor type as the doped semiconductor in the reference conductor. The horizontal semiconductor film 1533 disposed on the reference conductor 1010 and the horizontal semiconductor film 1535 disposed on the conductive layers are implanted with the dopants having the semiconductor type (e.g. N+type).

FIGS. 17 and 17A illustrate a stage of the process flow after annealing the first semiconductor films 1220 and the second semiconductor films 1530 into vertical semiconductor films (1731, 1732) on the sidewalls of the elliptical vias in the rows of elliptical vias. As a result, a horizontal semiconductor film 1733 is disposed on the reference conductor 1010 connected to the vertical semiconductor films (1731, 1732) on the sidewalls of the elliptical vias in the rows of elliptical vias.

Figure 18:
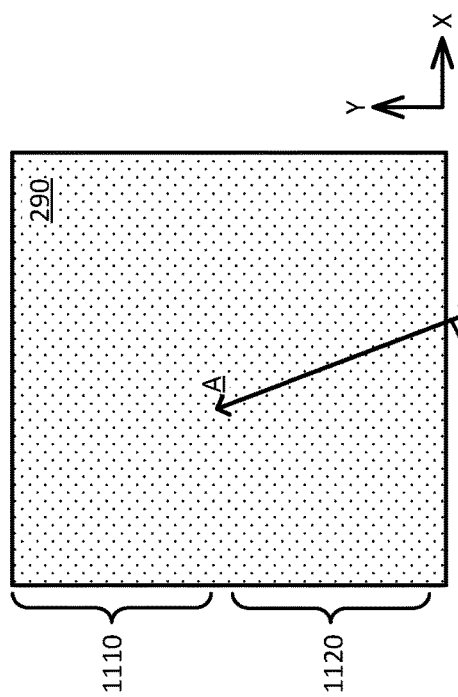
FIGS. 18 and 18A illustrate a stage of the process flow after filling the elliptical vias in the rows of elliptical vias with an insulating material.
Figure 18A:
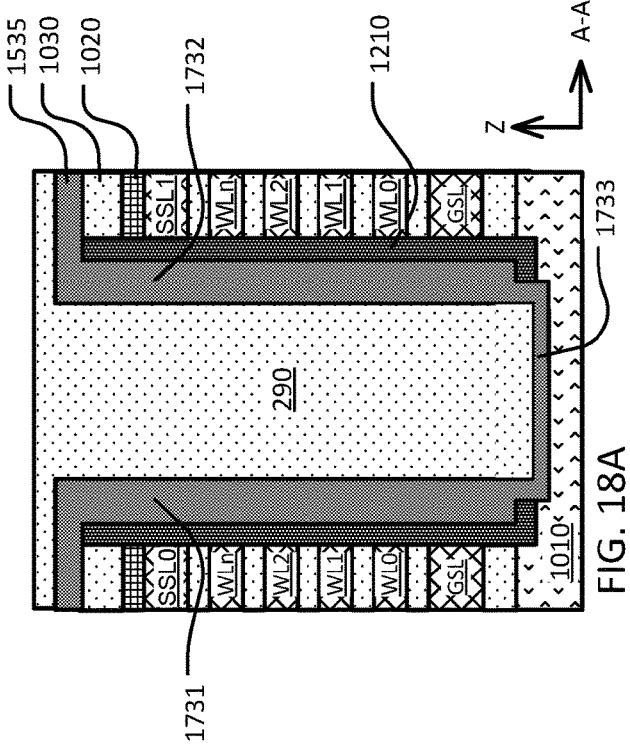

FIGS. 18 and 18A illustrate a stage of the process flow after filling the elliptical vias in the rows of elliptical vias with an insulating material 290. FIG. 18A illustrates a vertical cross section of FIG. 18 taken along the line A-A' shown in FIG. 18. The insulating material 290 is also deposited over the horizontal semiconductor film 1535 over the conductive layers.

Figure 19:
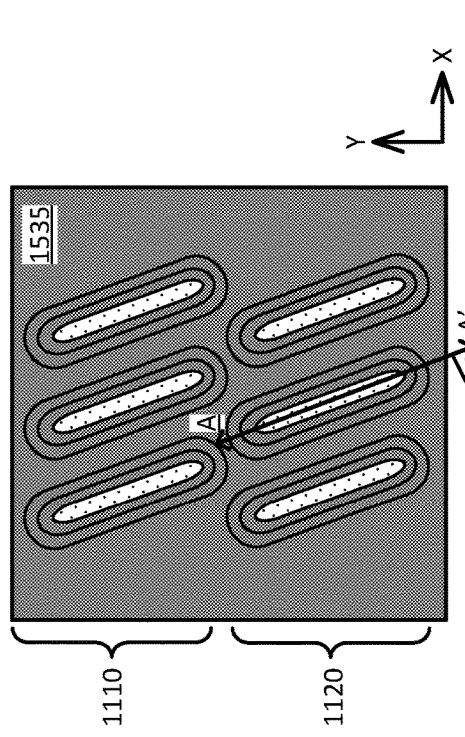
FIGS. 19 and 19A illustrate a stage of the process flow after etching back the insulating material in the elliptical vias to form a recess.
Figure 19A:
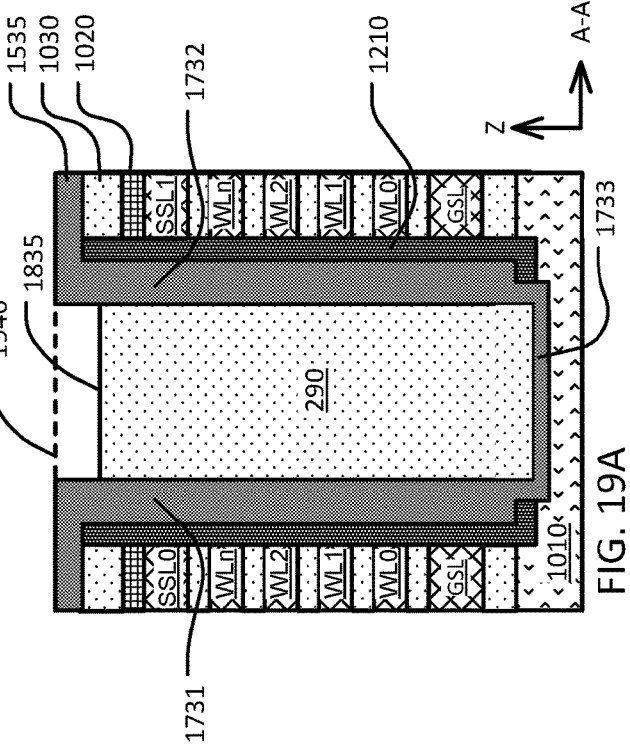

FIGS. 19 and 19A illustrate a stage of the process flow after etching back the insulating material 290 in the elliptical vias in the rows of elliptical vias, to form a recess 1940 over a top surface 1835 of the insulating material 290 in the elliptical vias. The top surface 1835 can be higher than a top conductive layer (SSL0, SSL1) in the stack of conductive layers, or higher than a top layer 1020 of silicon nitride over the stack of conductive layers. FIG. 18A illustrates a vertical cross section of FIG. 18 taken along the line A-A' shown in FIG. 18.

FIGS. 20 and 20A illustrate a stage of the process flow after depositing a conductive material 2050 in the recess 1940 and over top surfaces of the stack of conductive layers, including over the horizontal semiconductor film 1535 over the conductive layers. For instance, the conductive material 2050 can include W (tungsten), and can be deposited by CVD (chemical vapor deposition). FIG. 20 illustrates a top view of the conductive material 2050. FIG. 20A illustrates a vertical cross-section of FIG. 20 taken along the line A-A' shown in FIG. 20.

FIGS. 21 and 21A illustrate a stage of the process flow after removing the conductive material 2050 above the top surfaces of the stacks of conductive strips, for instance by CMP (chemical mechanical planarization), while leaving the conductive material 2050 over the top surface of the insulating material 290 in the elliptical vias in the rows of elliptical vias. At this stage, the horizontal semiconductor film 1535 over the conductive layers can also be removed. FIG. 21 illustrates a top view of the conductive material 2050 surrounded by the vertical semiconductor films (1731, 1732). FIG. 21A illustrates a vertical cross-section of FIG. 21 taken along the line A-A' shown in FIG. 21.

Figure 22:
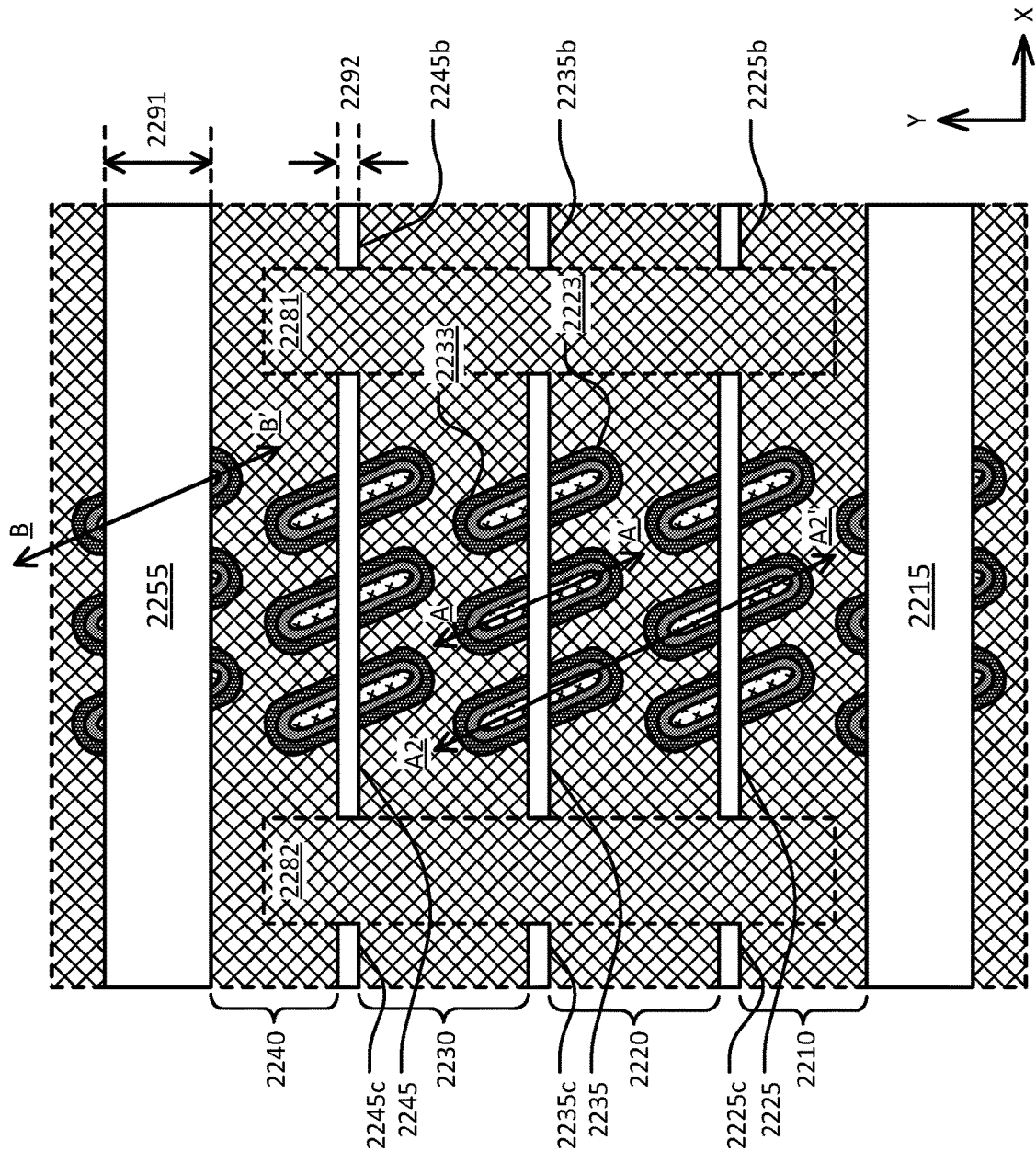
FIG. 22 illustrates a stage of the process flow after etching a plurality of slits across the elliptical vias in respective rows of elliptical vias.

FIG. 22 illustrates a stage of the process flow after etching a plurality of slits (2215, 2225, 2235, 2245, 2255) extending in the first direction (X-direction) across the elliptical vias (1141, 1142, 1143, 1151, 1152, 1153, FIG. 11) in respective rows (1110, 1120, FIG. 11) of elliptical vias. FIG. 22 illustrates a horizontal cross section taken at the upper conductive level of the stack of conductive layers. The plurality of slits includes a first slit (2215), a last slit (2255), and intermediate slits (2225, 2235, 2245) arranged between the first and last slits in a second direction orthogonal to the first direction. The first and last slits have a first width 2291, and the intermediate slits have a second width 2292, the first width being greater than the second width.

This etching stage results in forming a plurality of stacks of conductive strips (2210, 2220, 2230, 2240) and a plurality of hemi-cylindrical vertical channel structures (2223, 2233) extending through the conductive strips in the stacks. Each of the hemi-cylindrical vertical channel structures has a divided elliptical cross section with a major axis (250, FIG. 2) tilted relative to the first direction (X-direction).

This etching stage can include etching a second plurality of slits (2225*b*, 2235*b*, 2245*b*, FIG. 22A) spaced apart from the first-mentioned plurality of slits by a first region 2281 in the first direction, and a third plurality of slits (2225*c*, 2235*c*, 2245*c*, FIG. 22A) extending in the first direction spaced apart from the first-mentioned plurality of slits by a second region 2282 in the first direction.

The first and second regions are disposed opposite each other across the plurality of hemi-cylindrical vertical channel structures in the first direction and between the first and last slits (2215, 2255, FIG. 22) in a second direction orthogonal to the first direction.

The first-mentioned plurality of slits is separated from the second plurality of slits by the conductive layers in the stack of conductive layers in the first region. The first-mentioned plurality of slits is separated from the third plurality of slits by the conductive layers in the stack of conductive layers in the second region. At later stages of the process, landing areas can be formed on the intermediate conductive layers and the lower conductive layer in the stack of conductive layers in the first and second regions, and interlayer connectors can be formed on the landing areas.

FIG. 22A illustrates a vertical cross-section of FIG. 22 taken along the line A-A' across an intermediate isolation slit. Intermediate slits (e.g. 2235) in the plurality of slits extend through the top layer 1020 of silicon nitride, the upper conductive layer (SSL0, SSL1) and the intermediate conductive layers (WL0-WLn) in the stack of conductive layers.

The intermediate conductive layers have a first thickness 445 and the lower conductive layer (GSL) has a second thickness 425 greater than the first thickness. The intermediate slits (e.g. 2235) extend into the lower conductive layer (GSL) by a depth 435 less than the thickness 425 of the lower conductive layer (GSL).

This etching stage includes etching the conductive material (2050, FIG. 21A) over the top surface of the insulating material 290 in the elliptical vias in the rows to form first and second plugs (2051, 2052) over the top surface of the insulating material 290 in the elliptical vias in the rows. The first plugs 2051 are connected to first vertical semiconductor films 1731 in the elliptical vias in the rows on a first side of the slits. The second plugs 2052 are connected to second vertical semiconductor films 1732 in the elliptical vias in the rows on a second side of the slits opposite the first side of the slits.

FIG. 22B illustrates a vertical cross-section of FIG. 22 taken along the line B-B' across the last slit 2255. The first slit 2215 and the last slit 2255 extend through the horizontal semiconductor film 1733 on the bottom surfaces of the elliptical vias and stop on the reference conductor 1010.

FIG. 23 illustrates a stage of the process flow after forming a plurality of isolation blocks (2315, 2325, 2335, 2345, 2355) in the plurality of slits (2215, 2225, 2235, 2245, 2255, FIG. 22). FIG. 23 illustrates a horizontal cross section taken at the upper conductive level of the stack of conductive layers, showing string select lines (SSL0, SSL1, SSL2, SSL3). The plurality of isolation blocks extend in the first direction (X-direction) across the elliptical vias (1141, 1142, 1143, 1151, 1152, 1153, FIG. 11) in respective rows (1110, 1120, FIG. 11) of elliptical vias. The plurality of isolation blocks includes a first isolation block (2315), a last isolation block (2355), and intermediate isolation blocks (2325, 2335, 2345) arranged between the first and last isolation blocks in a second direction orthogonal to the first direction. The first and last isolation blocks have a first width 2291, and the intermediate isolation blocks have a second width 2292, the first width being greater than the second width.

A particular isolation block (e.g. 2335) in the intermediate isolation blocks in the plurality of isolation blocks separates a first stack of conductive strips (e.g. 2220) and a second stack of conductive strips (e.g. 2230) in the plurality of stacks of conductive strips. First hemi-cylindrical vertical channel structures (e.g. 2223) in the first stack of conductive strips are in contact with a first side (e.g. 2335a) of the particular isolation block. Second hemi-cylindrical vertical channel structures (e.g. 2233) in the second stack of conductive strips are in contact with a second side (e.g. 2335b) of the particular isolation block opposite the first side of the particular isolation block in the second direction.

FIG. 23A illustrates a vertical cross-section of FIG. 23 taken along the line A-A' across an intermediate isolation block 2335. Isolation blocks (e.g. 2335) in the plurality of isolation blocks extend through the top layer 1020 of silicon nitride, the upper conductive layer (SSL2, SSL1) and the intermediate conductive layers (WL0-WLn) in the stack of conductive layers.

The intermediate conductive layers have a first thickness 445 and the lower conductive layer (GSL) has a second thickness 425 greater than the first thickness. The intermediate isolation blocks (e.g. 2335) extend into the lower conductive layer (GSL) by a depth 435 less than the thickness 425 of the lower conductive layer (GSL).

FIG. 23B illustrates a vertical cross section of FIG. 23 taken along the line B-B' across the last isolation block 2355. The first isolation block 2315 and the last isolation block 2355 extend through the horizontal semiconductor film 1733 on the bottom surfaces of the elliptical vias and stop on the reference conductor 1010.

Figure 23C:
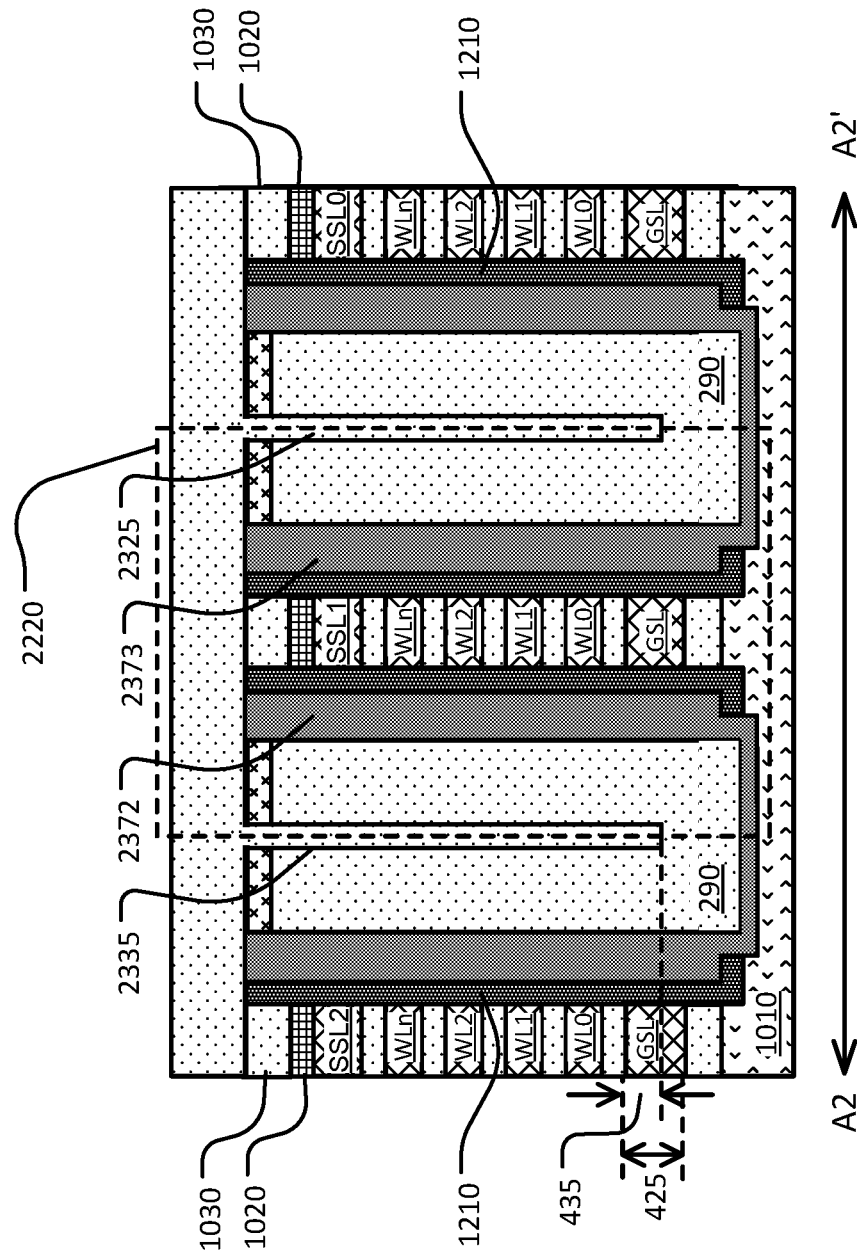
FIG. 23C illustrates a vertical cross-section of FIG. 23 taken along a line A2-A2' across two intermediate isolation blocks and a stack of conductive strips disposed between the two intermediate isolation blocks.

FIG. 23C illustrates a vertical cross-section of FIG. 23 taken along a line A2-A2' across two intermediate isolation blocks (2325, 2335) and a stack of conductive strips 2220 disposed between the two intermediate isolation blocks. The line A2-A2' is along the major axis of the hemi-cylindrical vertical channel structures on opposite sides of the stack of conductive strips 2220 in the second direction. The isolation blocks (2325, 2335) in the plurality of isolation blocks extend through the top layer 1020 of silicon nitride, the upper conductive layer (SSL0, SSL1, SSL2) and the intermediate conductive layers (WL0-WLn) in the stack of conductive layers. The intermediate isolation blocks extend into the lower conductive layer (GSL) by a depth 435 less than a thickness 425 of the lower conductive layer (GSL).

The string select line SSL1 is in the upper conductive layer of the stack of conductive strips 2220. The hemi-cylindrical vertical channel structures disposed on opposite sides of the stack of conductive strips 2220 include semiconductor films (2372, 2373) extending through the string select line SSL1 in the upper conductive layer, the intermediate conductive layers (WL0, WL1, WL2, WLn, SSL1), and the lower conductive layer (GSL).

Figure 24:
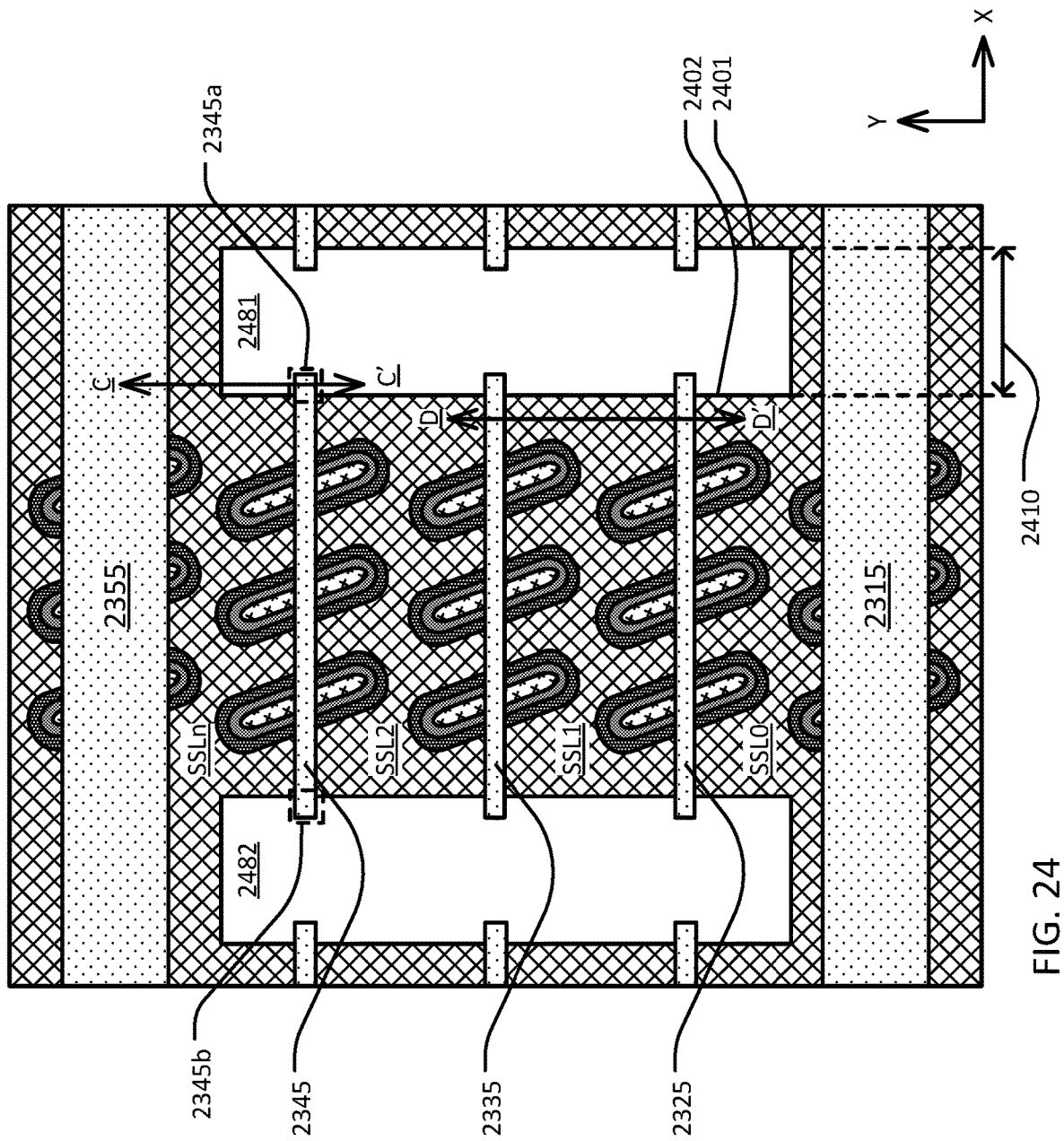
FIG. 24 illustrates a stage of the process flow after etching the upper conductive layer to form first and second openings.

FIG. 24 illustrates a stage of the process flow after etching the upper conductive layer (SSL0, SSL1, SSL2, SSL3, FIGS. 24, 24A and 24B) to form first and second openings (2481, 2482). The first and second openings (2481, 2482) can be in the first and second regions (2281, 2282, FIG. 22), so that the first and second openings are disposed opposite each other across the plurality of hemi-cylindrical vertical channel structures in the first direction (X-direction) and between the first and last isolation blocks (2315, 2355) in the second direction. The first opening 2481 can define right sides of conductive strips at the upper level of conductive strips (SSL0/1/2/3) in the stacks of conductive strips. The second opening 2482 can define left sides of conductive strips at the upper level of conductive strips (SSL0/1/2/3) in the stacks of conductive strips. The first and second openings have a first width 2410 between a first side 2401 and a second side 2402 in the first direction.

The intermediate isolation blocks (e.g. 2345) have first ends and second ends (2345a, 2345b) opposite the first ends across the plurality of hemi-cylindrical vertical channel structures in the first direction, and the first and second openings overlap the first ends and second ends of the intermediate isolation blocks. This etching step includes removing the first and second ends of the intermediate isolation blocks in the first and second openings, so that at later stages of the process when the first and second openings are filled with insulating material, conductive strips at the upper conductive layer in the stack of conductive layers that act as string select lines can be completely isolated from each other by the intermediate isolation blocks and the insulating material in the first and second openings.

Figures 24A, 24B:
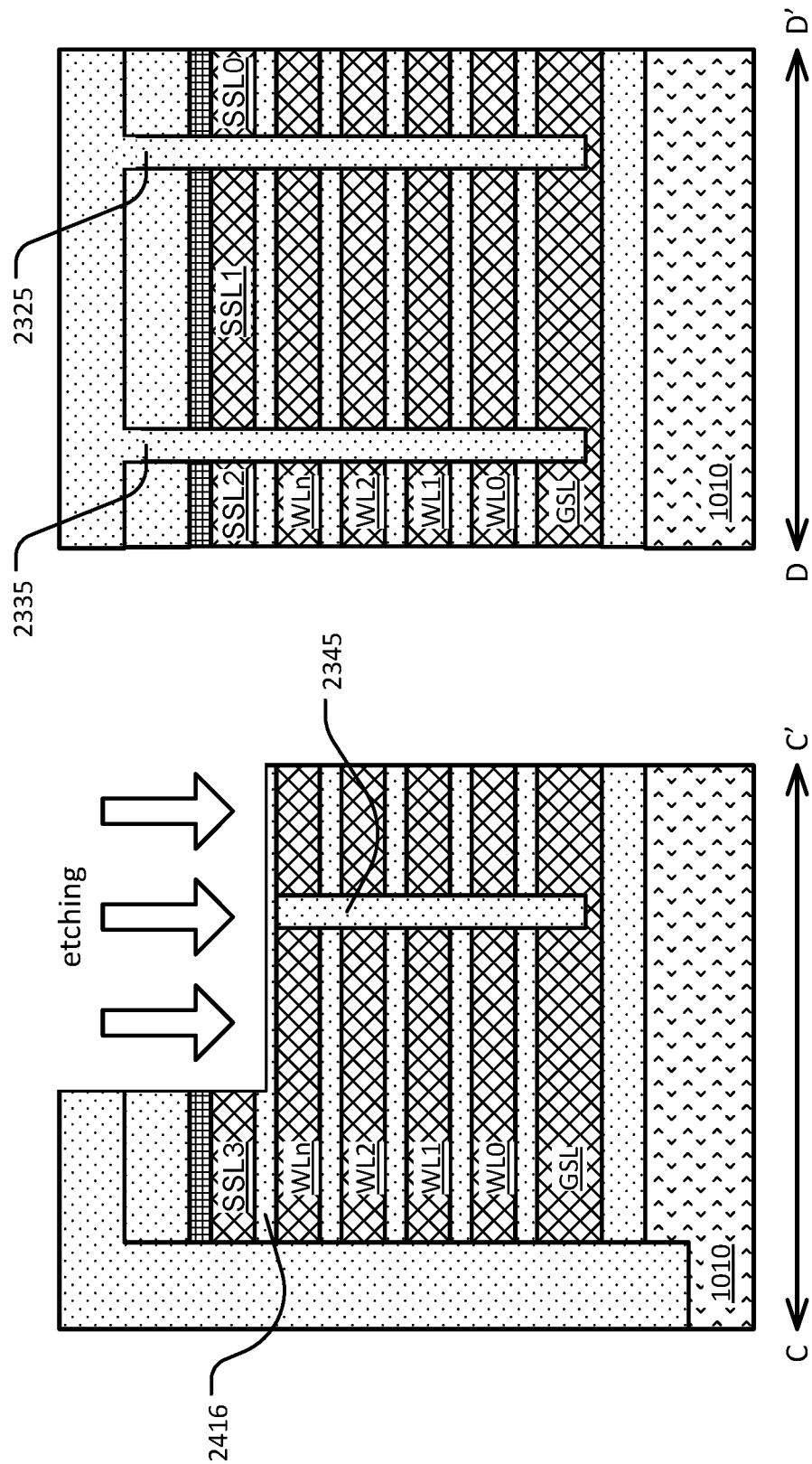
FIG. 24A is a vertical cross section of FIG. 24 taken at a line C-C' across an end of an intermediate isolation block in the first opening.
FIG. 24B is a vertical cross section of FIG. 24 taken at a line D-D' across intermediate isolation blocks in the second direction and between the plurality of hemi-cylindrical vertical channel structures and the first opening in the first direction.

FIG. 24A is a vertical cross section of FIG. 24 taken at a line C-C' across an end of an intermediate isolation block in the first opening 2481. FIG. 24A illustrates that the etching step stops at an insulating layer (2416, FIG. 24A) above a top conductive layer (WLn, FIG. 24A) in the intermediate conductive layers.

FIG. 24B is a vertical cross section of FIG. 24 taken at a line D-D' across intermediate isolation blocks (2325, 2335) in the second direction and between the plurality of hemi-cylindrical vertical channel structures and the first opening 2481 in the first direction. FIG. 24B illustrates intermediate isolation blocks (2325, 2335) extending through the upper conductive strips (SSL0, SSL1, SSL2), the intermediate conductive strips (WL0, WL1, WL2, WLn), and stopping in the lower conductive strip (GSL).

Figure 25:
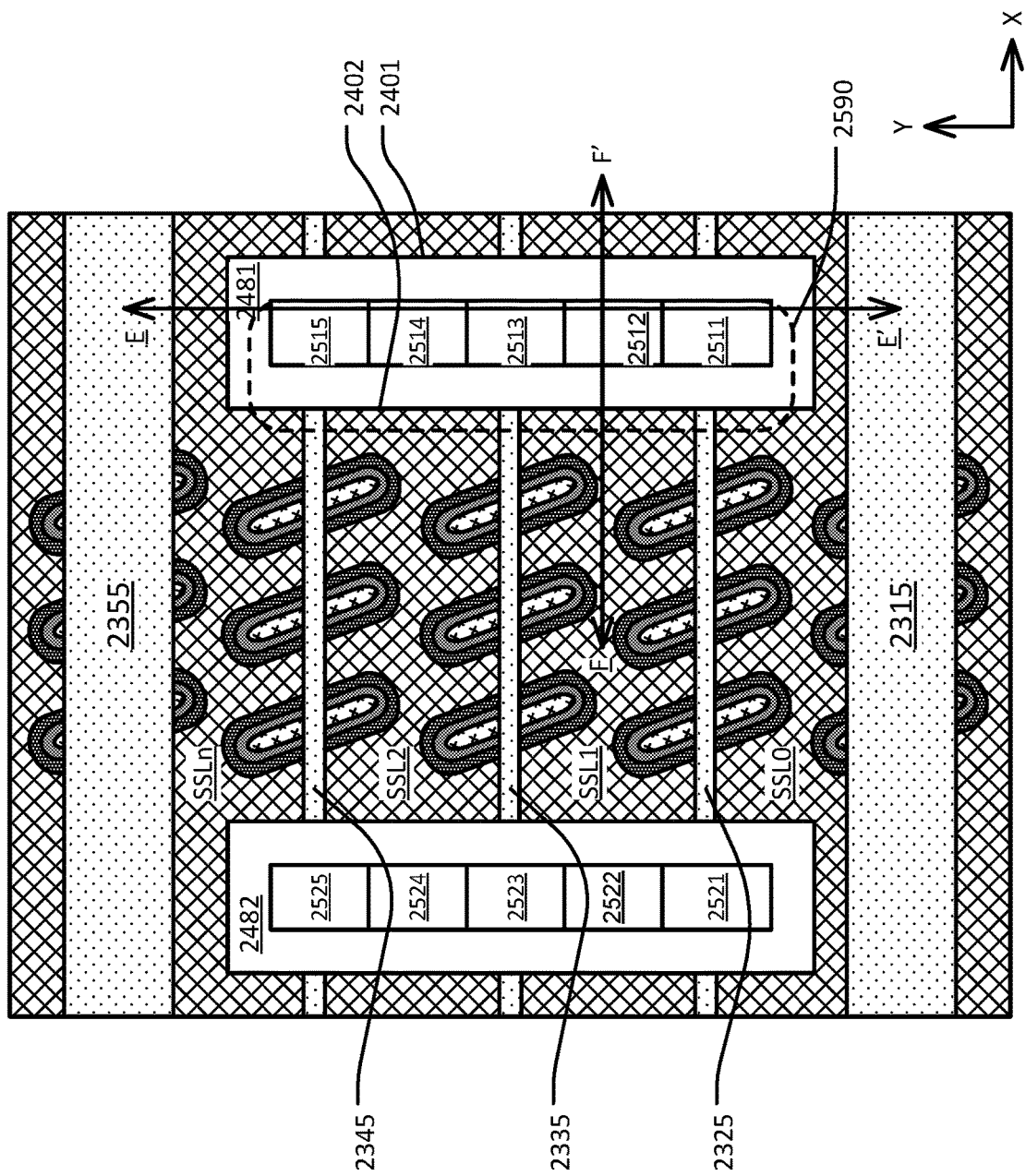
FIG. 25 illustrates a stage of the process flow after etching the intermediate conductive layers to form landing areas in the first and second openings.

FIG. 25 illustrates a stage of the process flow after etching the intermediate conductive layers to form landing areas (2511-2515, 2521-2525) on respective intermediate conductive layers (WL0-WLn, FIG. 26) and the lower conductive layer (GSL, FIG. 26) in the stack of conductive layers in the first and second openings (2481, 2482, FIG. 25). The first and second openings are disposed opposite each other across the plurality of hemi-cylindrical vertical channel structures in the first direction and between the first and last isolation blocks in the second direction. The first opening 2481 is adjacent right sides of conductive strips at the upper level of conductive strips (SSL0/1/2/3) in the stacks of conductive strips. The second opening 2482 is adjacent left sides of conductive strips at the upper level of conductive strips (SSL0/1/2/3) in the stacks of conductive strips.

Figure 26:
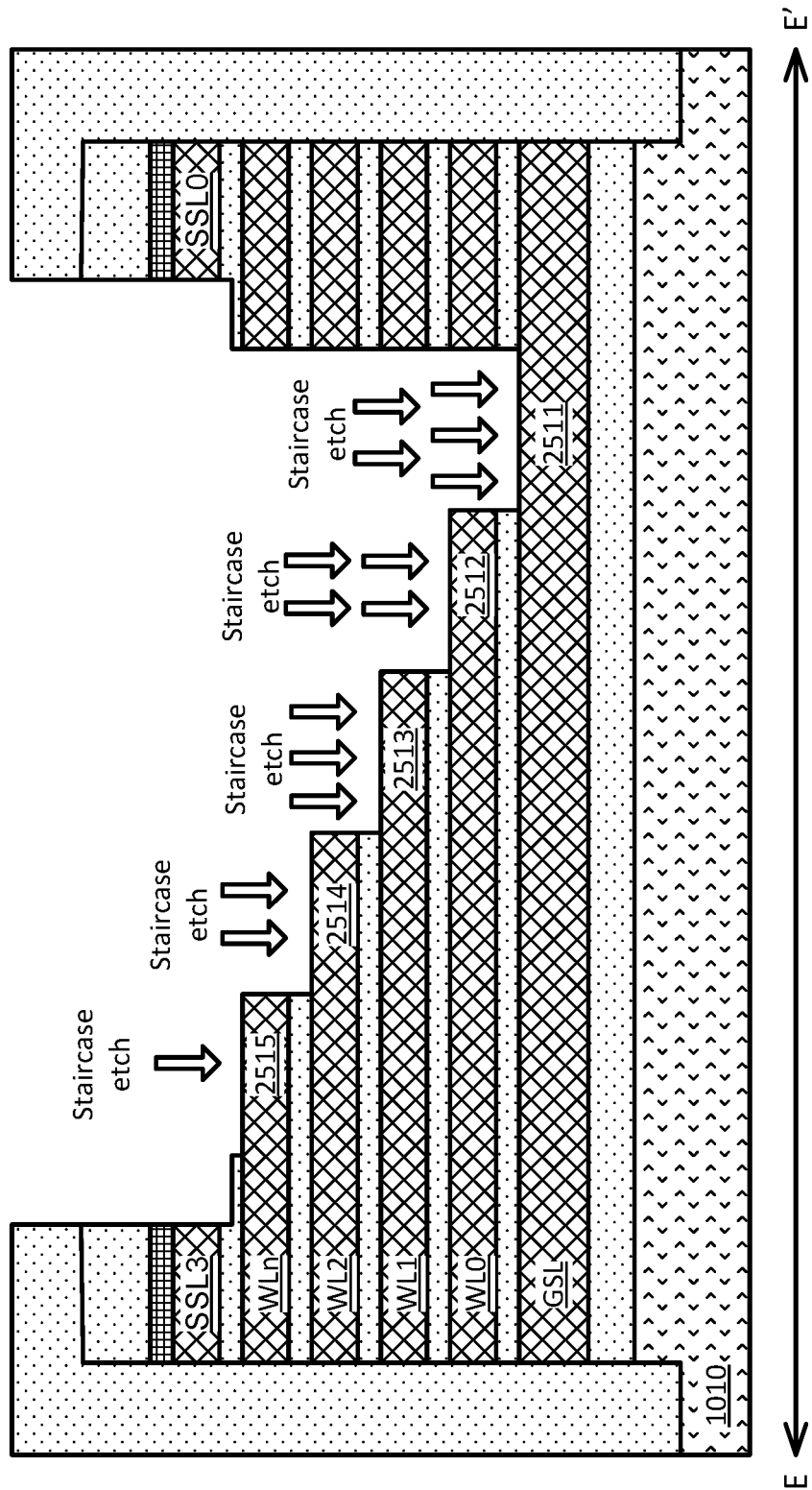
FIG. 26 is a vertical cross section of FIG. 25 taken along the line E-E' in the second direction across the landing areas in the first opening.

FIG. 26 is a vertical cross section of FIG. 25 taken along the line E-E' in the second direction across the landing areas (2511-2515) in the first opening 2481. As shown in FIG. 26, landing areas (2512-2515) are formed on respective intermediate conductive layers (WL0-WLn), and a landing area 2511 is formed on the lower conductive layer (GSL) in the first opening (2481, FIG. 25). Similarly, landing areas (2522-2525) are formed on respective intermediate conductive layers (WL0-WLn) and a landing area 2521 is formed on the lower conductive layer (GSL) in the second opening (2482, FIG. 25).

To form the staircase structure including the landing areas, multiple etch steps can be taken, as indicated by the number of arrows in FIG. 26. For instance, a first etch step can stop on a top conductive layer (Wln) over an area for all landing areas (2511-2515) in the first opening. A second etch step can stop on a conductive layer one layer below the top conductive layer (Wln) over an area for landing areas (2511-2514) in the first opening except the upper landing area, and a third etch step can stop on a conductive layer two layers below the top conductive layer (Wln) over an area for landing areas (2511-2513) in the first opening except the upper two landing areas. More etch steps can be applied until the landing area is formed on the lower conductive layer (GSL).

Figure 27:
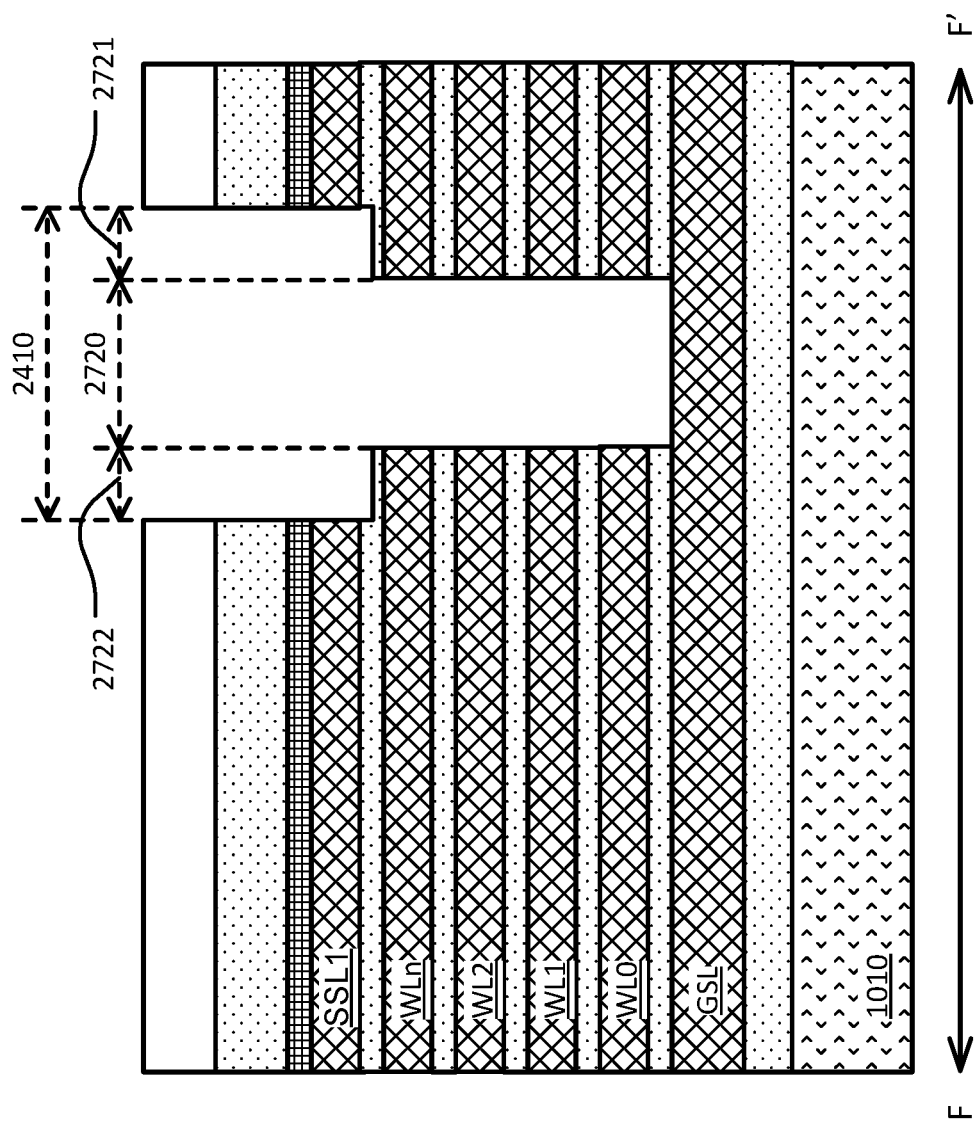
FIG. 27 is a vertical cross section of FIG. 25 taken along the line F-F' across the first opening in the first direction.

FIG. 27 is a vertical cross section of FIG. 25 taken along the line F-F' across the first opening in the first direction. FIG. 27 illustrates the first opening have a first width 2410 in the first direction, and the landing areas have a second width (2720) in the first direction narrower than the first width 2410. The landing areas are disposed within the first opening with a first margin 2721 on a first side and a second margin 2722 on a second side opposite the first side in the first direction.

Figure 28:
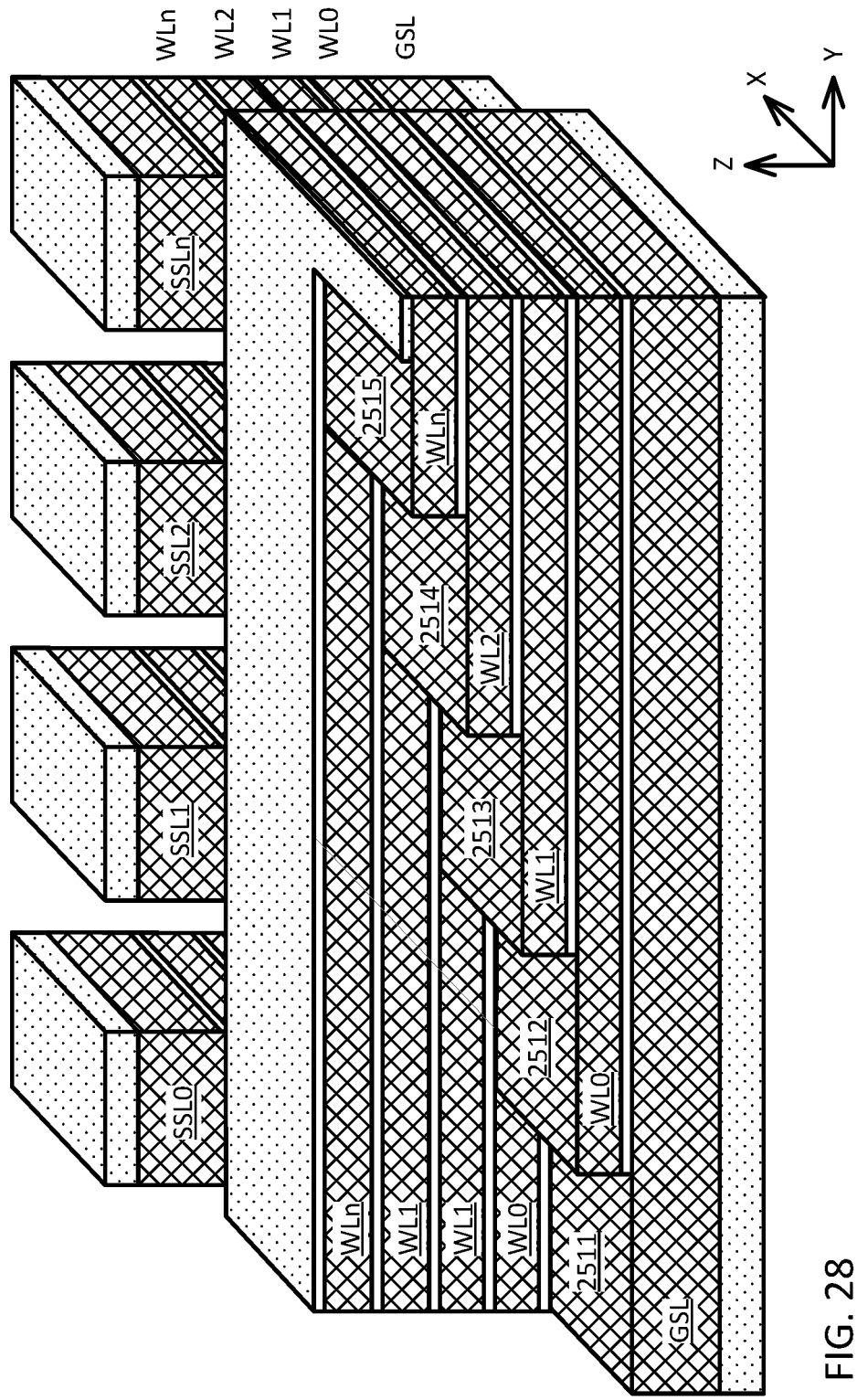
FIG. 28 is a perspective view of the landing areas and the string select lines adjacent the landing areas in FIG. 25.

FIG. 28 is a perspective view of the landing areas and the string select lines adjacent the landing areas in FIG. 25. The landing areas (e.g. 2511-2515) and the string select lines adjacent the landing areas are disposed in a region 2590 as shown in FIG. 25. FIG. 28 illustrates that each of the string select lines (SSL0, SSL1, SSL2, SSLn) in the upper conductive layer in the stack of conductive layers is separated from other string select lines in the upper conductive layer. Each of the intermediate conductive layers (WL0, WL1, WL2, WLn) in the stack of conductive layers can include conductive strips acting as word lines underlying respective string select lines. The lower conductive layer (GSL) can act as a ground select line underlying each of the string select lines.

Figure 29:
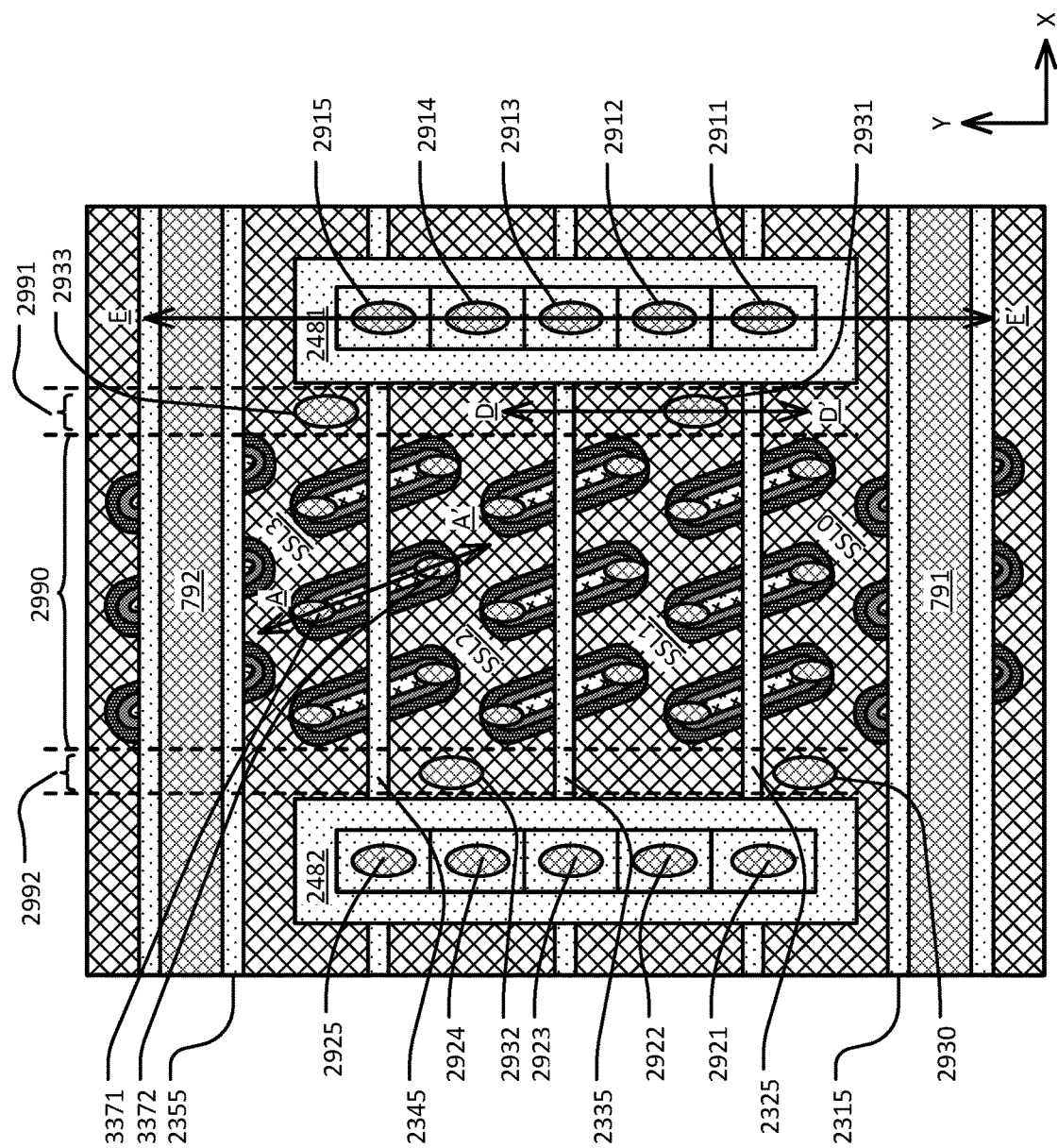
FIG. 29 illustrates a stage of the process flow after forming interlayer connectors on the landing areas, first and second vertical source contact plates connected to the reference conductor, and string select line connectors connected to respective string select lines.

FIG. 29 illustrates a stage of the process flow after forming interlayer connectors (2911-2915, 2921-2925) on the landing areas (2511-2515, 2521-2525, FIG. 25), first and second vertical source contact plates (791, 792) connected to the reference conductor (1010, FIG. 26), string select line connectors (2930, 2931, 2932, 2933) connected to respective string select lines (SSL0, SSL1, SSL2, SSL3), and first and second contacts (3371, 3372) connected to first and second plugs (2051, 2052, FIG. 33B), respectively, over the top surface of the insulating material (290, FIG. 33B) in the elliptical vias.

The conductive strips at the upper level of conductive strips in the stacks of conductive strips (SSL0, SSL1, SSL2, SSL3) have an array region (2990) through which the hemi-cylindrical vertical channel structures extend, and first and second string select line connector regions (2991, 2992) opposite each other across the array region in the first direction. The string select line connectors (2930, 2931, 2932, 2933) are connected to respective string select lines (SSL0, SSL1, SSL2, SSL3) in the first and second string select line connector regions (2991, 2992).

Figure 30:
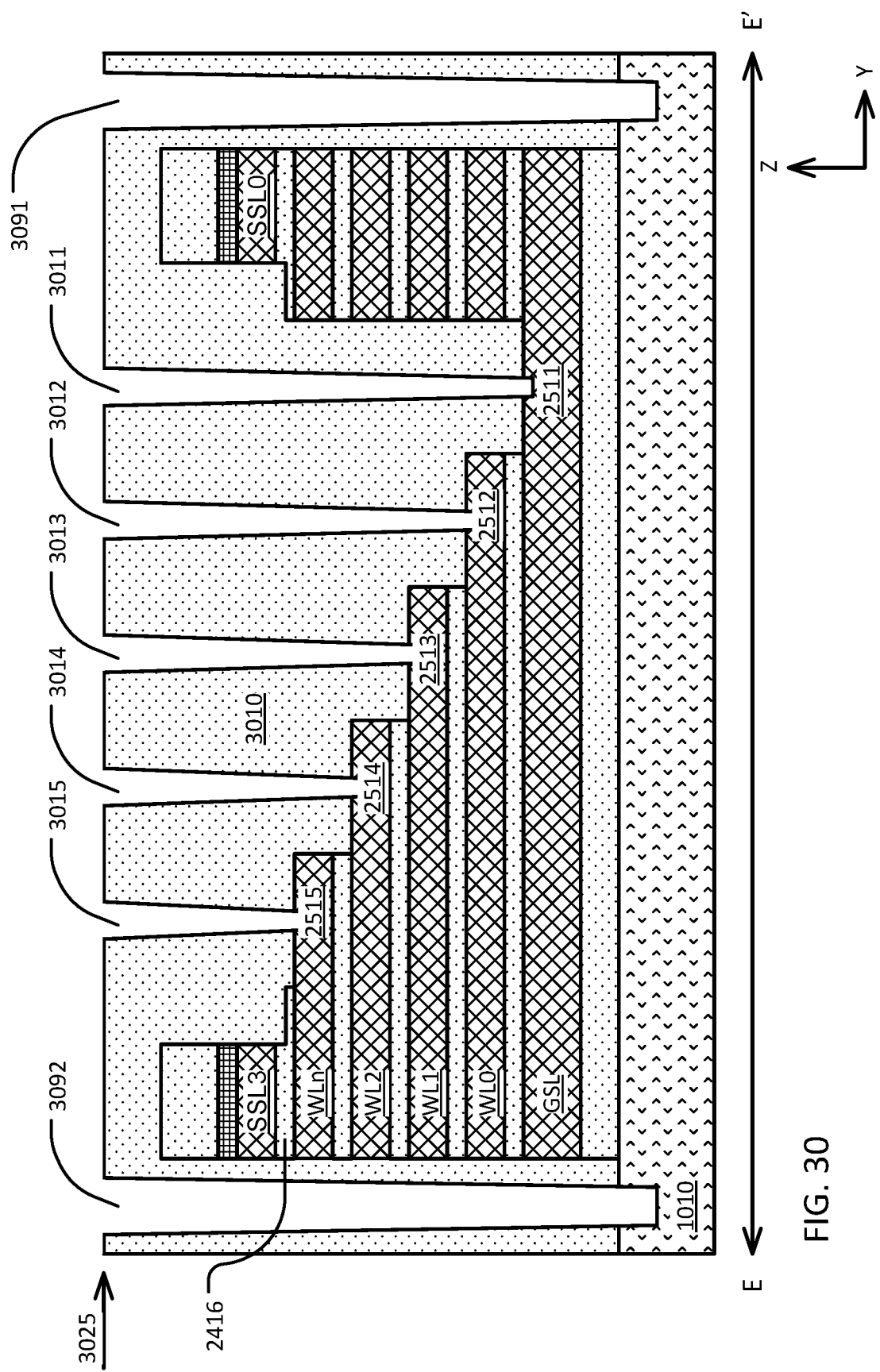
FIGS. 30 and 31 further illustrate forming the interlayer connectors on the landing areas and the first and second vertical source contact plates connected to the reference conductor.
Figure 31:
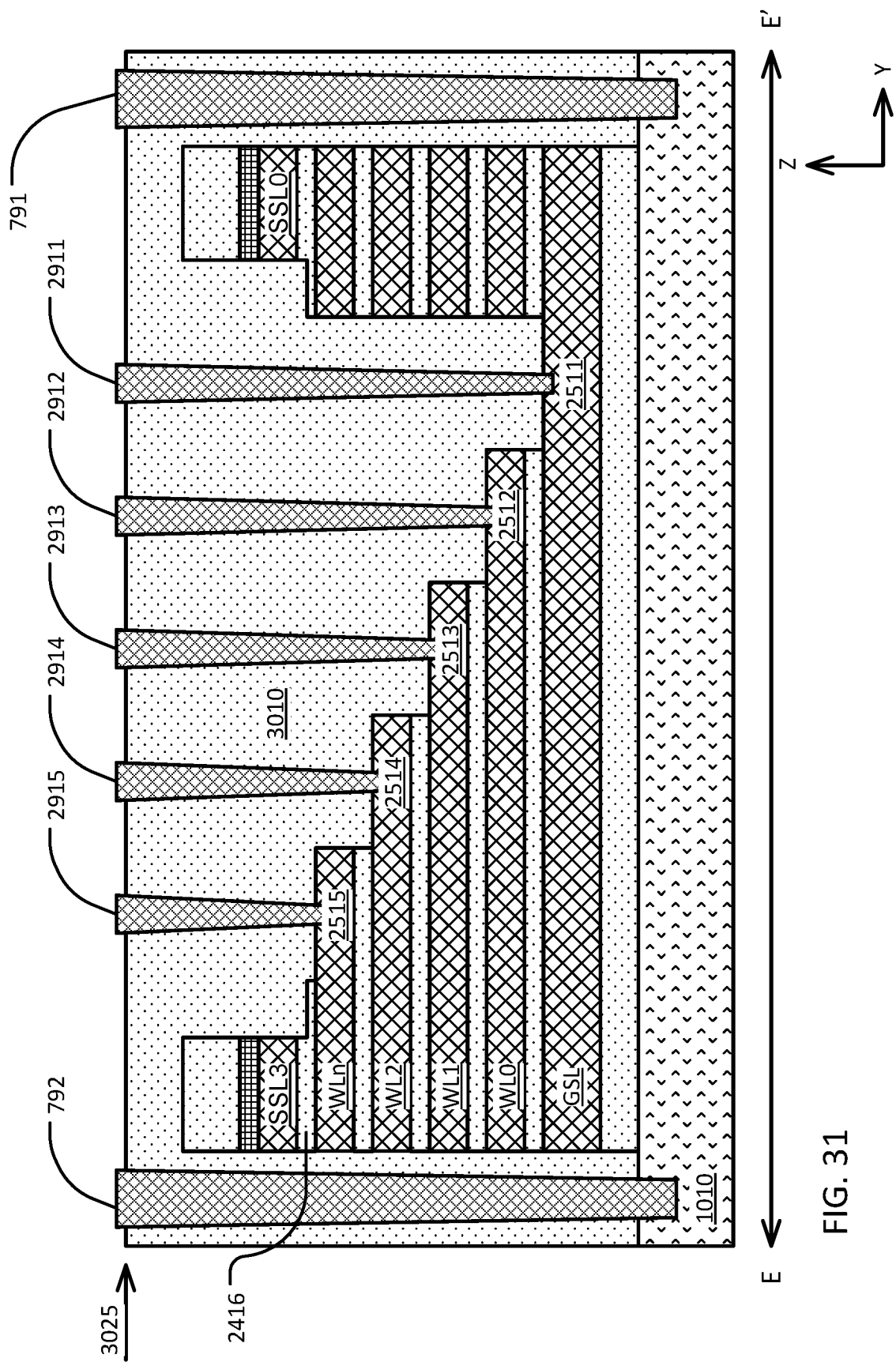

Forming interlayer connectors (2911-2915) on the landing areas is further described in reference to FIGS. 30 and 31. Forming first and second vertical source contact plates (791, 792) connected to the reference conductor is further described in reference to FIGS. 30 and 31. Forming string select line connectors (2930-2933) connected to respective string select lines is further described in reference to FIGS. 32A and 32B. Forming first and second contacts (3371, 3372) connected to first and second plugs is further described in reference to FIGS. 33A and 33B.

FIGS. 30 and 31 illustrate a stage of the process flow after forming interlayer connectors (2911-2915, FIG. 31) on the landing areas (2511-2515), the interlayer connectors extending from a connector surface (3025) above the stack of conductive layers to the landing areas. FIGS. 30 and 31 illustrate a vertical cross section taken along a line E-E' as shown in FIG. 29.

This stage can include depositing a layer of insulating material (3010, FIG. 30) over the stack of conductive layers including the landing areas on respective intermediate conductive layers (WL0-WLn) and on the lower conductive layer (GSL), etching contact holes (3011-3015, FIG. 30) through the insulating material 3010, stopping on the landing areas, and forming interlayer connectors (2911-2915, FIG. 31) in the contact holes on the landing areas.

At this stage, the conductive strips at the upper level (SSL0/1/2/3) of conductive strips in the stacks of conductive strips are separated from each other by the isolation blocks (2315-2355) and insulating material in the first and second openings (2481, 2482). The insulating material (3010, FIG. 31) extends through the upper level of conductive strips (e.g. SSL3) to an insulating layer (2416) above a top conductive layer (WLn) in the intermediate conductive layers.

FIGS. 30 and 31 also illustrate forming a first vertical source contact plate (791, FIG. 31) and a second vertical source contact plate (792, FIG. 31) connected to the reference conductor 1010. This stage can include etching the first and last isolation blocks (2315, 2355, FIG. 25) to form first and second source contact holes (3091, 3092, FIG. 30), respectively, stopping on the reference conductor (1010, FIG. 30), and forming a first vertical source contact plate (791, FIG. 31) and a second vertical source contact plate (792, FIG. 31) in the first and second source contact holes connected to the reference conductor 1010, the first and second vertical source contact plates extending in the first direction (X-direction).

FIGS. 32A and 32B illustrate forming string select line connectors (2931, FIG. 32B) connected to respective string select lines (SSL1). FIGS. 32A and 32B are vertical cross sections taken along a line D-D' as shown in FIG. 29. As shown in FIG. 29, the conductive strips at the upper level of conductive strips in the stacks of conductive strips (SSL0, SSL1, SSL2, SSL3) have an array region (2990) through which the hemi-cylindrical vertical channel structures extend, and first and second string select line connector regions (2991, 2992) opposite each other across the array region in the first direction.

This stage can include etching contact holes (3231, FIG. 32A) through the layer of insulating material 3010, stopping on the string select lines (e.g. SSL1, FIG. 32A) in the upper conductive layer in the stacks of conductive strips, and forming string select line connectors (2931, FIG. 32B) in the contact holes on the string select lines.

Figures 33A, 33B:
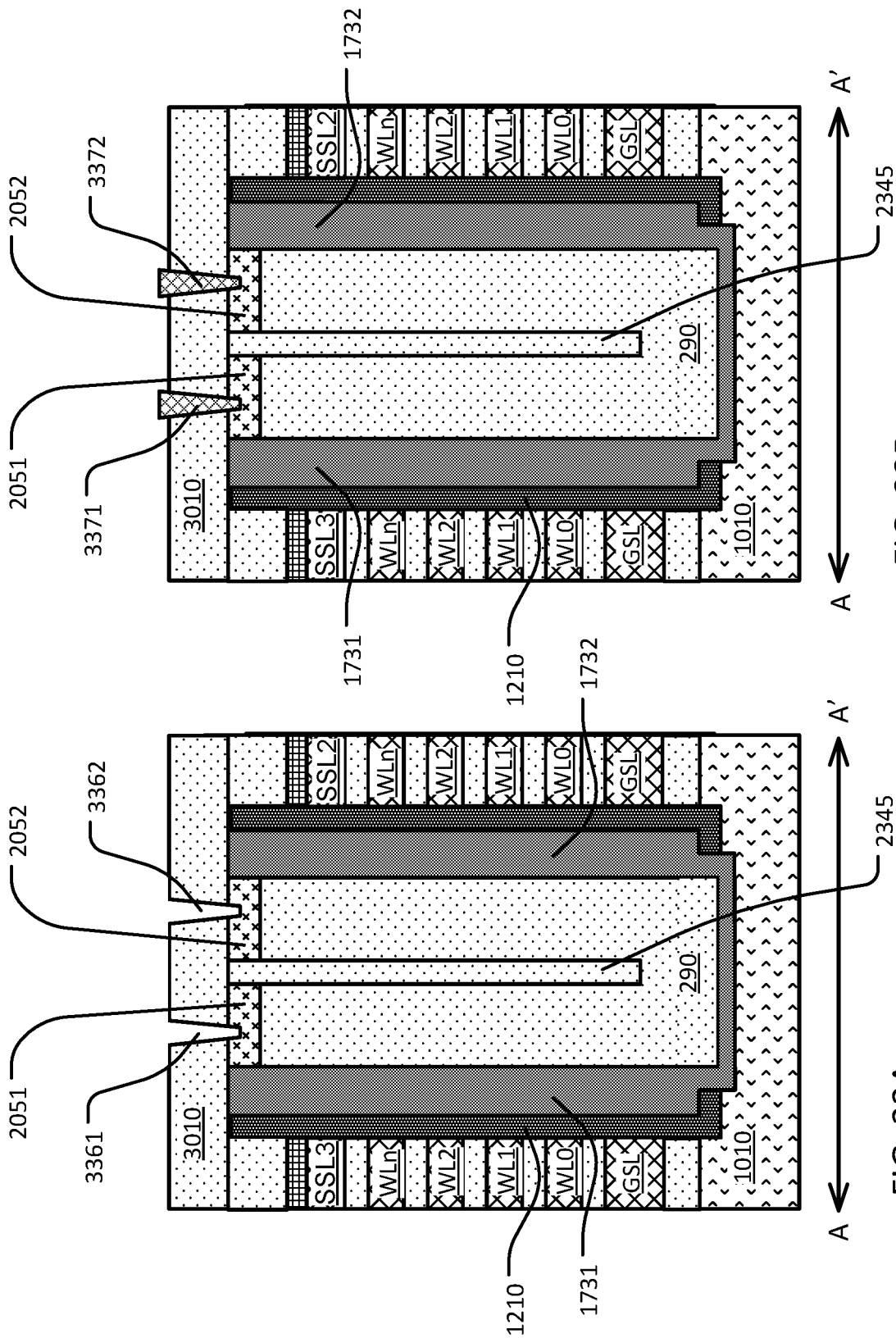
FIGS. 33A and 33B illustrate a stage of the process flow after forming first and second contacts connected to first and second plugs.

FIGS. 33A and 33B illustrate a stage of the process flow after forming first and second contacts (3371, 3372, FIG. 33B) connected to first and second plugs (2051, 2052), respectively, over the top surface of the insulating material 290 in the elliptical vias. FIGS. 33A and 33B are vertical cross sections taken along a line A-A' as shown in FIG. 29 across an isolation block 2345 and the hemi-cylindrical vertical channel structures in contact with the isolation block. This stage can include etching contact holes (3361, 3362) through the layer of insulating material 3010, stopping on the first and second plugs (2051, 2052) connected to the hemi-cylindrical vertical channel structures, and forming first and second contacts (3371, 3372, FIG. 33B) in the contact holes on the first and second plugs, respectively.

Figure 34:
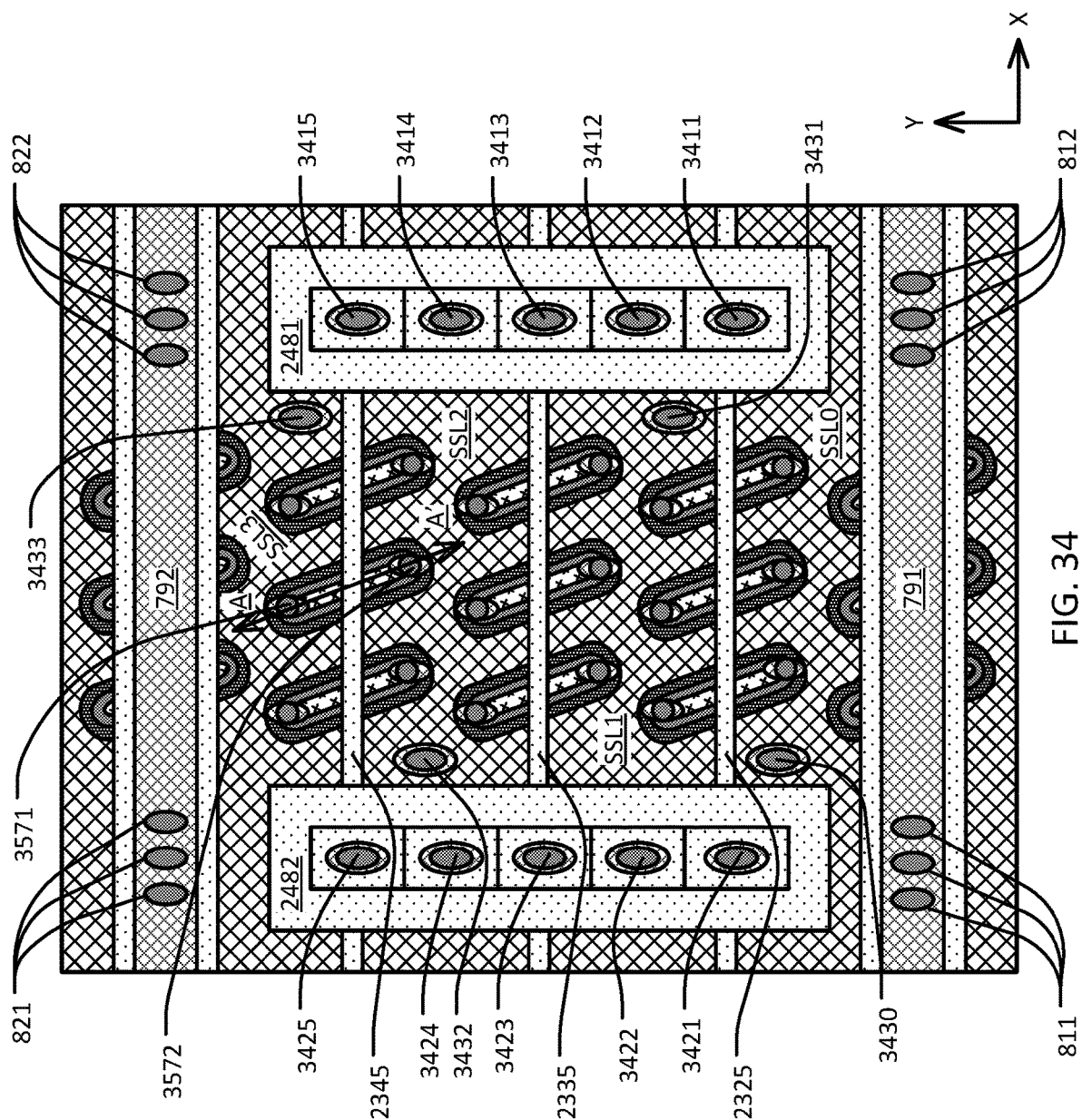
FIG. 34 illustrates a stage of the process flow after forming first and second vias connected to first and second contacts, and vias connected to other elements in the memory device.

FIG. 34 illustrates a stage of the process flow after forming vias (3411-3415, 3421-3425) connected to interlayer connectors (2911-2915, 2921-2925, FIG. 29) on the landing areas (2511-2515, 2521-2525, FIG. 25), vias (811, 812, 821, 822) connected to first and second vertical source contact plates (791, 792, FIG. 29) connected to the reference conductor (1010, FIG. 26), vias (3430, 3431, 3432, 3433) connected to string select line connectors (2930, 2931, 2932, 2933, FIG. 29) connected to respective string select lines (SSL0, SSL1, SSL2, SSL3), and first and second vias (3571, 3572) connected to first and second contacts (3371, 3372, FIG. 29) connected to first and second plugs (2051, 2052, FIG. 33B), respectively, over the top surface of the insulating material (290, FIG. 33B) in the elliptical vias.

Figure 35:
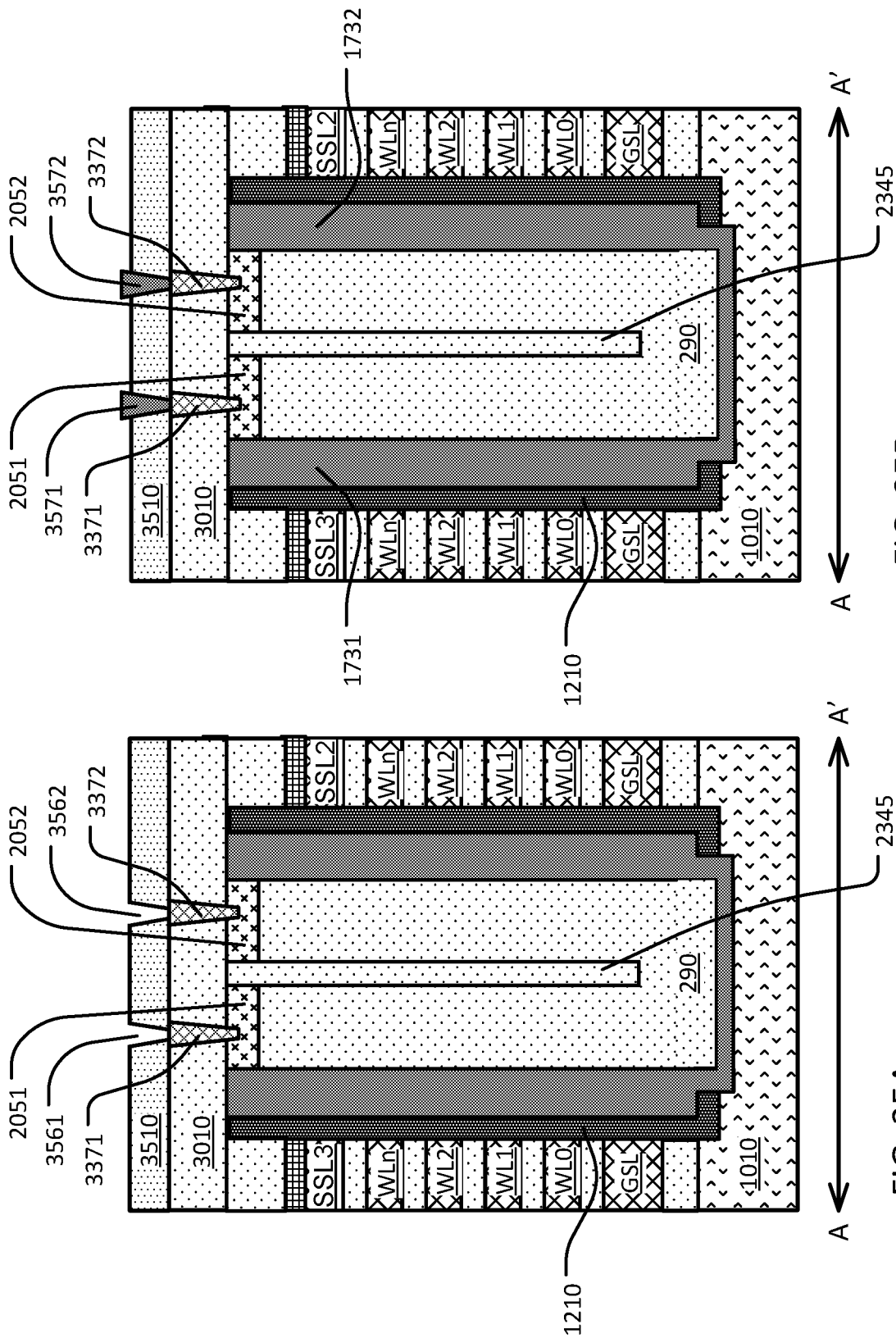
FIGS. 35A and 35B further illustrate forming first and second vias connected to the first and second contacts.

FIGS. 35A and 35B illustrate forming first and second vias (3571, 3572, FIG. 35B) connected to the first and second contacts (3371, 3372), respectively. FIGS. 35A and 35B are vertical cross sections taken along a line A-A' as shown in FIG. 34 across an isolation block 2345 and the hemi-cylindrical vertical channel structures in contact with the isolation block.

This stage can include depositing a second layer of insulating material 3510 over the first layer of insulating material (3010) and the first and second contacts (3371, 3372), etching via holes (3561, 3562, FIG. 35A) through the second layer of insulating material 3510, stopping on the first and second contacts (3371, 3372), and depositing a conductive material such as tungsten in the via holes (3561, 3562, FIG. 35A) to form the first and second vias (3571, 3572) on the first and second contacts (3371, 3372), respectively.

FIG. 36 illustrates a stage of the process flow after forming a first set of bit lines and a second set of bit lines connected to the hemi-cylindrical vertical channel structures extending through the stacks of conductive strips. A plurality of stacks of conductive strips includes odd stacks (3600, 3620) alternating with even stacks (3610, 3630) in the second direction. Each stack in the plurality of stacks of conductive strips (3600, 3610, 3620, 3630) has a first side (3601, 3611, 3621, 3631) and a second side (3602, 3612, 3622, 3632) opposite the first side in the second direction. A first odd stack of conductive strips 3620 is disposed on a first side 3611 of an even stack of conductive strips 3610, and a second odd stack of conductive strips 3600 is disposed on a second side 3612 of the even stack opposite the first side 3611 in the second direction. Upper conductive strips in the stacks of conductive strips (3600, 3610, 3620, 3630) act as string select lines (SSL0, SSL1, SSL2, SSL3).

A first set of bit lines (3641-3643) is formed, the bit lines in the first set being connected to the hemi-cylindrical vertical channel structures on a second side 3622 of the first odd stack 3620 adjacent the first side 3611 of the even stack 3610 and connected to the hemi-cylindrical vertical channel structures on the second side 3612 of the even stack 3610.

A second set of bit lines (3651-3653) is formed, the bit lines in the second set being connected to the hemi-cylindrical vertical channel structures on a first side 3601 of the second odd stack 3600 adjacent the second side 3612 of the even stack 3610 and connected to the hemi-cylindrical vertical channel structures on the first side 3611 of the even stack 3610.

The bit lines in the first set of bit lines (3641-3643) alternate with the bit lines in the second set of bit lines (3651-3653) in the first direction.

String select line routings (3660, 3661, 3662, 3663) are connected to respective vias (3430, 3431, 3432, 3433, FIG. 34) which are connected to respective string select lines connectors (2930, 2931, 2932, 2933, FIG. 29) which are connected to respective string select lines (SSL0, SSL1, SSL2, SSL3). The string select line routings can connect respective string select lines (SSL0, SSL1, SSL2, SSL3) to connectors in a patterned conductor layer, such as a metal layer, overlying the plurality of stacks of conductive strips.

First source contact routings (3671, 3672) are connected to first vias (811, 812, FIG. 34) disposed on the top surface of the first vertical source contact plate 791. Second source contact routings (3673, 3674) are connected to second vias (821, 822, FIG. 34) disposed on the top surface of the second vertical source contact plate 792. The first and second source contact routings can connect the first and second vertical source contact plates (791, 792) and the reference conductor (1010, FIGS. 7 and 8) to connectors in a patterned conductor layer, such as a metal layer, overlying the plurality of stacks of conductive strips.

Interlayer connector routings (3681, 3682, 3683, 3684, 3685) are connected to respective vias (3411-3415, FIG. 34) which are connected to respective interlayer connectors (2911-2915, FIG. 29). The interlayer connector routings can connect the interlayer connectors to connectors in a patterned conductor layer, such as a metal layer, overlying the plurality of stacks of conductive strips.

The string select line routings, the first and second source contact routings, and the interlayer connector routings can connect to connectors in the same overlying patterned conductor layer, or respective overlying patterned conductor layers.

Figure 37:
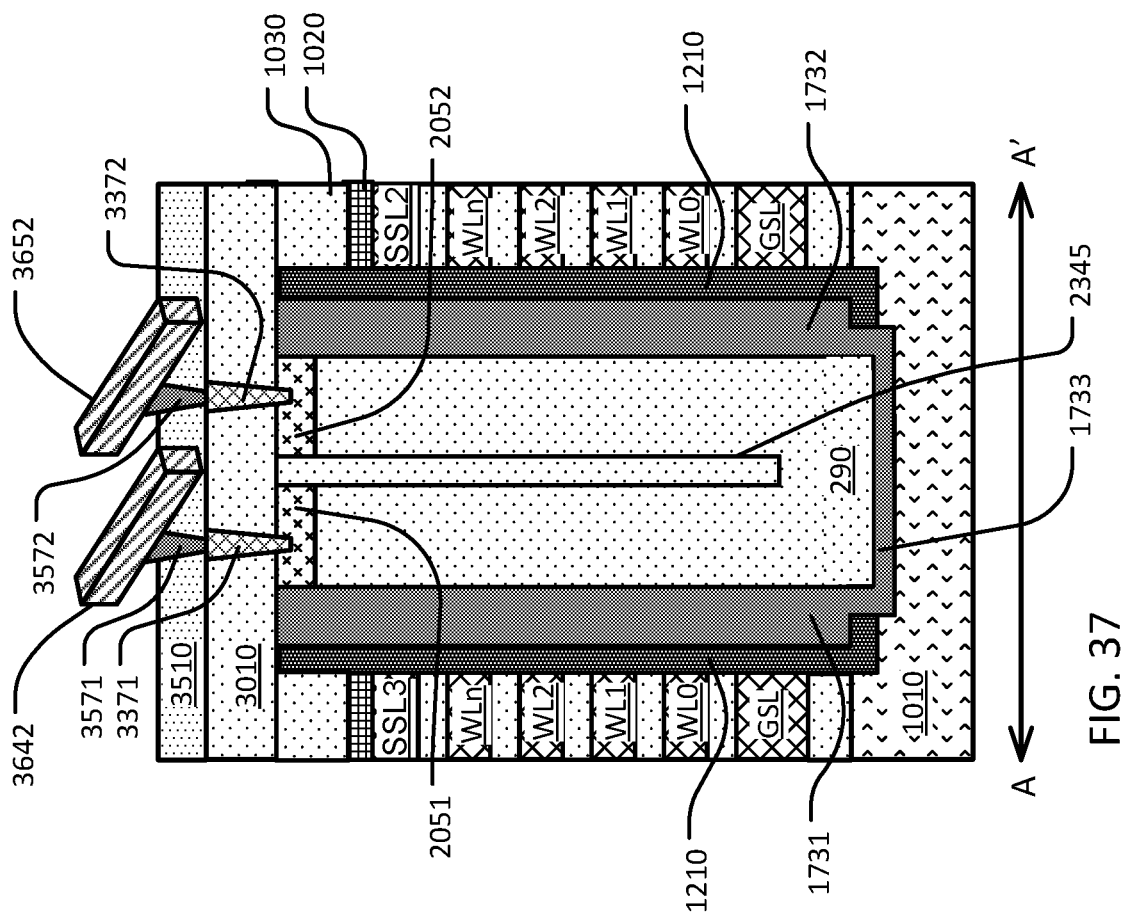
FIG. 37 illustrates first and second bit lines connected to the first and second vias, respectively.

FIG. 37 illustrates first and second bit lines (3642, 3652) connected to the first and second vias (3571, 3572), respectively. FIG. 37 is a vertical cross section of FIG. 36 taken along a line A-A' across an isolation block 2345 and the hemi-cylindrical vertical channel structures in contact with the isolation block.

Figure 38:
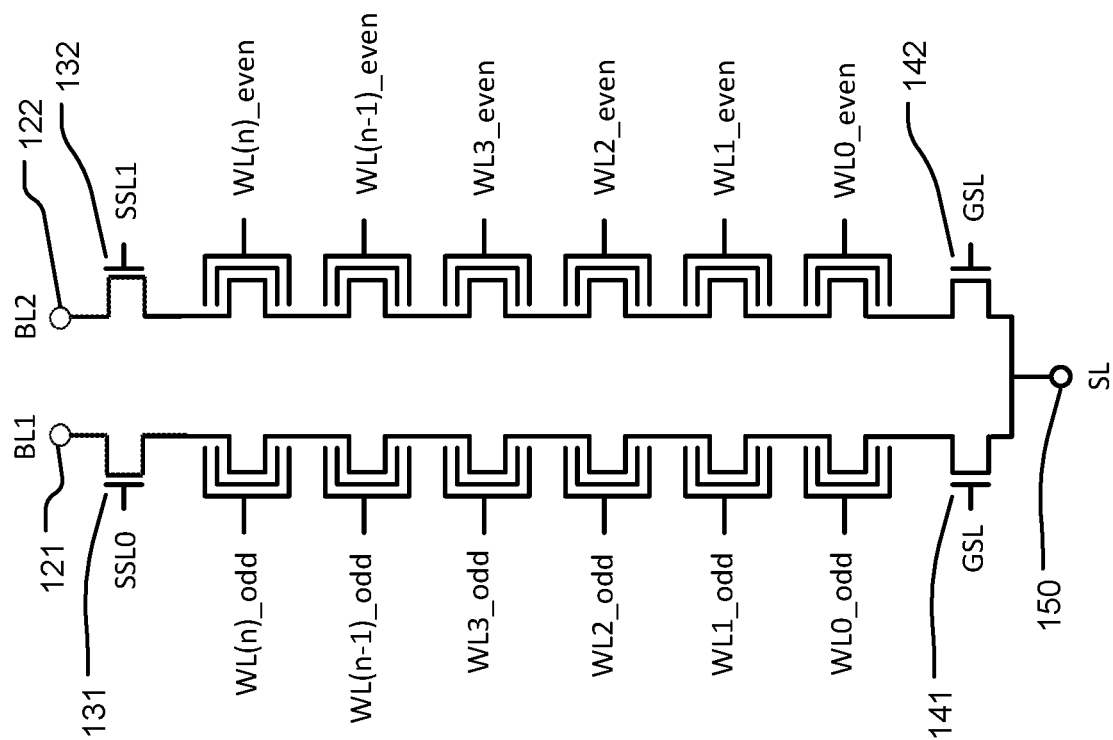
FIG. 38 illustrates a circuit schematic for a 3D NAND array having a first NAND string and a second NAND string on a common bottom reference conductor with an alternative word line arrangement.

FIG. 38 illustrates a circuit schematic for a 3D NAND array having a first NAND string and a second NAND string on a common bottom reference conductor with an alternative word line arrangement. Description about the circuit schematic shown in FIG. 1 is generally applicable to FIG. 38.

A difference in FIG. 38 from FIG. 1 is that word lines connected to the first NAND string of memory cells are separated from word lines connected to the second NAND string of memory cells. In the intermediate levels in the stacks of memory cells, the word lines in the first NAND string include word lines WL0_odd, WL1_odd, to WL(n−1)_odd and WL(n)_odd, where the index 0 to n represents the relative physical level in the stack of the word lines. The word lines in the second NAND string include word lines WL0_even, WL1_even, to WL(n−1)_even and WL(n)_even. The word lines in the first and second NAND strings act as tri-gates or finFET-like double-gates for the memory cells in the first and second string NAND strings.

Figure 39:
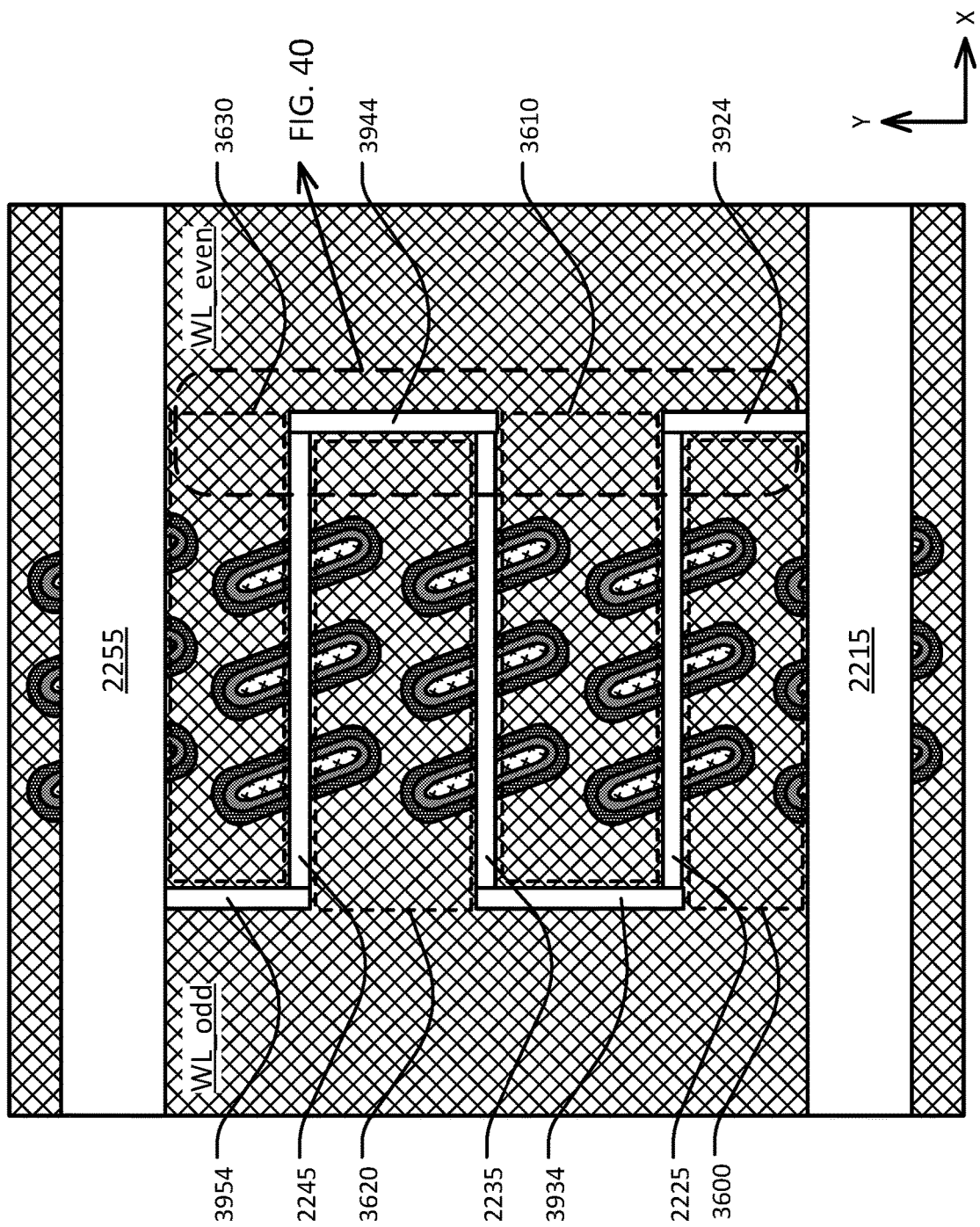
FIGS. 39 and 40 illustrate a stage of the process flow after etching a second plurality of slits extending in the second direction.
Figure 40:
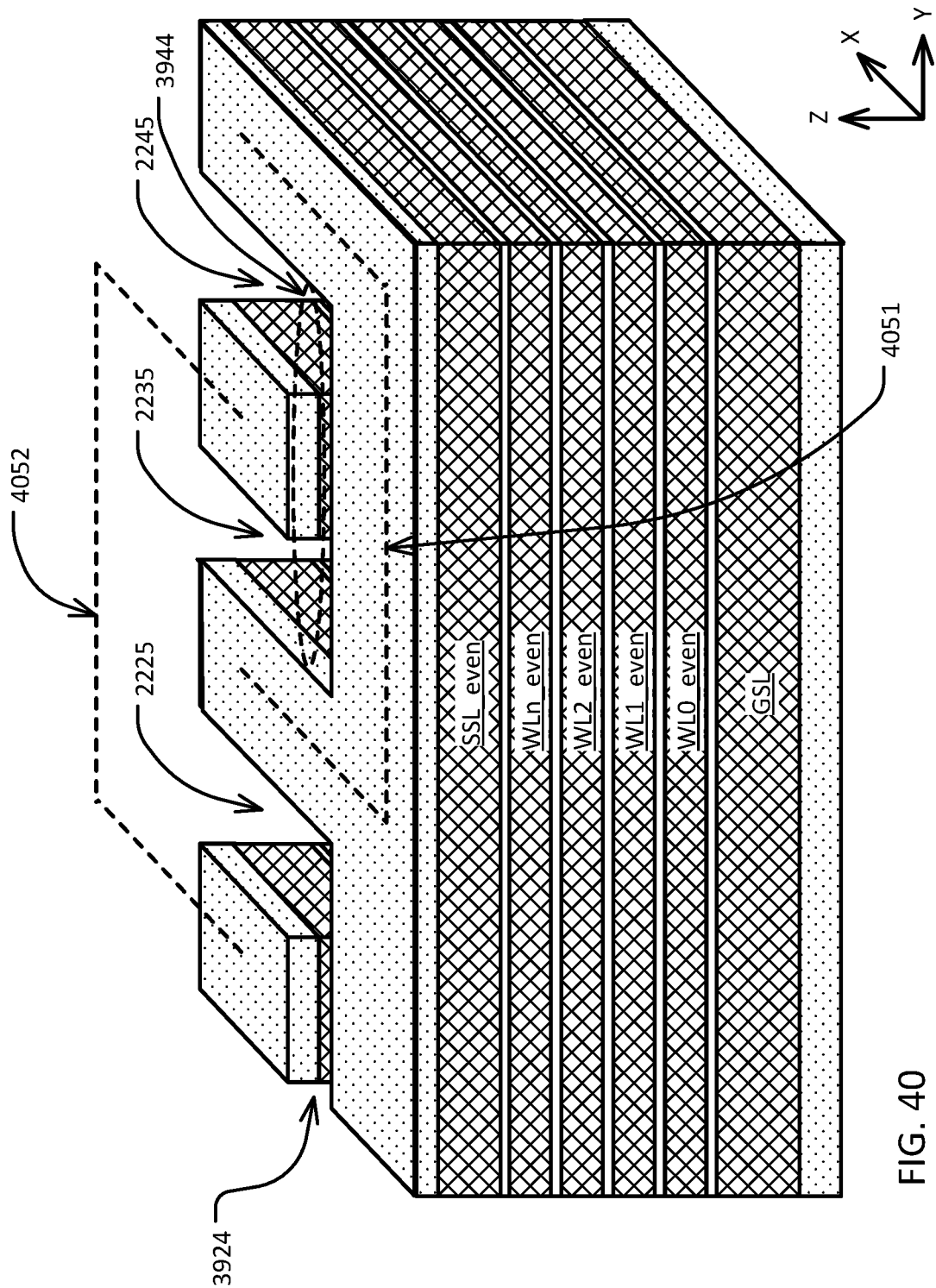

FIGS. 39 and 40 illustrate a stage of the process flow after etching a second plurality of slits (3924, 3934, 3944, 3954) extending in the second direction through the upper conductive layer (SSL_even, FIG. 40) and the intermediate conductive layers (WL0_even, WL1_even, WL2_even, WL2_even, WLn_even, FIG. 40) in the stack of conductive layers. Slits in the second plurality of slits extend vertically through the upper conductive layer and the intermediate conductive layers in the stack of conductive layers.

The plurality of stacks of conductive strips includes even stacks of conductive strips (3610, 3630) alternating with odd stacks of conductive strips (3600, 3620) in the second direction. A first plurality of slits extending in the first direction (X-direction), as described in reference to FIG. 22, includes a first slit 2215, a last slit 2255, and intermediate slits (2225, 2235, 2245) between the first and last slits in the second direction.

The second plurality of slits includes left slits (3934, 3954) defining left sides of the even stacks of conductive strips and right slits (3924, 3944) defining right sides of the odd stacks of conductive strips, thereby forming even word lines WL_even in the intermediate conductive layers separated from the odd stacks of conductive strips by the right slits, and forming odd word lines WL_odd in the intermediate conductive layers separated from the even stacks of conductive strips by the left slits.

The intermediate slits in the first plurality of slits are connected in series, via the left and right slits in the second plurality of slits, from the first slit 2215 to the last slit 2255 in the first plurality of slits.

FIG. 40 illustrates a perspective view of FIG. 39 including slits (2225, 2235, 2245) in the first plurality of slits in the first direction, and right slits (3924, 3944, FIG. 39) in the second plurality of slits in the second direction. At this stage of the process flow, the intermediate conductive layers are divided into even word lines (WL0_even, WL1_even, WL2_even, WLn_even) and odd word lines (not shown). The upper conductive layer is divided into an even string select line (SSL_even) and an odd string select line (not shown). At this stage of the process flow, the even string select line (SSL_even) is not yet divided into separated string select lines (SSL_1, SSL3, FIG. 43) as indicated by a connection 4051, and the odd string select line is not yet divided into separated string select lines (SSL_0, SSL2, FIG. 43) as indicated by a connection 4052.

Figure 41:
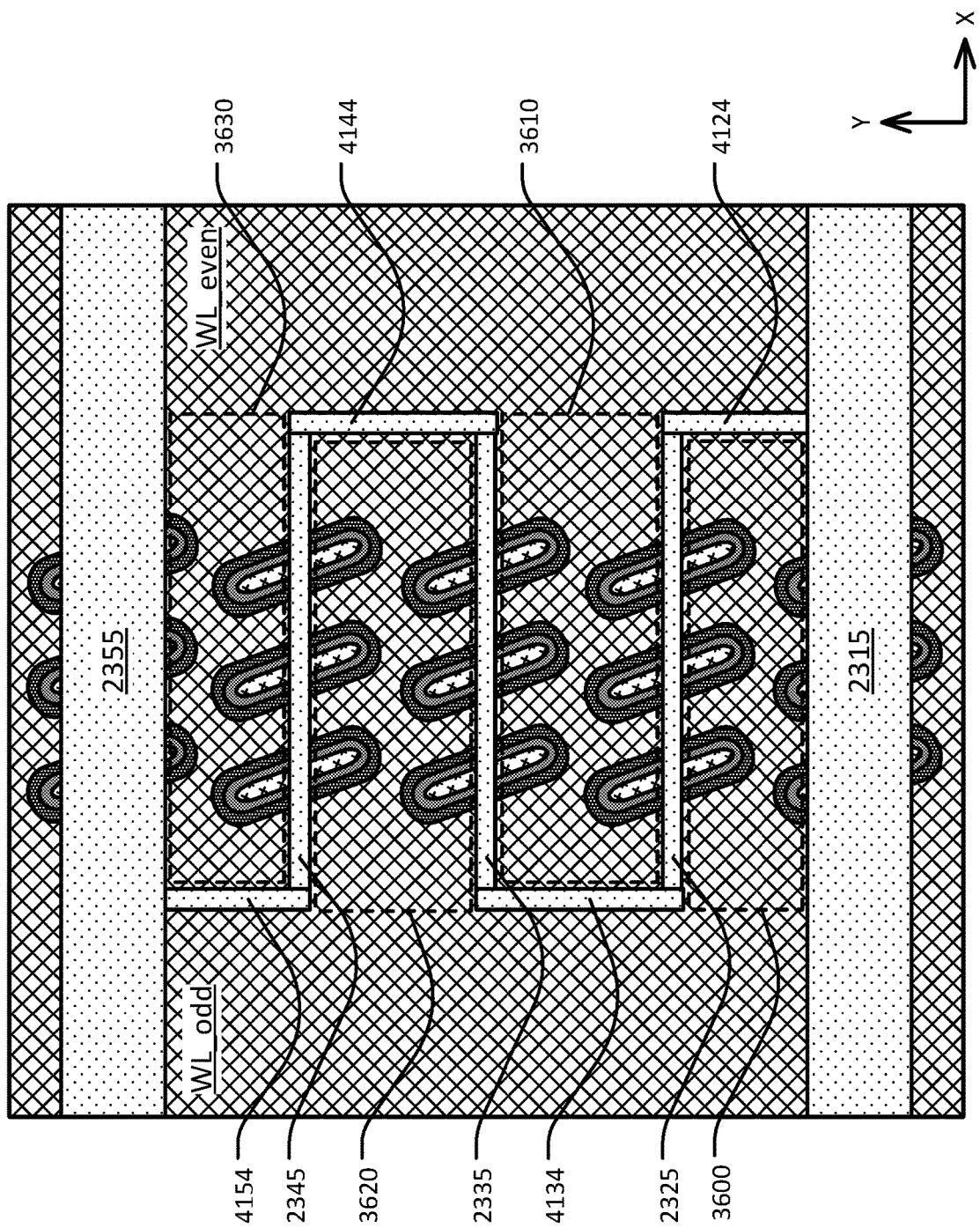
FIG. 41 illustrates a stage of the process flow after forming a first plurality of isolation blocks extending in the first direction and a second plurality of isolation blocks extending in the second direction.

FIG. 41 illustrates a stage of the process flow after forming a first plurality of isolation blocks extending in the first direction and a second plurality of isolation blocks extending in the second direction. FIG. 41 is taken at one of the intermediate conductive layers in the stack of conductive layers.

A first plurality of isolation blocks (2315, 2325, 2335, 2345, 2355) is formed in the first plurality of slits (2215, 2225, 2235, 2245, 2255, FIG. 39), separating adjacent stacks in the plurality of stacks of conductive strips, including a first isolation block (2315), a last isolation block (2355), and intermediate isolation blocks (2325, 2335, 2345) between the first and last isolation blocks in the second direction.

A second plurality of isolation blocks (4124, 4134, 4144, 4154) is formed in the second plurality of slits (3924, 3934, 3944, 3954, FIG. 39). Isolation blocks in the second plurality of isolation blocks extend through the upper conductive layer and the intermediate conductive layers in the stack of conductive layers, including left isolation blocks (4134, 4154) on left sides of the even stacks of conductive strips (3610, 3630) and right isolation blocks (4124, 4144) on right sides of the odd stacks of conductive strips (3600, 3620).

The intermediate isolation blocks in the first plurality of isolation blocks are connected in series, via the left and right isolation blocks in the second plurality of isolation blocks, from the first isolation block 2315 to the last isolation block 2355 in the first plurality of isolation blocks, thereby isolating even word lines WL_even in the intermediate conductive layers from the odd word lines WL_odd in the intermediate conductive layers. The even word lines WL_even are connected to conductive strips in even stacks of conductive strips (3610, 3630) at respective conductive layers, and the odd word lines WL_odd are connected to conductive strips in odd stacks of conductive strips (3600, 3620) at respective conductive layers.

Figure 42:
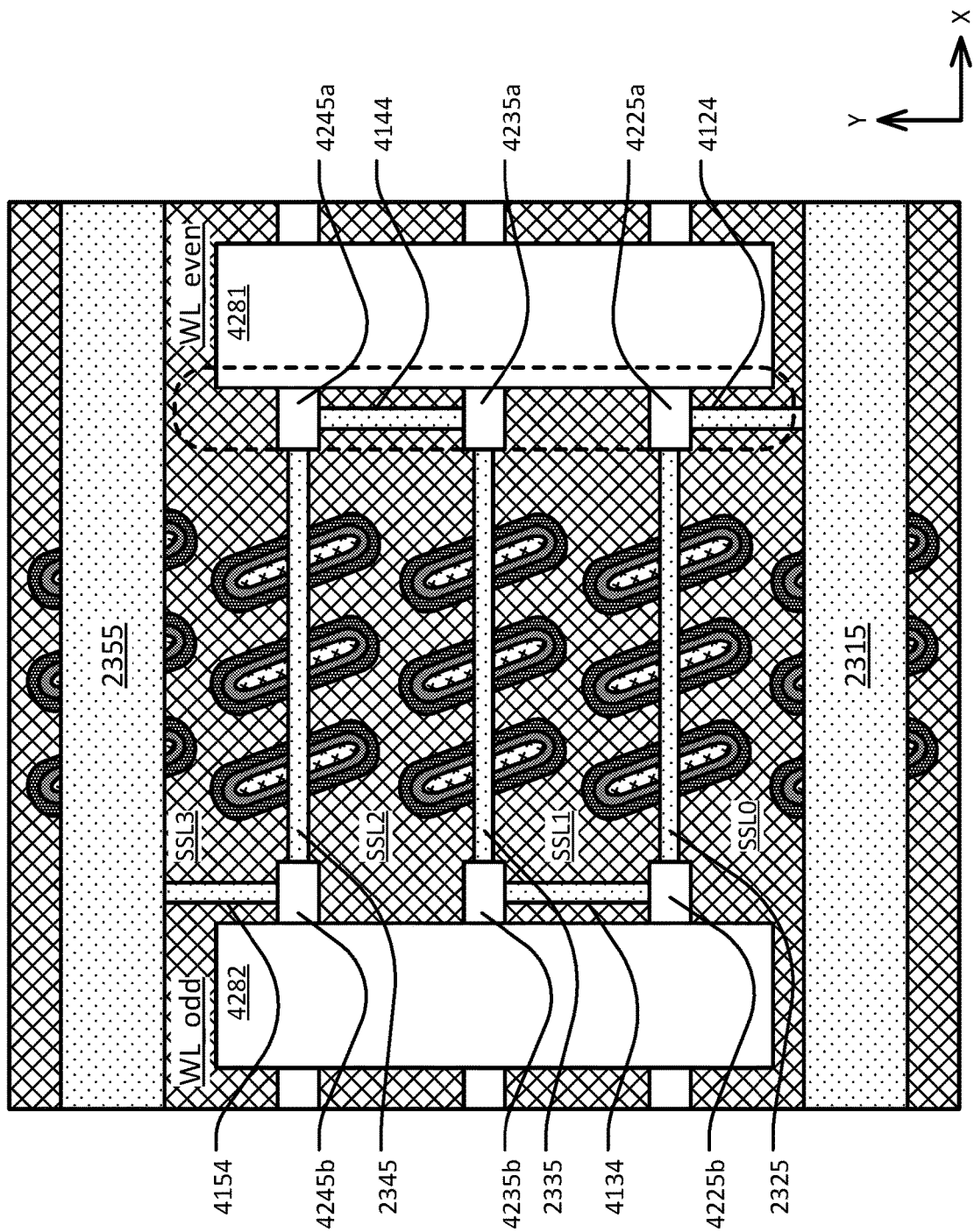
FIGS. 42 and 43 illustrate a stage of the process flow after etching the upper conductive layer to form first and second openings.
Figure 43:
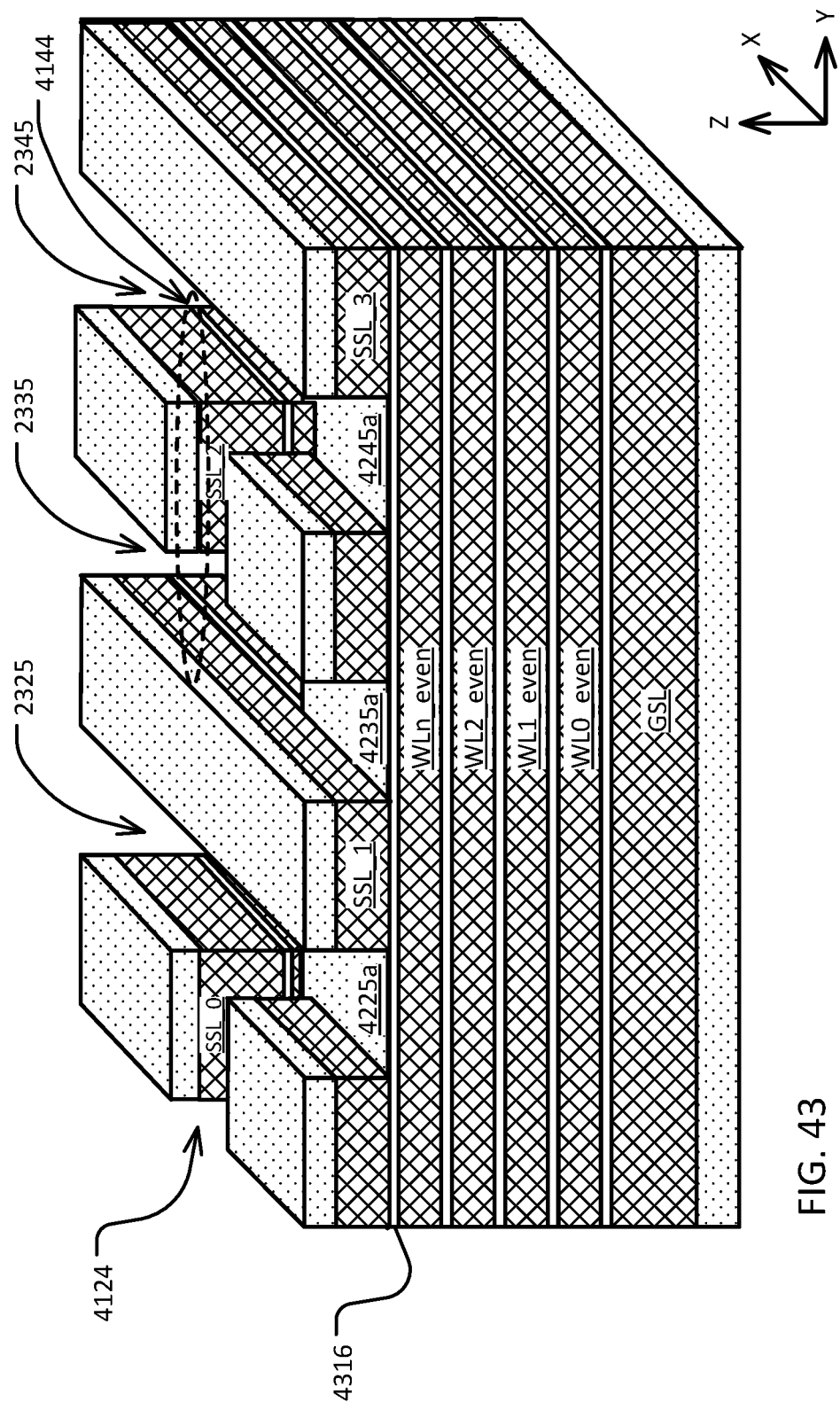

FIGS. 42 and 43 illustrate a stage of the process flow after etching the upper conductive layer to form first and second openings (4281, 4282). The first and second openings are opposite each other across the plurality of hemi-cylindrical vertical channel structures in the first direction and between the first and last isolation blocks (2315, 2355) in the second direction. The right isolation blocks (4124, 4144) in the second plurality of isolation blocks are disposed between the plurality of hemi-cylindrical vertical channel structures and the first opening 4281 in the first direction. The left isolation blocks in the second plurality of isolation blocks are disposed between the plurality of hemi-cylindrical vertical channel structures and the second opening 4282 in the first direction.

The first opening 4281 can define right sides of conductive strips at the upper level (SSL1, SSL3) in the even stacks of conductive strips. The second opening 4282 can define left sides of conductive strips at the upper level (SSL0, SSL2) in the odd stacks of conductive strips.

This etching step can include etching the upper conductive layer in regions (4225a, 4235a, 4245a) between the first opening 4281 and right ends of the intermediate isolation blocks (2325, 2335, 2345) in the first plurality of isolation blocks, to separate the conductive strips at the upper level (SSL1, SSL3) in the even stacks of conductive strips, and in regions (4225b, 4235b, 4245b) between the second opening 4282 and left ends of the intermediate isolation blocks (2325, 2335, 2345) in the first plurality of isolation blocks, to separate the conductive strips at the upper level (SSL0, SSL2) in the odd stacks of conductive strips.

This etching step stops at an insulating layer (4316, FIG. 43) above a top conductive layer (Wln_even, FIG. 43) in the intermediate conductive layers.

FIG. 43 illustrates a perspective view of FIG. 42 including separated string select lines in the upper conductive layer. At this stage of the process flow, the even string select line (SSL_even) is etched into separated even string select lines (SSL_1, SSL3), and the odd string select line is etched into separated odd string select lines (SSL_0, SSL2).

Figure 44:
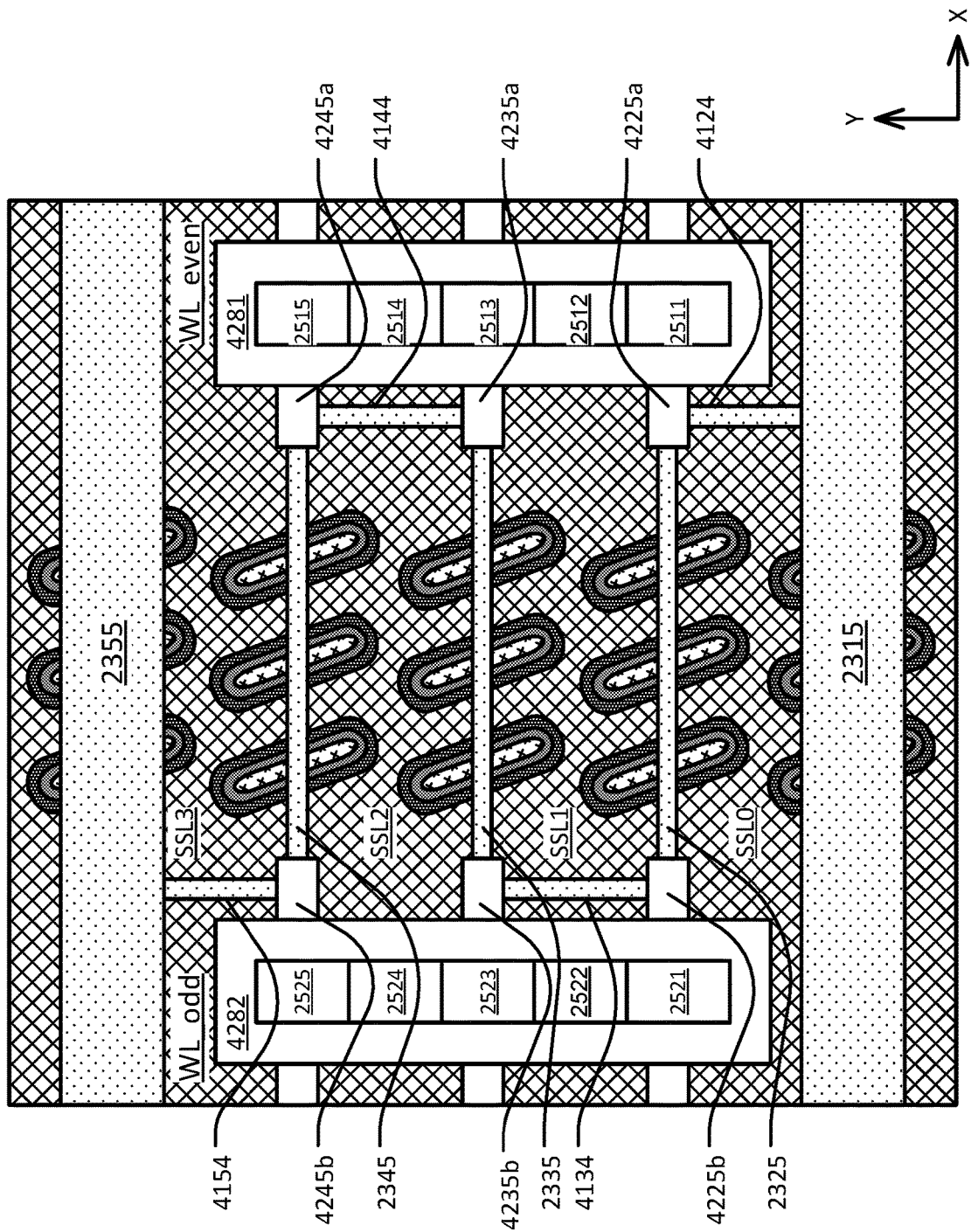
FIG. 44 illustrates a stage of the process flow after etching the intermediate conductive layers to form a first plurality of landing areas in the first opening and a second plurality of landing areas in the second opening.

FIG. 44 illustrates a stage of the process flow after etching the intermediate conductive layers to form a first plurality of landing areas (2511-2515) in the first opening 4281 and a second plurality of landing areas (2521-2525) in the second opening 4282 on respective intermediate conductive layers (WL0-WLn, FIG. 26) and on the lower conductive layer (GSL, FIG. 26).

The landing areas in the first plurality of landing areas are connected to the even word lines in respective intermediate conductive layers, and the landing areas in the second plurality of landing areas are connected to the odd word lines in respective intermediate conductive layers. The even word lines are separated from the odd word lines by the first plurality of isolation blocks (2325, 2335, 2345, FIG. 41) and the second plurality of isolation blocks (4124, 4134, 4144, 4154, FIG. 41) in the respective intermediate conductive layers, as described in reference to FIG. 41.

Figure 45:
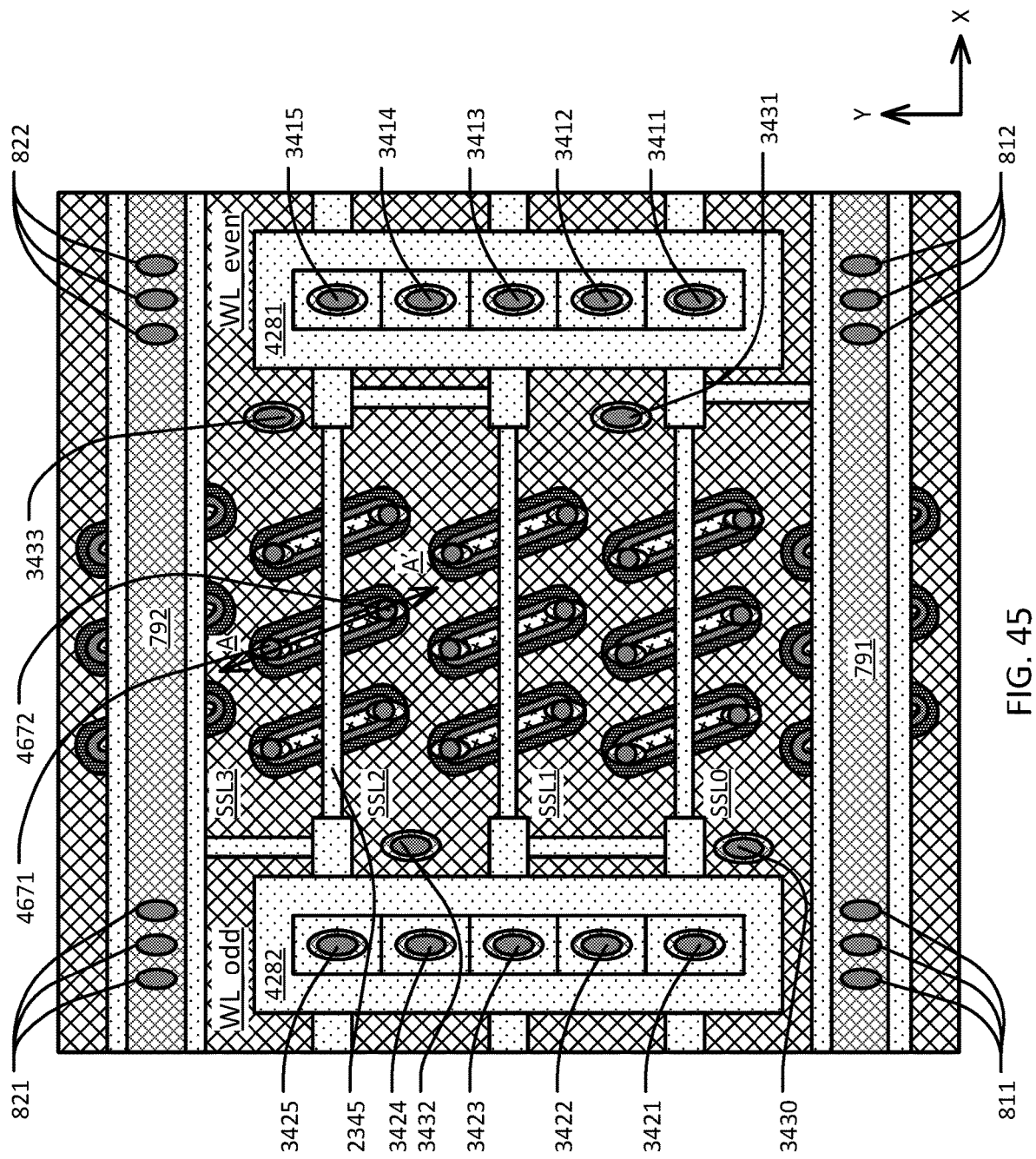
FIG. 45 illustrates a stage of the process flow after forming vias connected to the hemi-cylindrical vertical channel structures extending through the intermediate conductive strips which include even word lines and odd word lines separated from the even word lines.

FIG. 45 illustrates a stage of the process flow after forming vias connected to the hemi-cylindrical vertical channel structures extending through the intermediate conductive strips which include even word lines WL_even and odd word lines WL_odd separated from the even word lines.

Like elements in FIG. 34 are referred to with like reference numerals in FIG. 45. Description in reference to FIG. 34 is generally applicable to FIG. 45.

Figure 46:
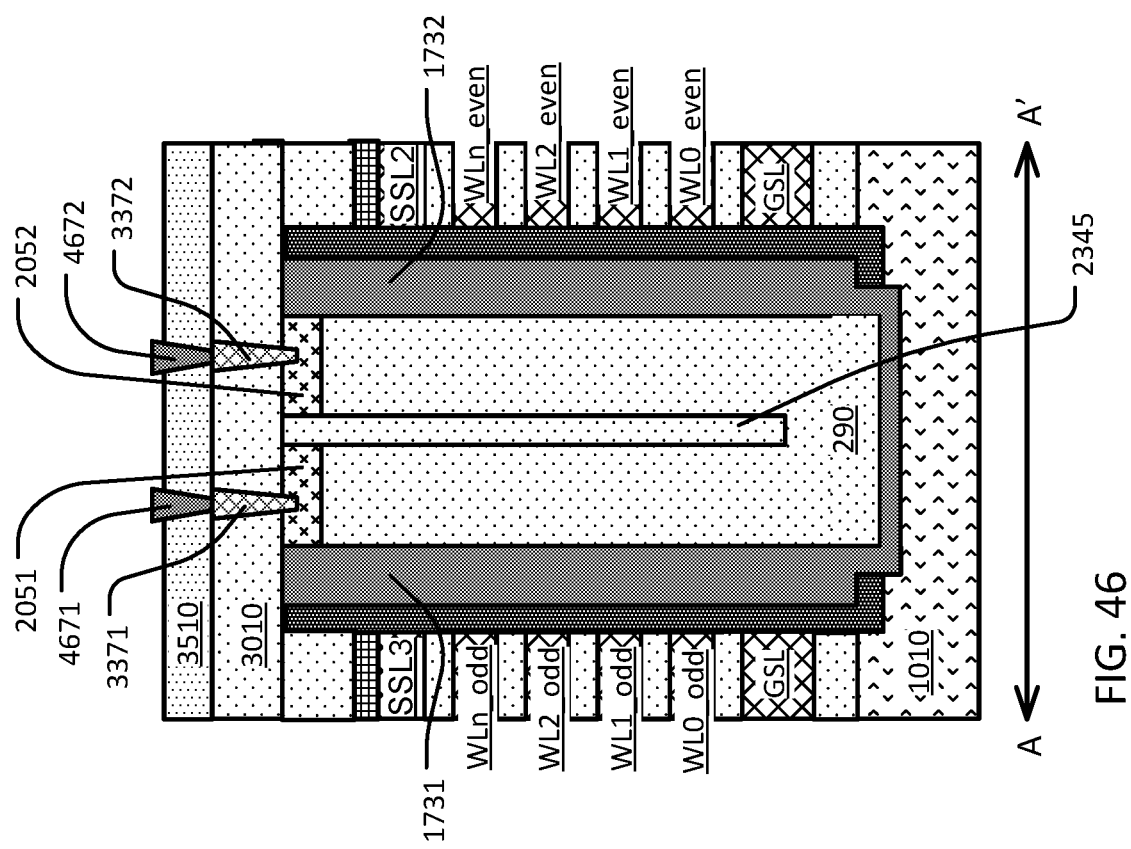
FIG. 46 illustrates first and second vertical semiconductor films in respective hemi-cylindrical vertical channel structures which extend through respective and separated even and odd word lines.

A difference in FIG. 45 from FIG. 34 is that a first hemi-cylindrical vertical channel structure connected to a first via 4671 and a second hemi-cylindrical vertical channel structure connected to a second via 4672 disposed opposite the first hemi-cylindrical vertical channel structure across an isolation block 2345 along the major axis extend through respective and separated even and odd word lines, as further described in reference to FIG. 46.

FIG. 46 illustrates first and second vertical semiconductor films (1731, 1732) in respective hemi-cylindrical vertical channel structures which extend through respective and separated even and odd word lines. FIG. 46 is a vertical cross section taken along a line A-A' as shown in FIG. 45 across an isolation block 2345 and the hemi-cylindrical vertical channel structures in contact with the isolation block.

A first via 4671 is connected to the first vertical semiconductor films 1731 via the first plug 2051 and the first contact 3371. A second via 4672 is connected to the second vertical semiconductor films 1732 via the second plug 2052 and a second contact 3372. First hemi-cylindrical vertical channel structures including the first vertical semiconductor films 1731 extend through the odd word lines (WL0_odd, WL1_odd, WL2_odd, WLn_odd). Second hemi-cylindrical vertical channel structures including the second vertical semiconductor films 1732 extend through the even word lines (WL0_even, WL1_even, WL2_even, WLn_even). The even word lines are separated from the odd word lines by the first plurality of isolation blocks (2325, 2335, 2345, FIG. 41) and the second plurality of isolation blocks (4124, 4134, 4144, 4154, FIG. 41) in the respective intermediate conductive layers, as described in reference to FIG. 41.

Figure 47:
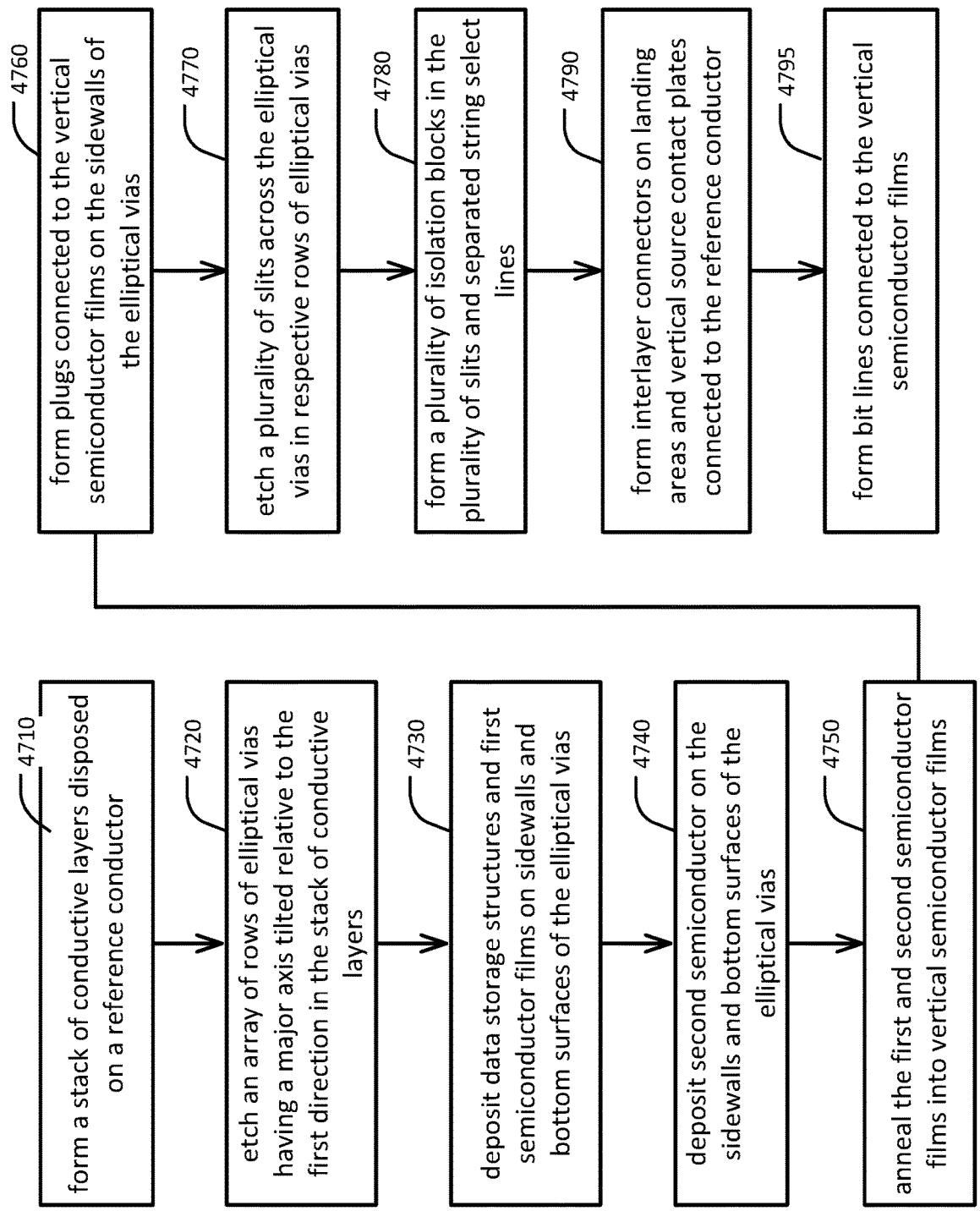
FIG. 47 is a flow chart illustrating a method for manufacturing a memory device including hemi-cylindrical vertical channel structures on a bottom reference conductor.

FIG. 47 is a flow chart illustrating a method for manufacturing a memory device including hemi-cylindrical vertical channel structures on a bottom reference conductor. At Step 4710, the method includes forming a stack of conductive layers separated by insulating layers, including an upper conductive layer, a lower conductive layer, and intermediate conductive layers between the upper conductive layer and the lower conductive layer. The stack of conductive layers is disposed on a reference conductor. This step is further described in reference to FIG. 10A.

At Step 4720, the method includes etching an array of rows of elliptical vias in the stack of conductive layers, the rows of elliptical vias arranged in a first direction, each of the elliptical vias in the rows having a major axis tilted relative to the first direction. This etching step stops on the reference conductor. This step is further described in reference to FIGS. 11 and 11A.

At Step 4730, the method includes depositing data storage structures and first semiconductor films on sidewalls and bottom surfaces of the elliptical vias, and removing the first semiconductor films and the data storage structures from the bottom surfaces of the elliptical vias. This step is further described in reference to FIGS. 12, 12A, 13, 13A, 14 and 14A.

At Step 4740, the method includes depositing second semiconductor films on the sidewalls and bottom surfaces of the elliptical vias. The second semiconductor films on the reference conductor in the elliptical vias can be implanted with dopants having a semiconductor type. This step is further described in reference to FIGS. 15, 15A, 16 and 16A.

At Step 4750, the method includes annealing the first semiconductor films and the second semiconductor films into vertical semiconductor films on the sidewalls of the elliptical vias. This step is further described in reference to FIGS. 17 and 17A.

At Step 4760, the method includes forming plugs connected to the vertical semiconductor films on the sidewalls of the elliptical vias. This step is further described in reference to FIGS. 18, 18A, 19, 19A, 20, 20A, 21, 21A, 22 and 22A.

At Step 4770, the method includes etching a plurality of slits extending in the first direction across the elliptical vias in respective rows of elliptical vias. This step is further described in reference to FIGS. 22, 22A and 22B.

At Step 4780, the method includes forming a plurality of isolation blocks in the plurality of slits, and separated string select lines in the upper conductive layer. This step is further described in reference to FIGS. 23, 23A, 23B, 23C, 24 and 24A.

At Step 4790, the method includes forming interlayer connectors on landing areas, vertical source contact plates connected to the reference conductor, and string select line connectors connected to respective string select lines. This step is further described in reference to FIGS. 25-32.

At Step 4795, the method includes forming bit lines connected to the vertical semiconductor films. This step is further described in reference to FIGS. 33A, 33B, 34, 35A, 35B, 36 and 37.

The method can include forming an alternative word line arrangement described in reference to FIGS. 39-46.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a reference conductor;
   a stack of conductive strips separated by insulating strips, the conductive strips in the stack extending in a first direction, the stack disposed on the reference conductor;
   a plurality of hemi-cylindrical vertical channel structures extending through respective vias in the conductive strips in the stack, and comprising semiconductor films in electrical contact with the reference conductor having outside surfaces, each of the hemi-cylindrical vertical channel structures having a divided elliptical cross section with a major axis tilted relative to the first direction; and
   data storage structures between the outside surfaces of the semiconductor films and sidewalls of the vias in the conductive strips.

2. The memory device of claim 1, wherein the major axis is tilted at an angle relative to the first direction, the angle having a range between 30 degrees and 80 degrees.

3. The memory device of claim 1, comprising:
   a plurality of stacks of conductive strips including the first-mentioned stack of conductive strips, including an upper level of conductive strips, a lower level of conductive strips, and a plurality of intermediate levels of conductive strips between the upper level of conductive strips and the lower level of conductive strips, the conductive strips in the stacks extending in the first direction, the stacks of conductive strips disposed on the reference conductor.

4. The memory device of claim 1, comprising:
a plurality of stacks of conductive strips including the first-mentioned stack of conductive strips, a first odd stack being disposed on a first side of an even stack in the plurality of stacks, and a second odd stack being disposed on a second side of the even stack opposite the first side;
a first set of bit lines connected to the hemi-cylindrical vertical channel structures on a second side of the first odd stack adjacent the first side of the even stack and connected to the hemi-cylindrical vertical channel structures on the second side of the even stack; and
a second set of bit lines connected to the hemi-cylindrical vertical channel structures on a first side of the second odd stack adjacent the second side of the even stack and connected to the hemi-cylindrical vertical channel structures on the first side of the even stack,
wherein bit lines in the first set of bit lines alternate with bit lines in the second set of bit lines in the first direction.

5. The memory device of claim 1, comprising:
a second stack of conductive strips, the conductive strips in the second stack extending in the first direction; and
an isolation block separating the first-mentioned stack of conductive strips and the second stack of conductive strips, first hemi-cylindrical vertical channel structures in the first-mentioned stack of conductive strips in contact with a first side of the isolation block, second hemi-cylindrical vertical channel structures in the second stack of conductive strips in contact with a second side of the isolation block opposite the first side of the isolation block,
wherein the first hemi-cylindrical vertical channel structures are disposed opposite the second hemi-cylindrical vertical channel structures across the isolation block along the major axis.

6. The memory device of claim 5, wherein the first and second hemi-cylindrical vertical channel structures disposed along the major axis have a length along the major axis and a width orthogonal to the length, and a ratio of the length to the width has a range from 3 to 5.

7. The memory device of claim 5, comprising:
first plugs connected to first vertical semiconductor films in the first hemi-cylindrical vertical channel structures on the first side of the isolation block, and second plugs connected to second vertical semiconductor films in the second hemi-cylindrical vertical channel structures on the second side of the isolation block opposite the first side of the isolation block;
first and second contacts connected to the first and second plugs, respectively;
first and second vias connected to the first and second contacts, respectively; and
first and second bit lines connected to the first and second vias, respectively.

8. The memory device of claim 5, comprising:
a horizontal semiconductor film disposed on the reference conductor connected to the semiconductor films in the first and second hemi-cylindrical vertical channel structures.

9. The memory device of claim 8, wherein:
the semiconductor films in the first and second hemi-cylindrical vertical channel structures have an elliptical bottom surface having a first length along the major axis; and the horizontal semiconductor film has an elliptical cross section having a second length along the major axis, the first length being greater than the second length.

10. The memory device of claim 3, comprising:
a plurality of isolation blocks extending in the first direction separating adjacent stacks in the plurality of stacks of conductive strips, including a first isolation block, a last isolation block, and intermediate isolation blocks between the first and last isolation blocks in a second direction orthogonal to the first direction; and
a stack of conductive layers separated by insulating layers, including an upper conductive layer, a lower conductive layer, and intermediate conductive layers between the upper conductive layer and the lower conductive layer, wherein conductive layers in the stack of conductive layers include conductive strips on respective upper, lower and intermediate levels in the plurality of stacks of conductive strips.

11. The memory device of claim 10, wherein:
the first and last isolation blocks have a first width, and the intermediate isolation blocks have a second width, the first width being greater than the second width;
the first isolation block and the last isolation block extend through a horizontal semiconductor film disposed on the reference conductor and stop on the reference conductor; and
the intermediate isolation blocks extend into the lower conductive layer by a depth less than a thickness of the lower conductive layer.

12. The memory device of claim 10, wherein the plurality of stacks of conductive strips includes even stacks of conductive strips alternating with odd stacks of conductive strips in the second direction, comprising:
a second plurality of isolation blocks extending in the second direction, isolation blocks in the second plurality of isolation blocks extending through the intermediate conductive layers in the stack of conductive layers, including left isolation blocks on left sides of the even stacks of conductive strips and right isolation blocks on right sides of the odd stacks of conductive strips; and
even word lines in the intermediate conductive layers separated from the odd stacks of conductive strips by the right isolation blocks, and odd word lines in the intermediate conductive layers separated from the even stacks of conductive strips by the left isolation blocks,
wherein the intermediate isolation blocks in the first-mentioned plurality of isolation blocks are connected in series, via the left and right isolation blocks in the second plurality of isolation blocks, from the first isolation block to the last isolation block in the first-mentioned plurality of isolation blocks.

13. The memory device of claim 10, comprising:
landing areas on respective intermediate conductive layers and the lower conductive layer in the stack of conductive layers in first and second openings, the first and second openings disposed opposite each other across the plurality of hemi-cylindrical vertical channel structures in the first direction and between the first and last isolation blocks in the second direction, the first opening being adjacent right sides of conductive strips at the upper level of conductive strips in the stacks of conductive strips, the second opening being adjacent left sides of conductive strips at the upper level of conductive strips in the stacks of conductive strips; and interlayer connectors on the landing areas, the interlayer connectors extending from a connector surface above the stack of conductive layers to the landing areas.

14. The memory device of claim 13, wherein each of the intermediate conductive layers in the stack of conductive layers includes conductive strips at the intermediate levels of conductive strips in the stacks of conductive strips underlying respective conductive strips at the upper level of conductive strips in the stacks of conductive strips.

15. The memory device of claim 13, wherein the conductive strips at the upper level of conductive strips in the stacks of conductive strips are separated from each other by the isolation blocks and insulating material in the first and second openings, the insulating material extending through the upper level of conductive strips to an insulating layer above a top conductive layer in the intermediate conductive layers.

16. The memory device of claim 13, wherein the conductive strips at the upper level of conductive strips in the stacks of conductive strips have an array region through which the hemi-cylindrical vertical channel structures extend, and first and second string select line connector regions opposite each other across the array region in the first direction, comprising:
    string select line connectors connected to respective string select lines in the first and second string select line connector regions.

17. A method for manufacturing a memory device, comprising:
    forming a stack of conductive layers separated by insulating layers, including an upper conductive layer, a lower conductive layer, and intermediate conductive layers between the upper conductive layer and the lower conductive layer, the conductive layers disposed on a reference conductor;
    etching an array of rows of elliptical vias in the stack of conductive layers, the rows of elliptical vias arranged in a first direction, each of the elliptical vias in the rows having a major axis tilted relative to the first direction, said etching stopping on the reference conductor;
    depositing data storage structures and first semiconductor films on sidewalls and bottom surfaces of the elliptical vias in the rows; and
    depositing second semiconductor films on the sidewalls and bottom surfaces of the elliptical vias in the rows, the second semiconductor films contacting the first semiconductor films on the sidewalls and contacting the reference conductor;
    annealing the first semiconductor films and the second semiconductor films into vertical semiconductor films on the sidewalls of the elliptical vias in the rows;
    etching a plurality of slits extending in the first direction across the elliptical vias in respective rows of elliptical vias, slits in the plurality of slits extending through the upper conductive layer and the intermediate conductive layers in the stack of conductive layers, thereby forming a plurality of stacks of conductive strips and a plurality of hemi-cylindrical vertical channel structures extending through the conductive strips in the stacks, each of the hemi-cylindrical vertical channel structures having a divided elliptical cross section with a major axis tilted relative to the first direction.

18. The method of claim 17, wherein the reference conductor includes a doped semiconductor, the method comprising:
    implanting the second semiconductor films on the reference conductor in the elliptical vias in the rows with dopants having the same semiconductor type as the doped semiconductor in the reference conductor.

19. The method of claim 17, wherein the first-mentioned plurality of slits includes a first slit, a last slit, and intermediate slits arranged between the first and last slits in a second direction orthogonal to the first direction, comprising:
    etching a second plurality of slits spaced apart from the first-mentioned plurality of slits by a first region in the first direction, and a third plurality of slits extending in the first direction spaced apart from the first-mentioned plurality of slits by a second region in the first direction;
    the first and second regions disposed opposite each other across the hemi-cylindrical vertical channel structures in the first direction and between the first and last slits in a second direction orthogonal to the first direction; and
    the first-mentioned plurality of slits separated from the second plurality of slits by the conductive layers in the stack of conductive layers in the first region, the first-mentioned plurality of slits separated from the third plurality of slits by the conductive layers in the stack of conductive layers in the second region.

20. The method of claim 17, said depositing second semiconductor films comprising:
    etching through the data storage structures on the bottom surfaces of the elliptical vias to expose the reference conductor.

21. The method of claim 17, comprising:
    filling the elliptical vias in the rows with an insulating material;
    etching back the insulating material in the elliptical vias in the rows, to form a recess over a top surface of the insulating material in the elliptical vias in the rows, the top surface being higher than a top conductive layer in the stack of conductive layers;
    depositing a conductive material in the recess and over top surfaces of the stack of conductive layers; and
    removing the conductive material above the top surfaces of the stacks of conductive strips, while leaving the conductive material over the top surface of the insulating material in the elliptical vias in the rows.

22. The method of claim 21, wherein said etching the plurality of slits includes etching the conductive material over the top surface of the insulating material in the elliptical vias in the rows to form first and second plugs over the top surface of the insulating material in the elliptical vias in the rows, the first plugs connected to first vertical semiconductor films in the elliptical vias in the rows on a first side of the slits, the second plugs connected to second vertical semiconductor films in the elliptical vias in the rows on a second side of the slits opposite the first side of the slits.

23. The method of claim 22, comprising:
    forming first and second contacts connected to the first and second plugs, respectively, over the top surface of the insulating material in the elliptical vias in the rows;
    forming first and second vias connected to the first and second contacts respectively; and
    forming first and second bit lines connected to the first and second vias respectively.

24. The method of claim 17, wherein the plurality of slits includes a first slit, a last slit, and intermediate slits arranged between the first and last slits in a second direction orthogonal to the first direction, wherein the first and last slits have a first width, and the intermediate slits have a second width, the first width being greater than the second width.

25. The method of claim 17, wherein the plurality of slits includes a first slit, a last slit, and intermediate slits arranged between the first and last slits in a second direction orthogonal to the first direction, wherein the first slit and the last slit extend through a horizontal semiconductor film on the bottom surfaces of the elliptical vias and stop on the reference conductor, and the intermediate slits extend into the lower conductive layer by a depth less than a thickness of the lower conductive layer.

26. The method of claim 17, comprising:
forming a plurality of isolation blocks in slits in the plurality of slits, wherein a particular isolation block in the plurality of isolation blocks separates a first stack of conductive strips and a second stack of conductive strips in the plurality of stacks of conductive strips, first hemi-cylindrical vertical channel structures in the first stack of conductive strips in contact with a first side of the particular isolation block, second hemi-cylindrical vertical channel structures in the second stack of conductive strips in contact with a second side of the particular isolation block opposite the first side of the particular isolation block.

27. The method of claim 26, wherein the plurality of isolation blocks includes a first isolation block, a last isolation block, and intermediate isolation blocks between the first and last isolation blocks in a second direction orthogonal to the first direction, the method comprising:
etching the upper conductive layer to form first and second openings, the first and second openings being opposite each other across the plurality of hemi-cylindrical vertical channel structures in the first direction and between the first and last isolation blocks in the second direction, the first opening defining right sides of string select lines in the upper conductive layer in the stack of conductive layers, the second opening defining left sides of the string select lines,
said etching stopping at an insulating layer above a top conductive layer in the intermediate conductive layers.

28. The method of claim 27, comprising:
etching the intermediate conductive layers to form landing areas on respective intermediate conductive layers and on the lower conductive layer in the first and second openings; and
forming interlayer connectors on the landing areas, the interlayer connectors extending from a connector surface above the stack of conductive layers to the landing areas,
wherein the first and second openings have a first width in the first direction, and the landing areas have a second width in the first direction narrower than the first width.

29. The method of claim 27, comprising:
etching the first and last isolation blocks to form first and second source contact holes, respectively, stopping on the reference conductor; and
forming a first vertical source contact plate and a second vertical source contact plate in the first and second source contact holes connected to the reference conductor, the first and second vertical source contact plates extending in the first direction.

30. The method of claim 27, wherein the plurality of stacks of conductive strips includes an upper level of conductive strips, a lower level of conductive strips, and a plurality of intermediate levels of conductive strips between the upper level of conductive strips and the lower level of conductive strips, and the conductive strips at the upper level of conductive strips in the stacks of conductive strips have an array region through which the hemi-cylindrical vertical channel structures extend, and first and second string select line connector regions opposite each other across the array region in the first direction, comprising:
forming string select line connectors connected to respective string select lines in the first and second string select line connector regions.

31. The method of claim 17, wherein the plurality of stacks of conductive strips includes a first odd stack being disposed on a first side of an even stack, a second odd stack being disposed on a second side of the even stack opposite the first side, the method comprising:
forming a first set of bit lines connected to the hemi-cylindrical vertical channel structures on a second side of the first odd stack adjacent the first side of the even stack and connected to the hemi-cylindrical vertical channel structures on the second side of the even stack; and
forming a second set of bit lines connected to the hemi-cylindrical vertical channel structures on a first side of the second odd stack adjacent the second side of the even stack and connected to the hemi-cylindrical vertical channel structures on the first side of the even stack,
wherein bit lines in the first set of bit lines alternate with bit lines in the second set of bit lines in the first direction.

32. The method of claim 17, wherein the plurality of stacks of conductive strips includes even stacks of conductive strips alternating with odd stacks of conductive strips in a second direction orthogonal to the first direction, and the first-mentioned plurality of slits includes a first slit, a last slit, and intermediate slits between the first and last slits in the second direction, the method comprising:
etching a second plurality of slits extending in the second direction, slits in the second plurality of slits extending through the upper conductive layer and the intermediate conductive layers in the stack of conductive layers, including left slits defining left sides of the even stacks of conductive strips and right slits defining right sides of the odd stacks of conductive strips, thereby forming even word lines in the intermediate conductive layers separated from the odd stacks of conductive strips by the right slits, and forming odd word lines in the intermediate conductive layers separated from the even stacks of conductive strips by the left slits,
wherein the intermediate slits in the first-mentioned plurality of slits are connected in series, via the left and right slits in the second plurality of slits, from the first slit to the last slit in the first plurality of slits.

33. The method of claim 32, the method comprising:
forming a first plurality of isolation blocks extending in the first direction in the first-mentioned plurality of slits, separating adjacent stacks in the plurality of stacks of conductive strips, including a first isolation block, a last isolation block, and intermediate isolation blocks between the first and last isolation blocks in the second direction; and
forming a second plurality of isolation blocks extending in the second direction in the second plurality of slits, isolation blocks in the second plurality of isolation blocks extending through the upper conductive layer and the intermediate conductive layers in the stack of conductive layers, including left isolation blocks on left sides of the even stacks of conductive strips and right isolation blocks on right sides of the odd stacks of conductive strips,
wherein the intermediate isolation blocks in the first plurality of isolation blocks are connected in series, via the left and right isolation blocks in the second plurality of isolation blocks, from the first isolation block to the last isolation block in the first-mentioned plurality of isolation blocks.

34. The method of claim 33, wherein the plurality of stacks of conductive strips includes an upper level of conductive strips, a lower level of conductive strips, and a plurality of intermediate levels of conductive strips between the upper level of conductive strips and the lower level of conductive strips, comprising:

etching the upper conductive layer to form first and second openings, the first and second openings being opposite each other across the plurality of hemi-cylindrical vertical channel structures in the first direction and between the first and last isolation blocks in the second direction, the first opening defining right sides of conductive strips at the upper level in the even stacks of conductive strips, the second opening defining left sides of conductive strips at the upper level in the odd stacks of conductive strips, said etching stopping at an insulating layer above a top conductive layer in the intermediate conductive layers.

35. The method of claim 34, comprising:

etching the intermediate conductive layers to form a first plurality of landing areas in the first opening and a second plurality of landing areas in the second opening on respective intermediate conductive layers and on the lower conductive layer, wherein the landing areas in the first plurality of landing areas are connected to the even word lines in respective intermediate conductive layers, and the landing areas in the second plurality of landing areas are connected to the odd word lines in respective intermediate conductive layers, the even word lines being separated from the odd word lines in the respective intermediate conductive layers.

\* \* \* \* \*